US010685963B2

(12) United States Patent
Lee et al.

(10) Patent No.: US 10,685,963 B2
(45) Date of Patent: Jun. 16, 2020

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Kiseok Lee, Hwaseong-si (KR); Keunnam Kim, Yongin-si (KR); Eun A Kim, Seoul (KR); Eunjung Kim, Daegu (KR); Jeongseop Shim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/242,127

(22) Filed: Jan. 8, 2019

(65) Prior Publication Data
US 2019/0355727 A1 Nov. 21, 2019

(30) Foreign Application Priority Data
May 18, 2018 (KR) .................... 10-2018-0056825

(51) Int. Cl.
*H01L 21/28* (2006.01)
*H01L 21/306* (2006.01)
*H01L 21/308* (2006.01)
*H01L 27/108* (2006.01)
*H01L 27/22* (2006.01)
(Continued)

(52) U.S. Cl.
CPC .. *H01L 27/10876* (2013.01); *H01L 21/28026* (2013.01); *H01L 21/308* (2013.01); *H01L 21/30604* (2013.01); *H01L 27/10823* (2013.01); *H01L 27/10855* (2013.01); *H01L 27/10885* (2013.01); *H01L 27/10888* (2013.01); *H01L 27/228* (2013.01); *H01L 27/2436* (2013.01); *H01L 29/4236* (2013.01)

(58) Field of Classification Search
CPC ...... H01L 21/308–3088; H01L 27/108–10897
See application file for complete search history.

(56) References Cited

U.S. PATENT DOCUMENTS

| 7,776,750 B2 | 8/2010 | Kim |
| 8,012,881 B1 | 9/2011 | Lee et al. |
| 8,349,636 B2 | 1/2013 | Lee et al. |
| (Continued) | | |

FOREIGN PATENT DOCUMENTS

KR  10-2013-0006738 A  1/2013

*Primary Examiner* — Daniel P Shook
(74) *Attorney, Agent, or Firm* — Harness, Dickey & Pierce, P.L.C.

(57) ABSTRACT

Disclosed are semiconductor devices and methods of manufacturing the same. The method comprises forming an active structure including a plurality of active patterns, a device isolation layer defining the active patterns, and a gate structure across the active patterns and extending in a first direction, forming a first mask pattern on the active structure, and forming a trench by using the first mask pattern as an etching mask to pattern the active structure. Forming the first mask pattern comprises forming in a first mask layer a plurality of first openings extending in a second direction intersecting the first direction, and forming in the first mask layer a plurality of second openings extending in a third direction intersecting the first and second directions.

7 Claims, 59 Drawing Sheets

(51) Int. Cl.
    *H01L 27/24*     (2006.01)
    *H01L 29/423*     (2006.01)

(56) References Cited

U.S. PATENT DOCUMENTS

| | | |
|---|---|---|
| 8,603,919 B2 | 12/2013 | Han |
| 9,159,730 B2 | 10/2015 | Kim et al. |
| 9,305,801 B2 | 4/2016 | Sung et al. |
| 2010/0055865 A1* | 3/2010 | You .................... H01L 21/3083 |
| | | 438/424 |

* cited by examiner

SEMICONDUCTOR DEVICE AND METHOD OF MANUFACTURING THE SAME

CROSS-REFERENCE TO RELATED APPLICATION

This U.S. nonprovisional application claims priority under 35 U.S.C § 119 to Korean Patent Application No. 10-2018-0056825 filed on May 18, 2018 in the Korean Intellectual Property Office, the entire contents of which are hereby incorporated by reference.

BACKGROUND

Inventive concepts relate to a semiconductor device and a method of manufacturing the same, and more particularly, to a method of manufacturing a semiconductor device, in which method a line patterning is used to form pillars, and a semiconductor device manufactured by the same.

Semiconductor devices are widely used in the electronic industry because of their small size, multi-functionality, and/or low fabrication cost. Semiconductor devices may encompass a memory device for storing data, a logic device for processing data, and a hybrid device for operating various functions contemporaneously or simultaneously.

Semiconductor devices have been increasingly required for high integration with the advanced development of the electronic industry. It therefore is increasingly difficult to manufacture semiconductor devices because there is a problem of process margin reduction in an exposure process defining fine patterns. Semiconductor devices also have been increasingly requested for high speed with the advanced development of the electronic industry. Various studies have been conducted to meet the requirements of high integration and/or high speed in semiconductor devices.

SUMMARY

Some embodiments of inventive concepts provide a semiconductor device having a constant minimum distance between any neighboring pillars and a method of manufacturing the same.

According to some example embodiments of inventive concepts, a method of manufacturing a semiconductor device may comprise: forming an active structure including a plurality of active patterns, a device isolation layer defining the active patterns, and a gate structure across the active patterns and extending in a first direction; forming a first mask pattern on the active structure; and forming a trench by using the first mask pattern as an etching mask to pattern the active structure. The step of forming the first mask pattern may comprise: forming in a first mask layer a plurality of first openings extending in a second direction intersecting the first direction; and forming in the first mask layer a plurality of second openings extending in a third direction that intersects the first and second directions.

According to some example embodiments of inventive concepts, a method of manufacturing a semiconductor device may comprise: forming an active structure including a plurality of active patterns, a device isolation layer between the active patterns, and a gate structure across the active patterns and extending in a first direction; forming a first mask pattern on the active structure; and forming a trench by using the first mask pattern as an etching mask to pattern the active structure. The step of forming the first mask pattern may comprise: forming in a first mask layer a plurality of first openings extending in a second direction intersecting the first direction; and forming in the first mask layer a plurality of second openings extending in the first direction.

According to some example embodiments of inventive concepts, a semiconductor device may comprise: an active structure comprising an active pattern and a gate structure, wherein the active pattern comprises a first impurity region and a second impurity region, and wherein the gate structure between the first and second impurity regions and extends in a first direction; a trench defining a pillar body in an upper portion of the active structure; and a conductive pattern extending in a second direction on the active structure and electrically connected to the first impurity region exposed to the trench, the second direction intersecting the first direction. The pillar body may comprise a first pillar, a second pillar, and a third pillar. The first to third pillars may be spaced apart from each other in a third direction intersecting the first and second directions. A minimum distance between the first and second pillars may be substantially the same as a minimum distance between the second and third pillars.

BRIEF DESCRIPTION OF THE DRAWINGS

FIGS. 1A to 14A illustrate plan views showing a method of manufacturing a semiconductor device according to example embodiments of inventive concepts.

FIGS. 1B to 14B illustrate cross-sectional views taken along line A-A' of FIGS. 1A to 14A, respectively.

FIGS. 1C to 14C illustrate cross-sectional views taken along line B-B' of FIGS. 1A to 14A, respectively.

FIGS. 16A to 21A illustrate plan views showing a method of manufacturing a semiconductor device according to example embodiments of inventive concepts.

FIGS. 16B to 21B illustrate cross-sectional views taken along line A-A' of FIGS. 16A to 21A, respectively.

FIGS. 16C to 21C illustrate cross-sectional views taken along line B-B' of FIGS. 16A to 21A, respectively.

DETAILED DESCRIPTION OF EMBODIMENTS

FIGS. 1A to 14A illustrate plan views showing a method of manufacturing a semiconductor device according to example embodiments of inventive concepts. FIGS. 1B to 14B illustrate cross-sectional views taken along line A-A' of FIGS. 1A to 14A, respectively. FIGS. 1C to 14C illustrate cross-sectional views taken along line B-B' of FIGS. 1A to 14A, respectively.

Figure 1A:
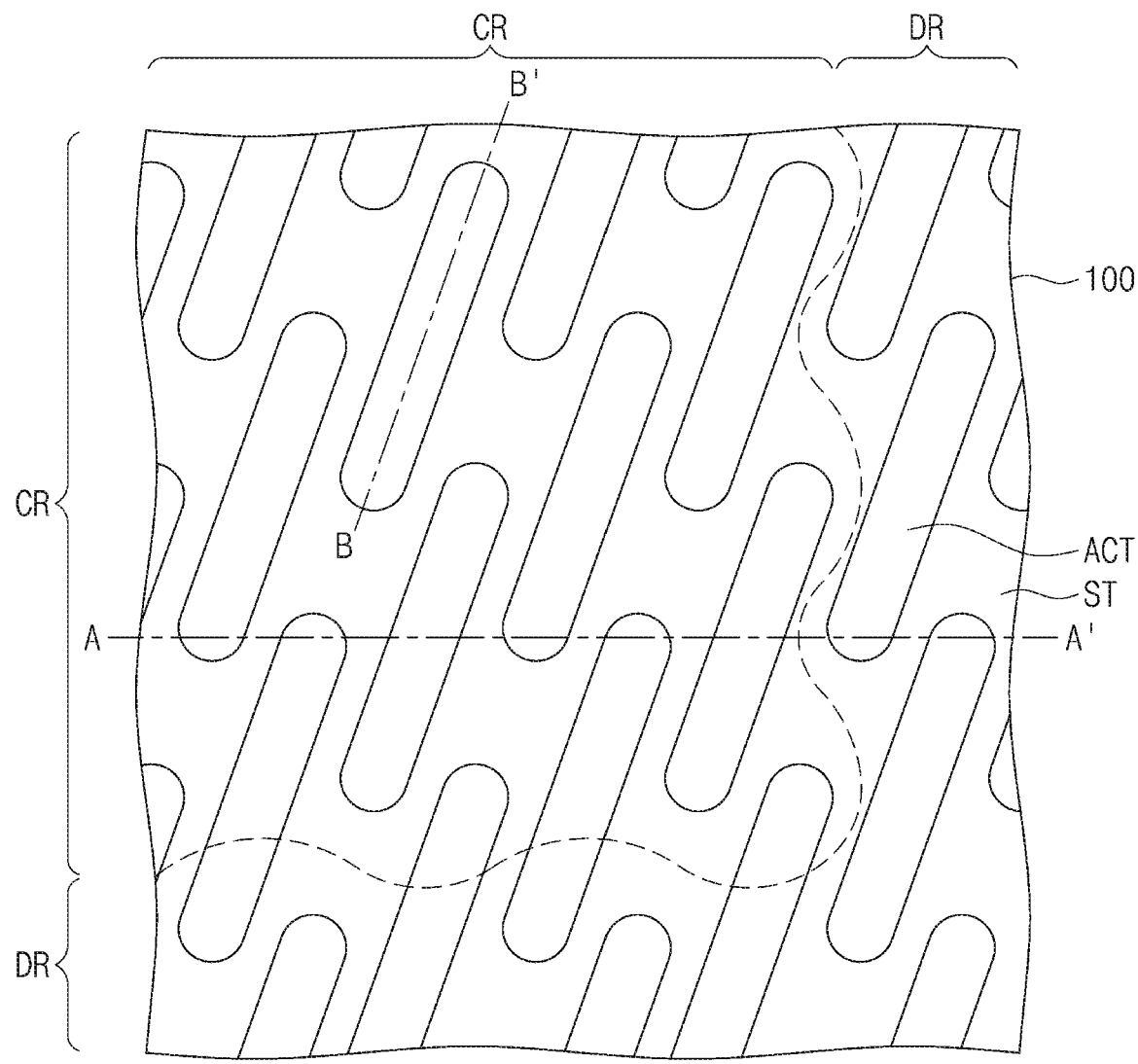
Figure 1A:
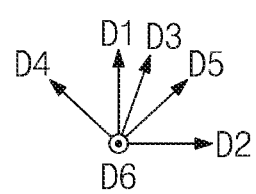
Figure 1B:
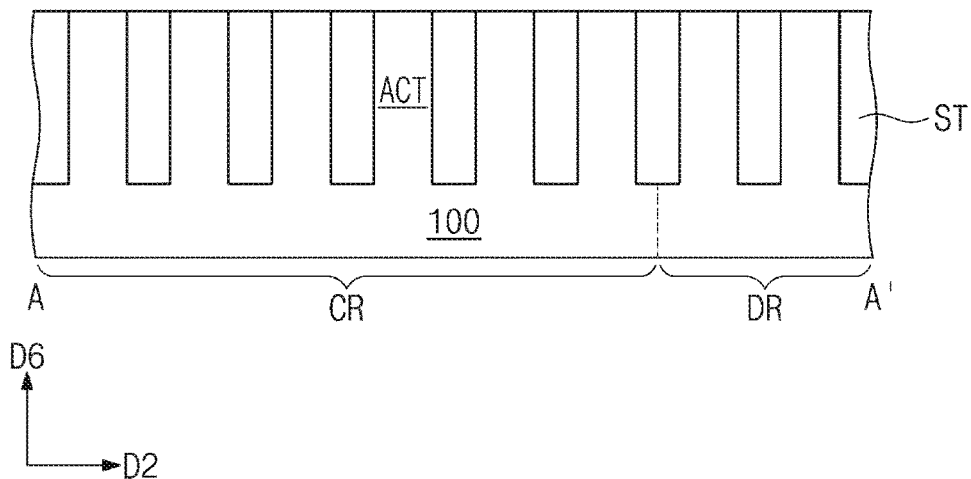
Figure 1C:
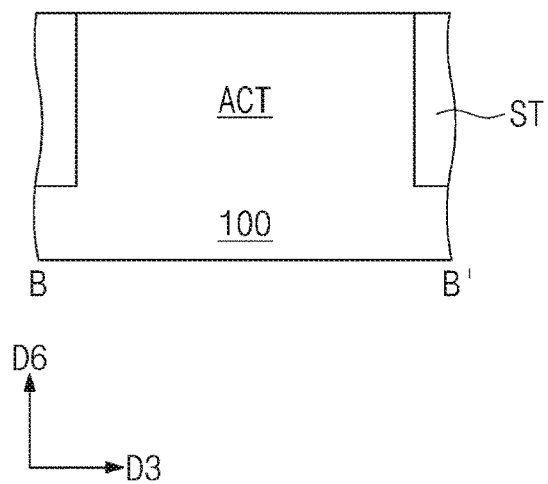

Referring to FIGS. 1A, 1B, and 1C, a device isolation layer ST may be formed on a substrate 100 including a cell region CR and a dummy region DR adjacent to the cell region CR. For example, a portion of the substrate 100 may be etched, and then the etched portion may be filled with an insulating material to form the device isolation layer ST. The formation of the device isolation layer ST may define active patterns ACT surrounded by the device isolation layer ST. The device isolation layer ST may include silicon oxide. The substrate 100 may be or include a semiconductor substrate including silicon, germanium, or silicon-germanium. Each of the active patterns ACT may extend in a third direction D3 parallel to a top surface of the substrate 100. The active patterns ACT may be spaced apart from each other in the third direction D3.

Figure 2A:
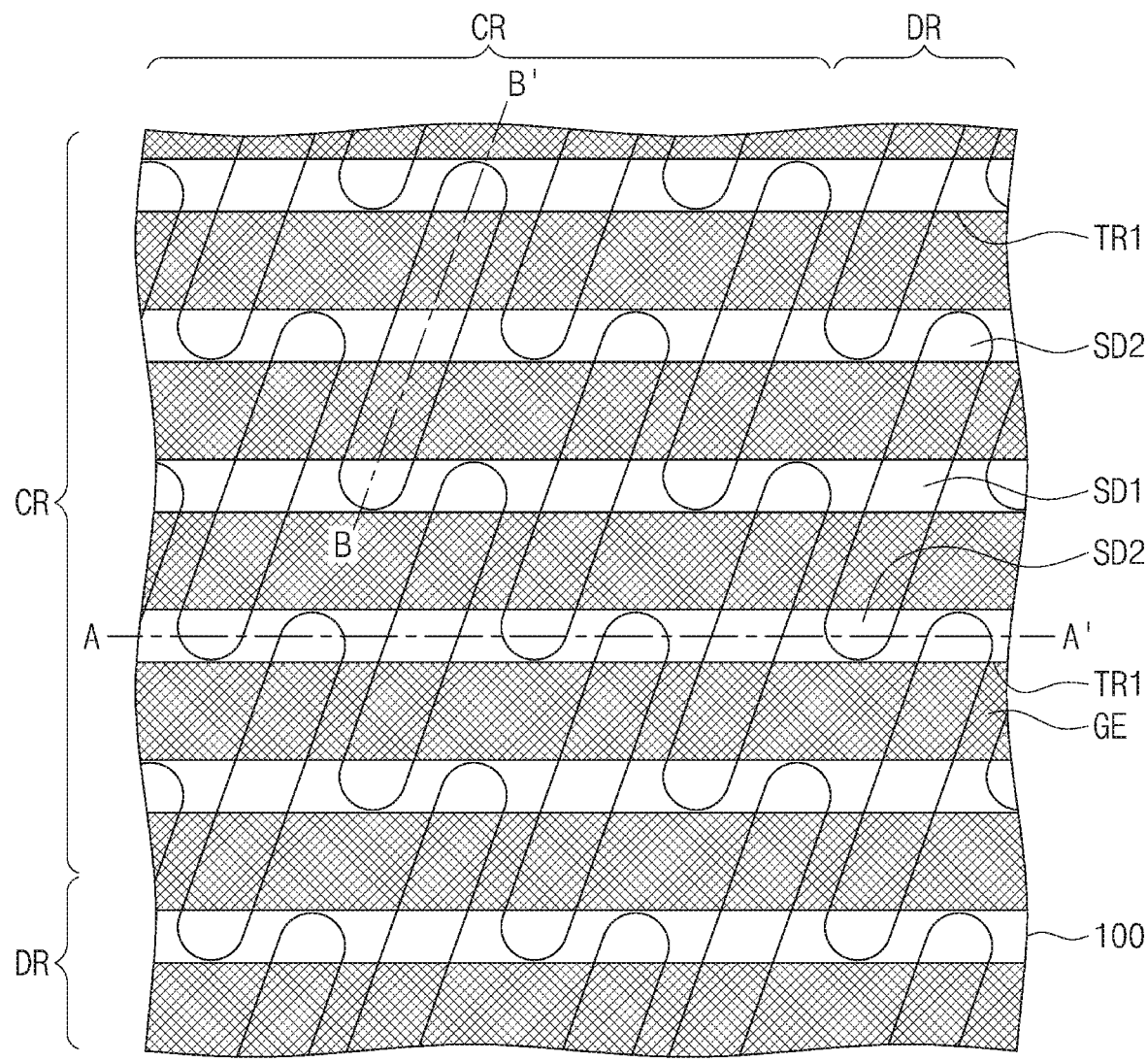
Figure 2B:
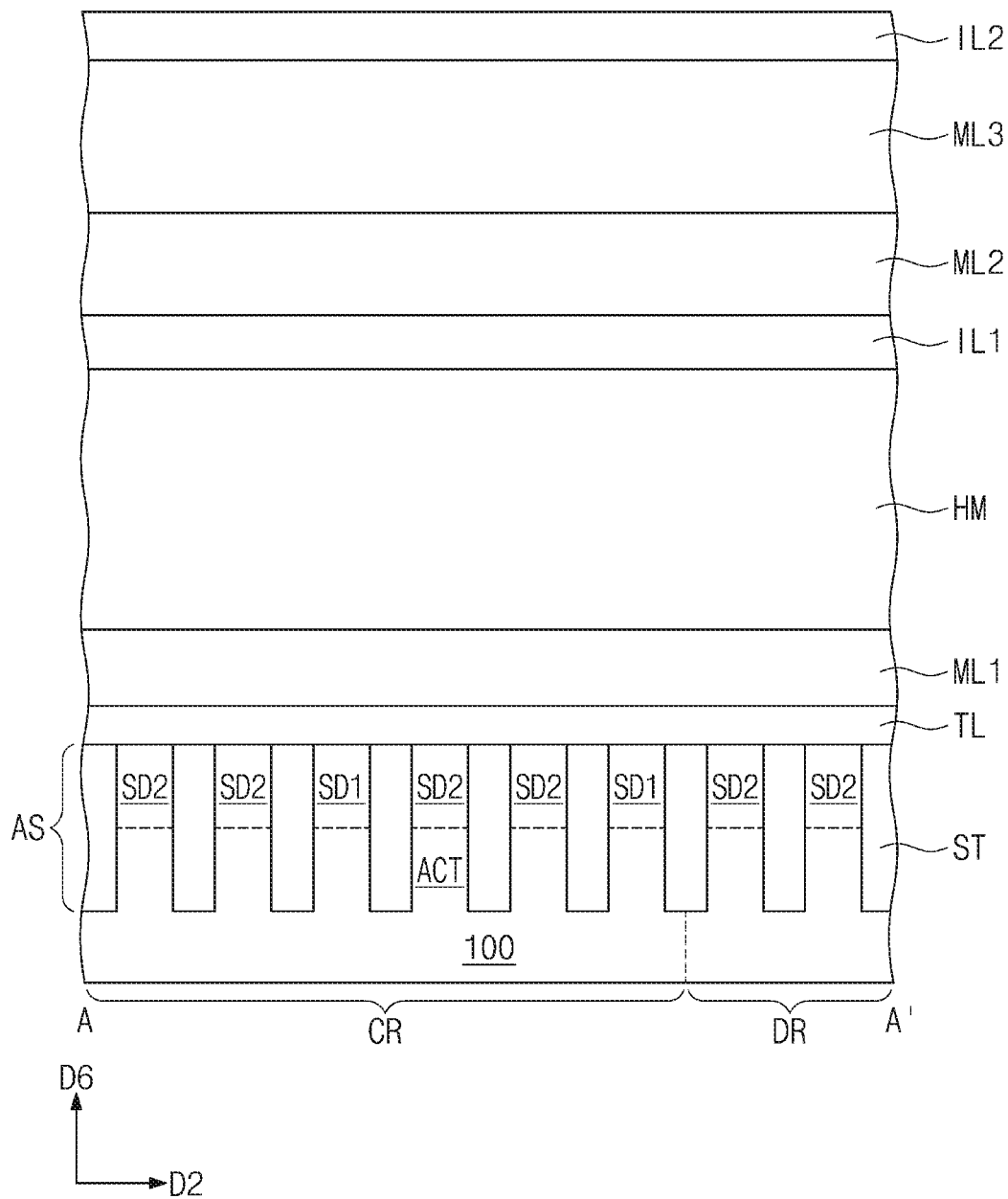
Figure 2C:
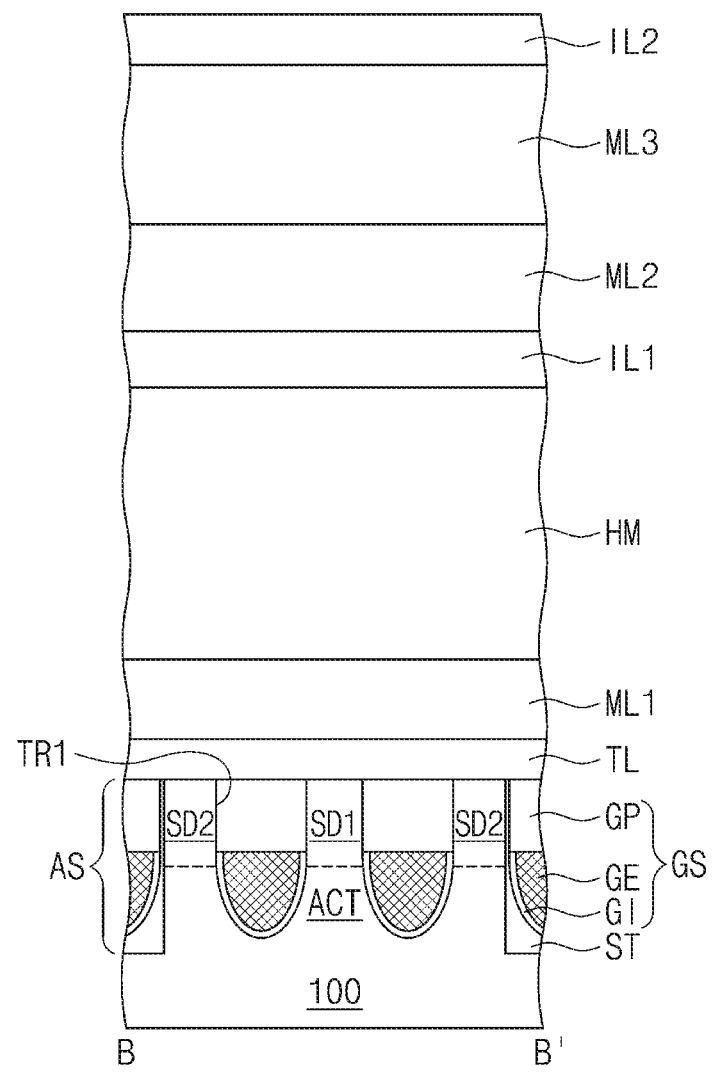

Referring to FIGS. 2A, 2B, and 2C, gate structures GS may be formed to run across the device isolation layer ST and the active patterns ACT. Each of the gate structures GS may include a gate dielectric layer GI, a gate electrode GE, and/or a gate capping layer GP.

For example, the device isolation layer ST and the active patterns ACT may be patterned to form first trenches TR1. The first trenches TR1 may extend in a second direction D2 that is parallel to the top surface of the substrate 100 and intersects the third direction D3. The first trenches TR1 may be spaced apart from each other in a first direction D1 that is parallel to the top surface of the substrate 100 and intersects the second and third directions D2 and D3. The first trenches TR1 may run across the active patterns ACT.

The formation of the first trenches TR1 may include forming a hardmask pattern having openings and then using the hardmask pattern as an etching mask to etch the active patterns ACT and the device isolation layer ST exposed to the openings.

The gate dielectric layer GI may be conformally formed in each of the first trenches TR1. The gate dielectric layer GI may include one or more of a silicon oxide layer, a silicon nitride layer, a silicon oxynitride layer, and a high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

A conductive layer filling the first trenches TR1 may be formed on the gate dielectric layer GI, which may result in the formation of the gate electrodes GE. The conductive layer may include one or more of conductive metal nitride (e.g., titanium nitride or tantalum nitride) and metal (e.g., titanium, tantalum, tungsten, copper, or aluminum).

The gate dielectric layer GI and the gate electrode GE may be recessed, and then the gate capping layer GP may be formed on the recessed gate electrode GE. The gate capping layer GP may have a top surface coplanar with that of the active pattern ACT. The gate capping layer GP may include one or more of a silicon oxide layer, a silicon nitride layer, and a silicon oxynitride layer.

The active patterns ACT may be implanted with impurities to form a first impurity region SD1 and a pair of second impurity regions SD2 in an upper portion of each of the active patterns ACT. The pair of second impurity regions SD2 may be spaced apart from each other in the third direction D3 across the first impurity region SD1. The first and second impurity regions SD1 and SD2 may be doped to have the same conductive type (e.g., N-type).

The active patterns ACT, the gate structures GS, and/or the device isolation layer ST may constitute or form an active structure AS. A planarization process may be performed to cause the active structure AS to have a substantially flat top surface.

The active structure AS may be provided thereon with a target layer TL, a first mask layer ML1, a hardmask layer HM, a first insulating layer IL1, a second mask layer ML2, a third mask layer ML3, and/or a second insulating layer IL2 that are sequentially formed.

The target layer TL may include a plurality of insulating layers. The insulating layers may be or include a silicon oxide layer, a silicon nitride layer, or a combination thereof. The first mask layer ML1 may include a doped polysilicon layer. The hardmask layer HM may include a spin-on-hardmask (SOH) layer. The hardmask layer HM may further include a silicon oxide layer below the SOH layer. The first insulating layer IL1 may include one or more of a silicon nitride layer and a silicon oxynitride layer. The second mask layer ML2 may include a silicon oxide layer. The third mask layer ML3 may include a spin-on-hardmask (SOH) layer. The second insulating layer IL2 may include one or more of a silicon nitride layer and a silicon oxynitride layer.

Figure 3A:
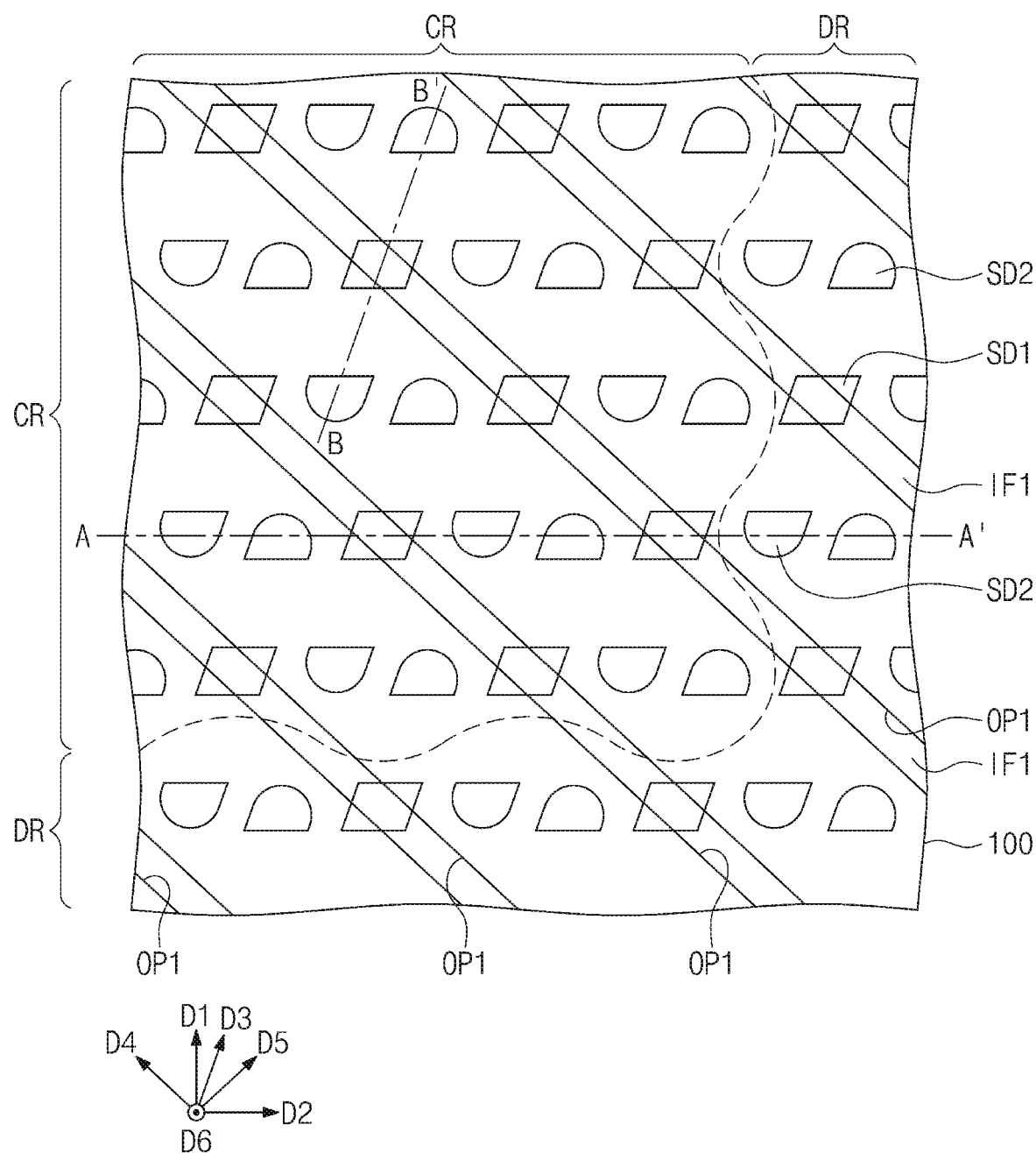
Figure 3B:
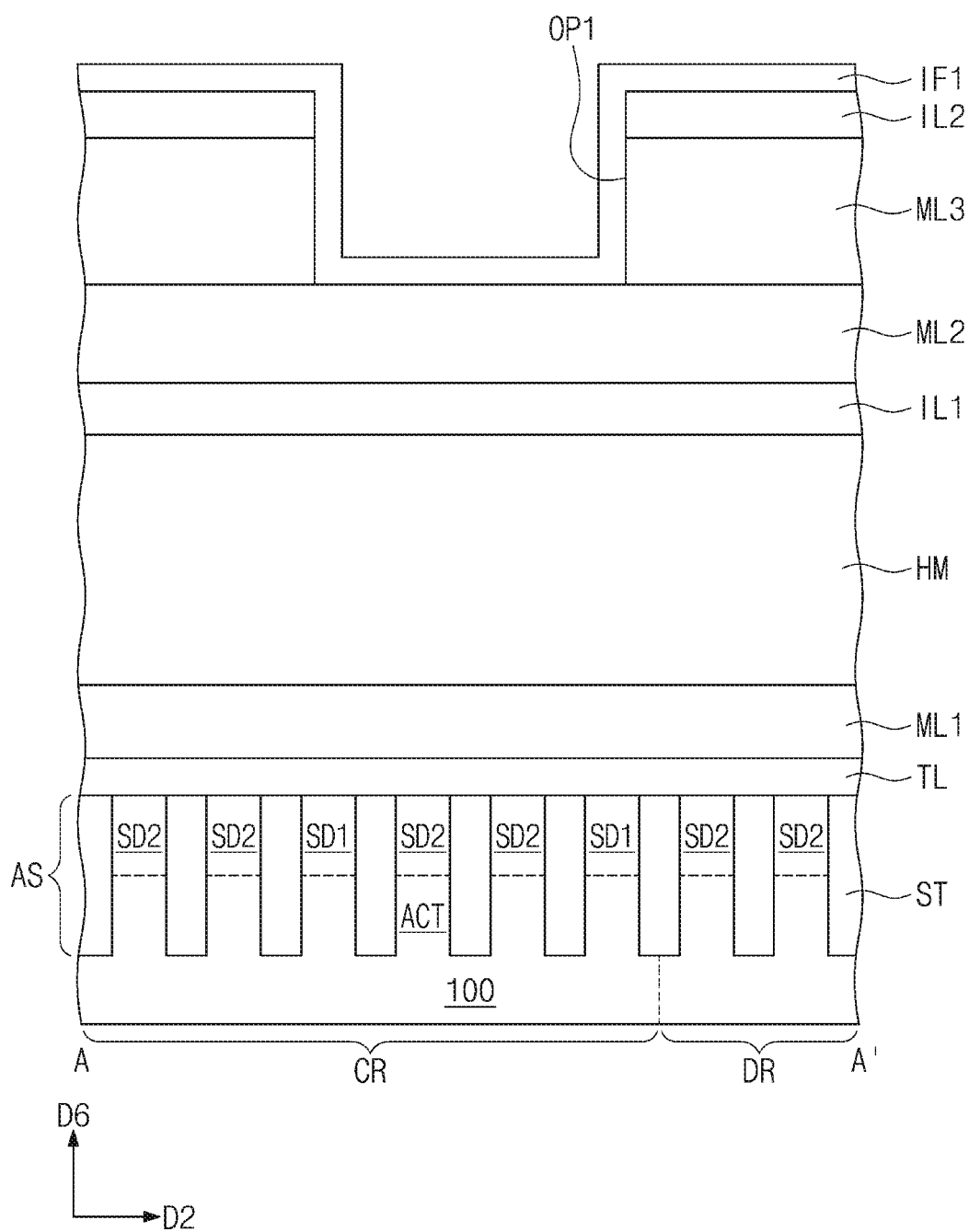
Figure 3C:
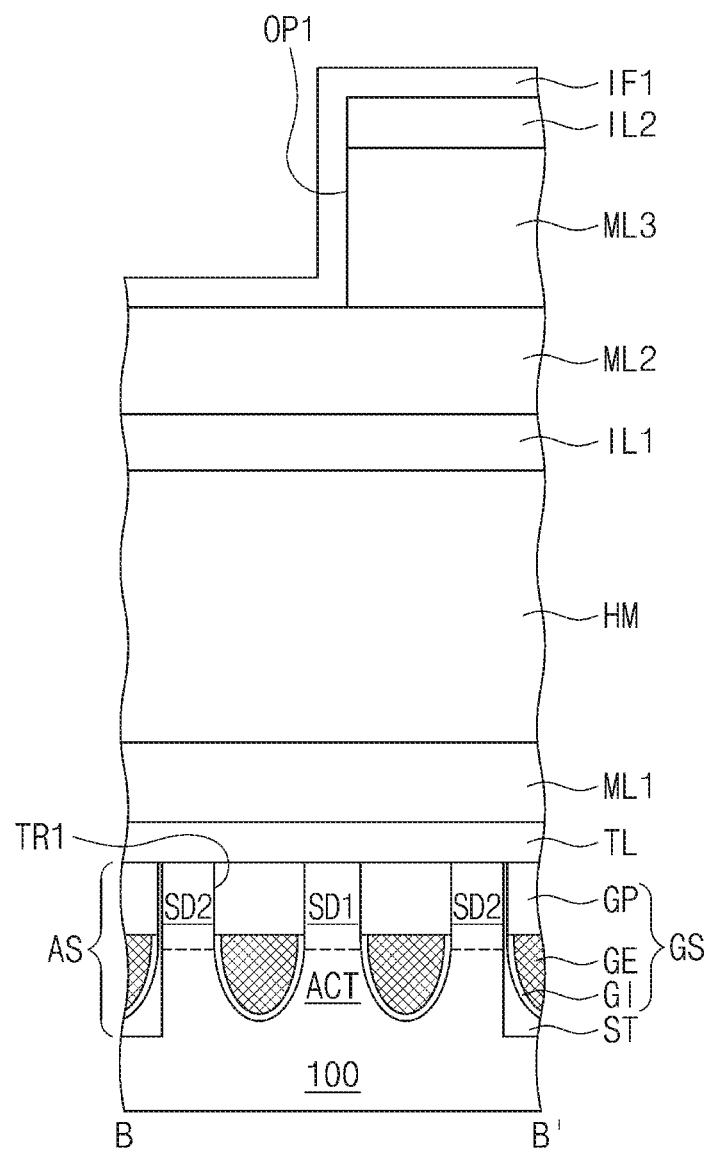

Referring to FIGS. 3A, 3B, and 3C, the third mask layer ML3 and the second insulating layer IL2 may be patterned to form first openings OP1. The first openings OP1 may extend in a fourth direction D4 that is parallel to the top surface of the substrate 100 and intersects the second direction D2. For example, the first openings OP1 may extend in a direction intersecting the gate electrodes GE.

The formation of the first openings OP1 may include forming a first photoresist layer on the second insulating layer IL2, using a first photomask to pattern the first photoresist layer, and using the patterned first photoresist layer as an etching mask to pattern the third mask layer ML3 and the second insulating layer IL2. A remaining first photoresist layer may be removed.

A first dielectric film IF1 may be conformally formed on an entire surface of the substrate 100. The first dielectric film IF1 may include a silicon oxide layer. The first dielectric film IF1 may be formed by atomic layer deposition (ALD).

Figure 4A:
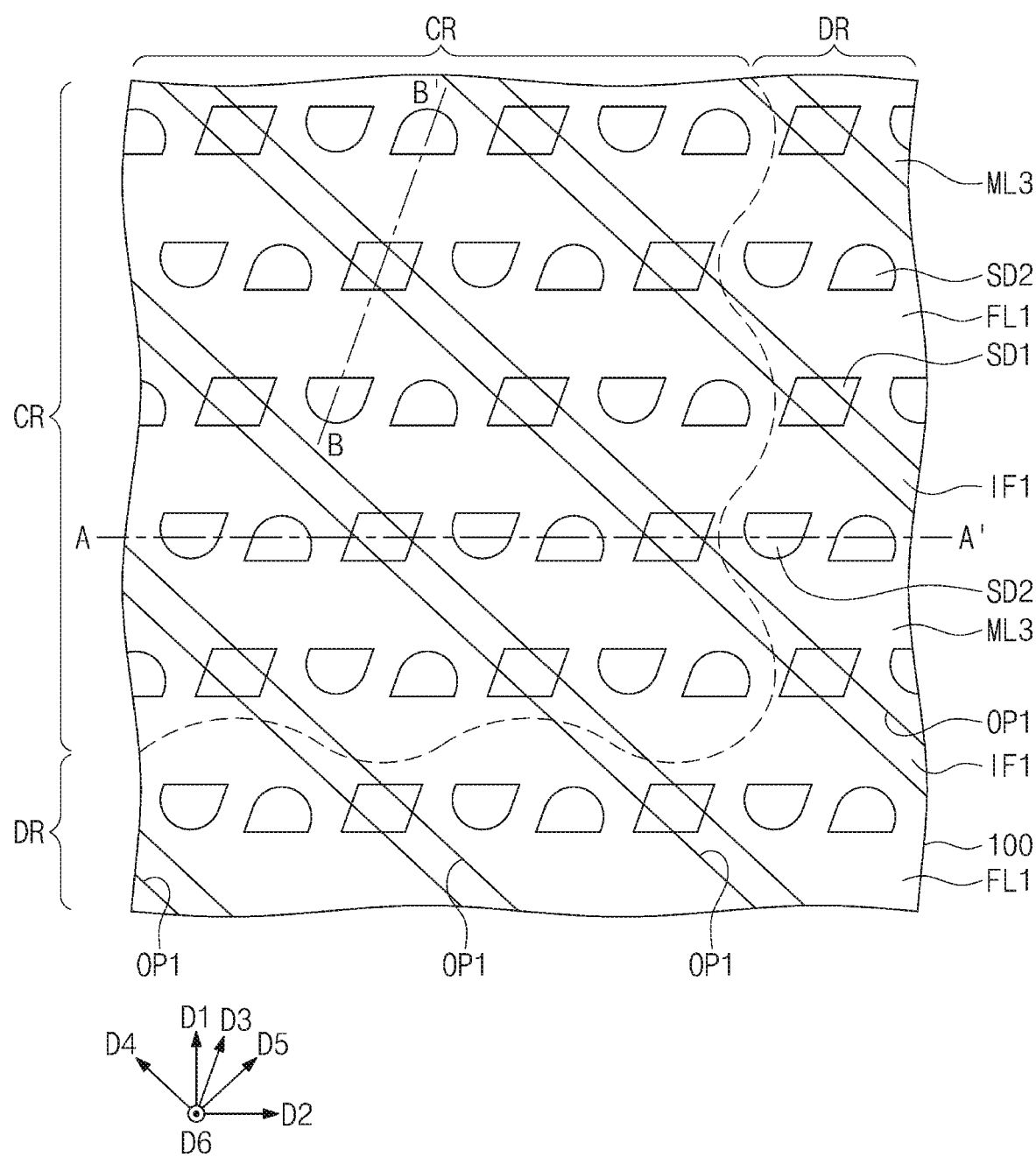
Figure 4B:
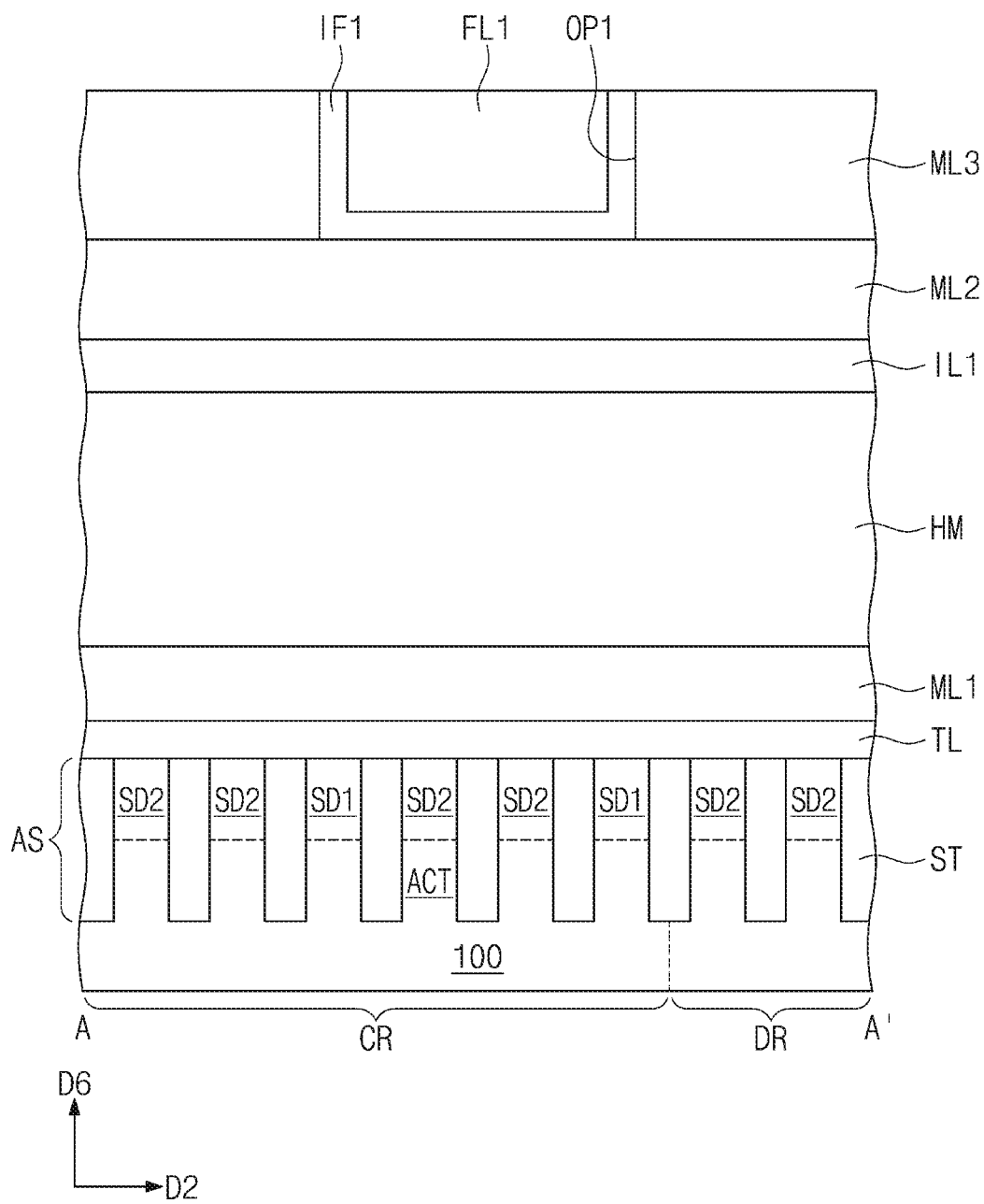
Figure 4C:
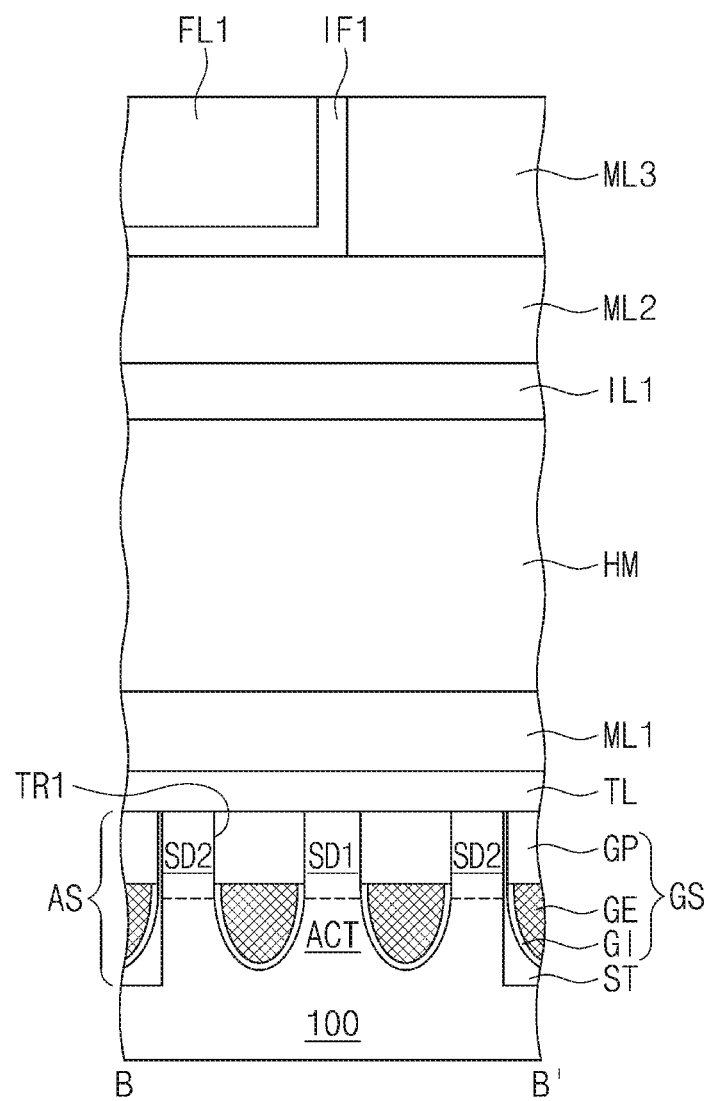

Referring to FIGS. 4A, 4B, and 4C, a first filling layer FL1 may be formed on the first dielectric film IF1. The first filling layer FL1 may fill the first openings OP1. The first filling layer FL1 may include a spin-on-hardmask (SOH) layer.

After the first filling layer FL1 is formed, a first etch-back process may be performed. The first etch-back process may be performed such that the second insulating layer IL2 is removed, the first dielectric film IF1 is removed on its portion on the second insulating layer IL2, and the first filling layer FL1 is removed on its portion on the second insulating layer IL2. Both remaining first dielectric film IF1 and first filling layer FL1 may selectively fill each of the first openings OP1. The both remaining first dielectric film IF1 and first filling layer FL1 may be provided in the third mask layer ML3. When viewed in plan, the third mask layer ML3, the first dielectric film IF1, and the first filling layer FL1 may be exposed on the entire surface of the substrate 100.

Figure 5A:
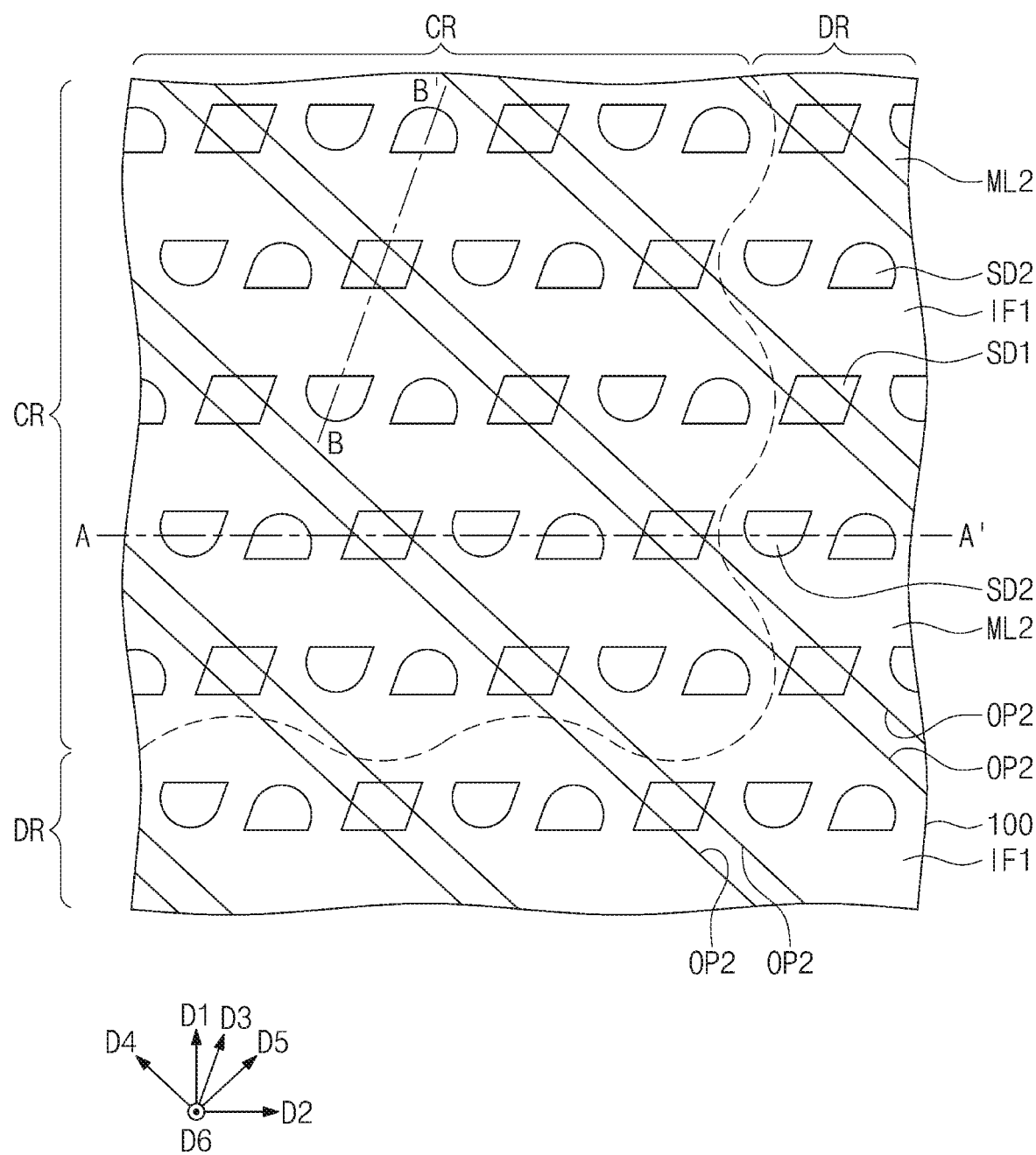
Figure 5B:
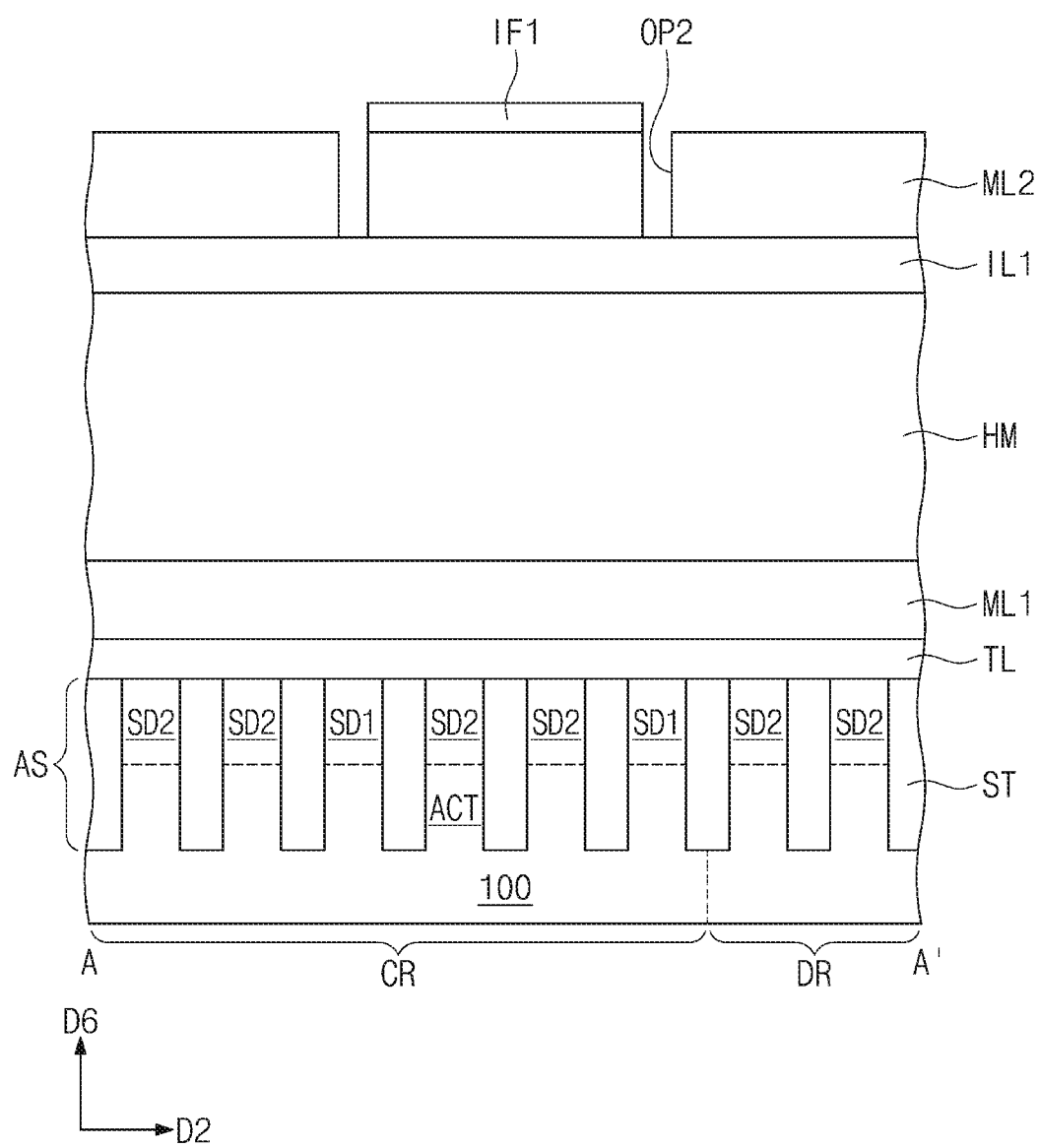
Figure 5C:
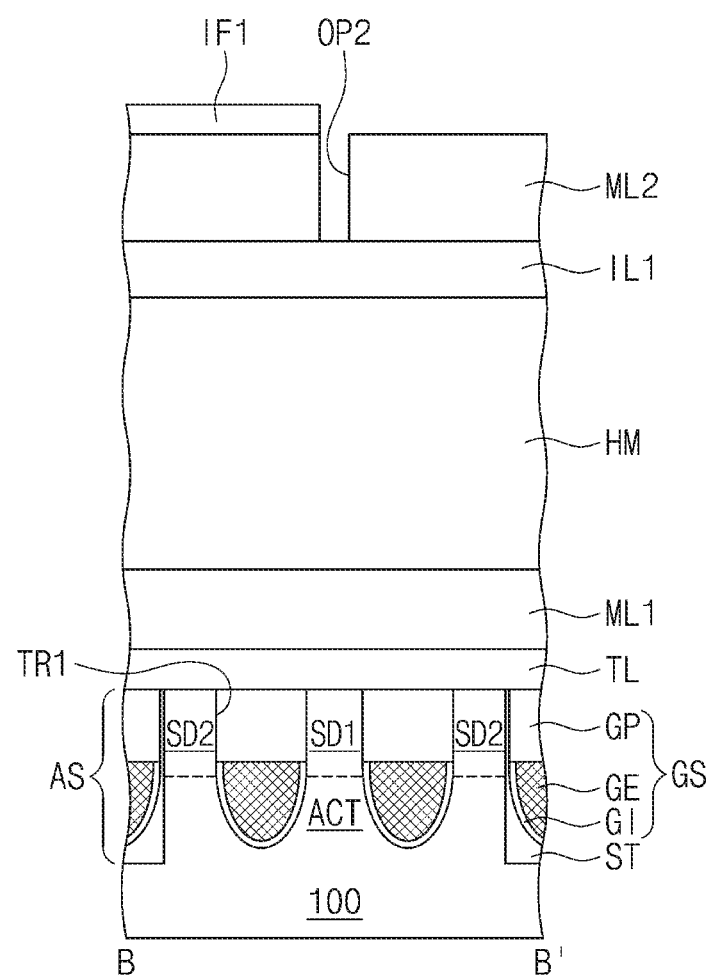

Referring to FIGS. 5A, 5B, and 5C, a first etching process may be performed to pattern the second mask layer ML2. The first etching process may include removing the first dielectric film IF1 between the third mask layer ML3 and the first filling layer FL1, and using the third mask layer ML3 and the first filling layer FL1 as an etching mask to pattern the second mask layer ML2. A removal process may be performed to remove the third mask layer ML3 and the first filling layer FL1 that remain after the first etching process.

The first etching process may form second openings OP2 in the second mask layer ML2. The second openings OP2 may extend in the fourth direction D4. The first etching process may cause that the second mask layer ML2 is patterned to have a linear shape extending in the fourth direction D4.

Figure 6A:
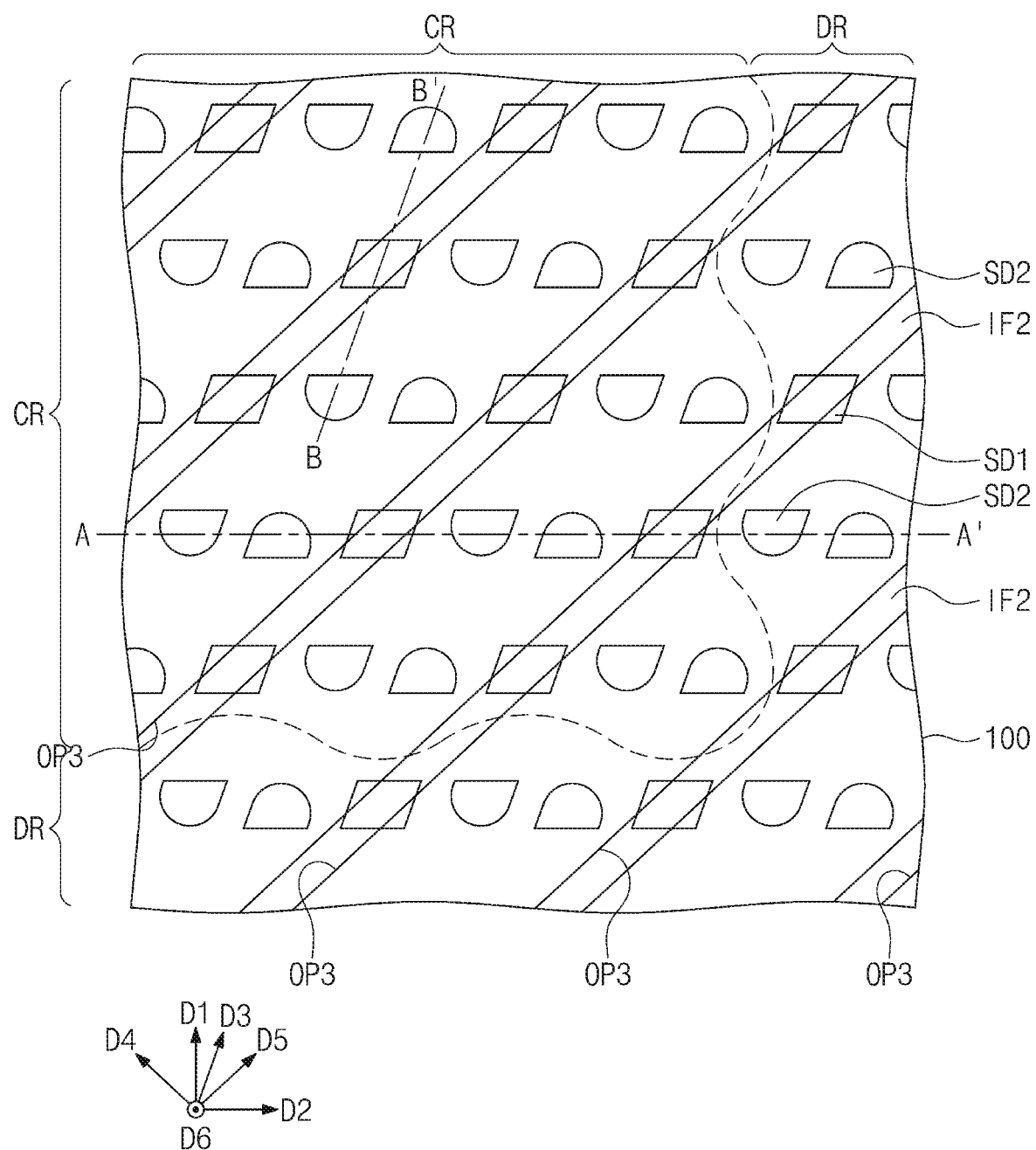
Figure 6B:
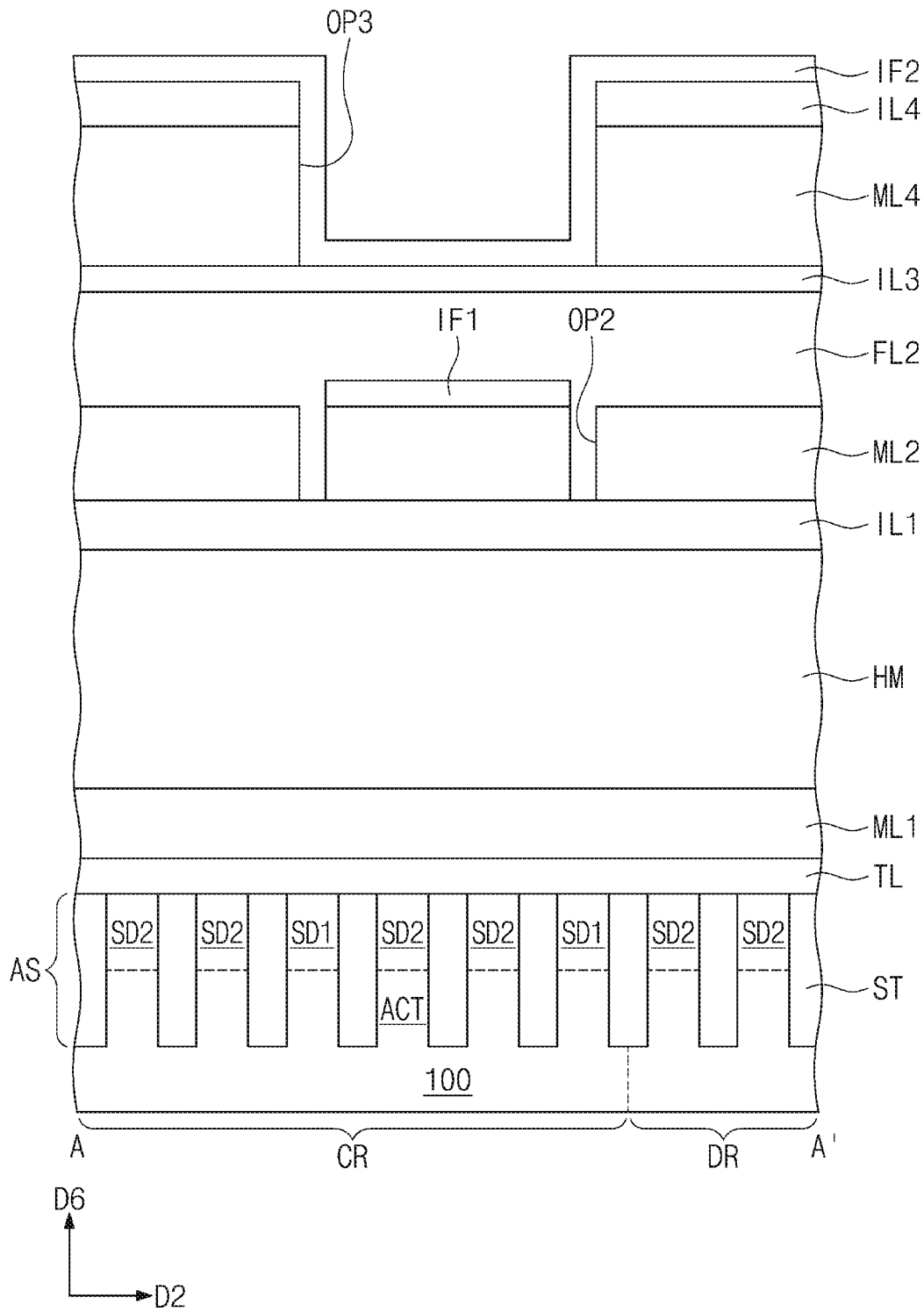
Figure 6C:
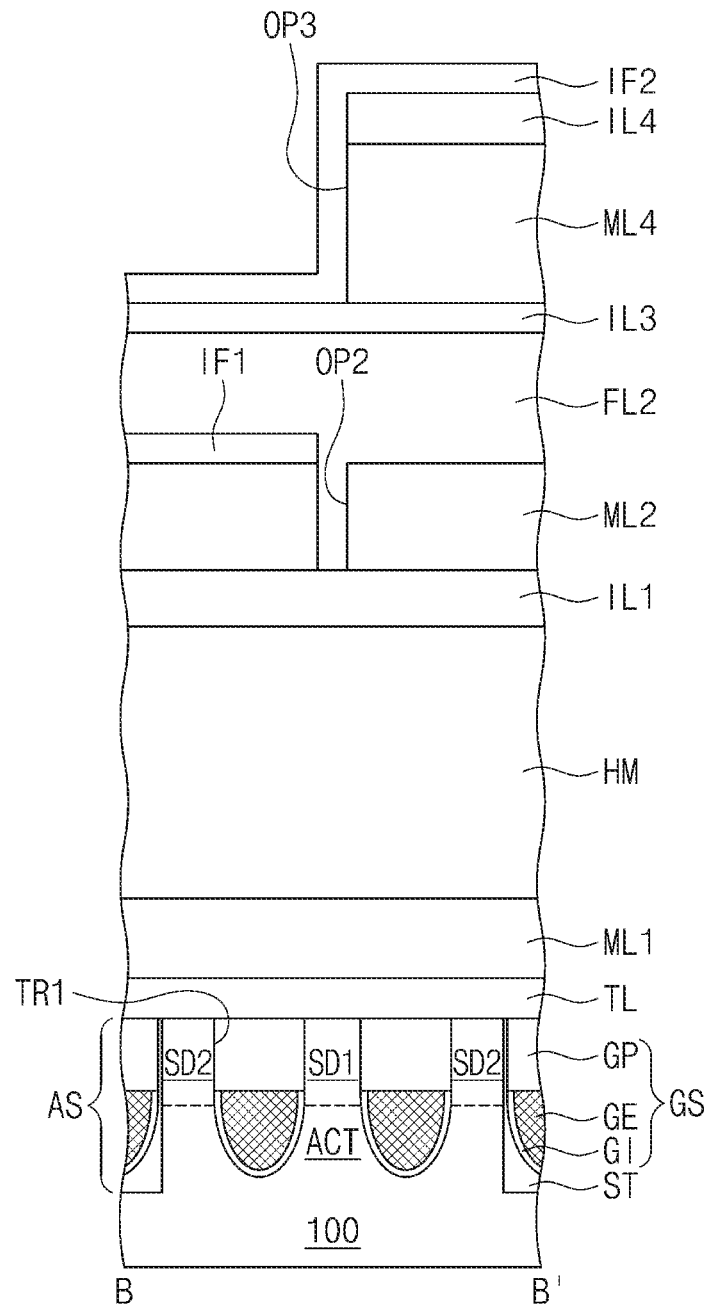

Referring to FIGS. 6A, 6B, and 6C, a second filling layer FL2 may be formed on the entire surface of the substrate 100. The second filling layer FL2 may fill the second openings OP2. The second filling layer FL2 may include a spin-on-hardmask (SOH) layer.

A third insulating layer IL3, a fourth mask layer ML4, and/or a fourth insulating layer IL4 may be sequentially formed on the second filling layer FL2. The third insulating layer IL3 may include a silicon oxide layer. The fourth mask layer ML4 may include a spin-on-hardmask (SOH) layer. The fourth insulating layer IL4 may include one or more of a silicon nitride layer and a silicon oxynitride layer.

The fourth mask layer ML4 and the fourth insulating layer IL4 may be patterned to form third openings OP3. The third openings OP3 may extend in a fifth direction D5 that is parallel to the top surface of the substrate 100 and intersects the second direction D2. For example, the third openings OP3 may extend in a direction intersecting the gate electrodes GE and the second openings OP2.

The formation of the third openings OP3 may include forming a second photoresist layer on the fourth insulating layer IL4, using a second photomask to pattern the second photoresist layer, and using the patterned second photoresist layer as an etching mask to pattern the fourth mask layer ML4 and the fourth insulating layer IL4. A remaining second photoresist layer may be removed.

A second dielectric film IF2 may be conformally formed on the entire surface of the substrate 100. The second dielectric film IF2 may include a silicon oxide layer. The second dielectric film IF2 may be formed by atomic layer deposition (ALD).

Figure 7A:
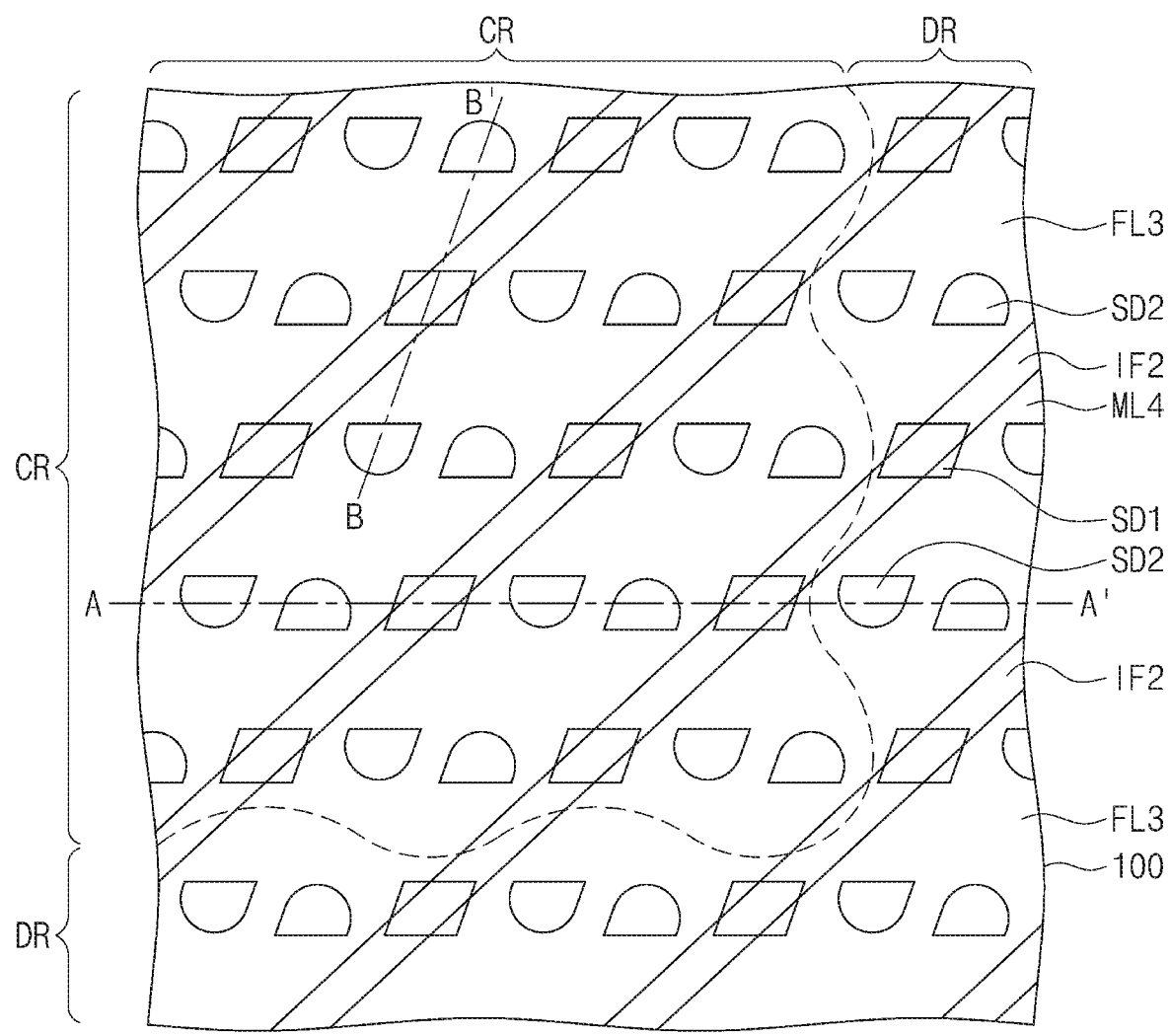
Figure 7A:
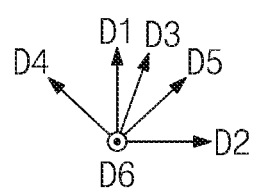
Figure 7B:
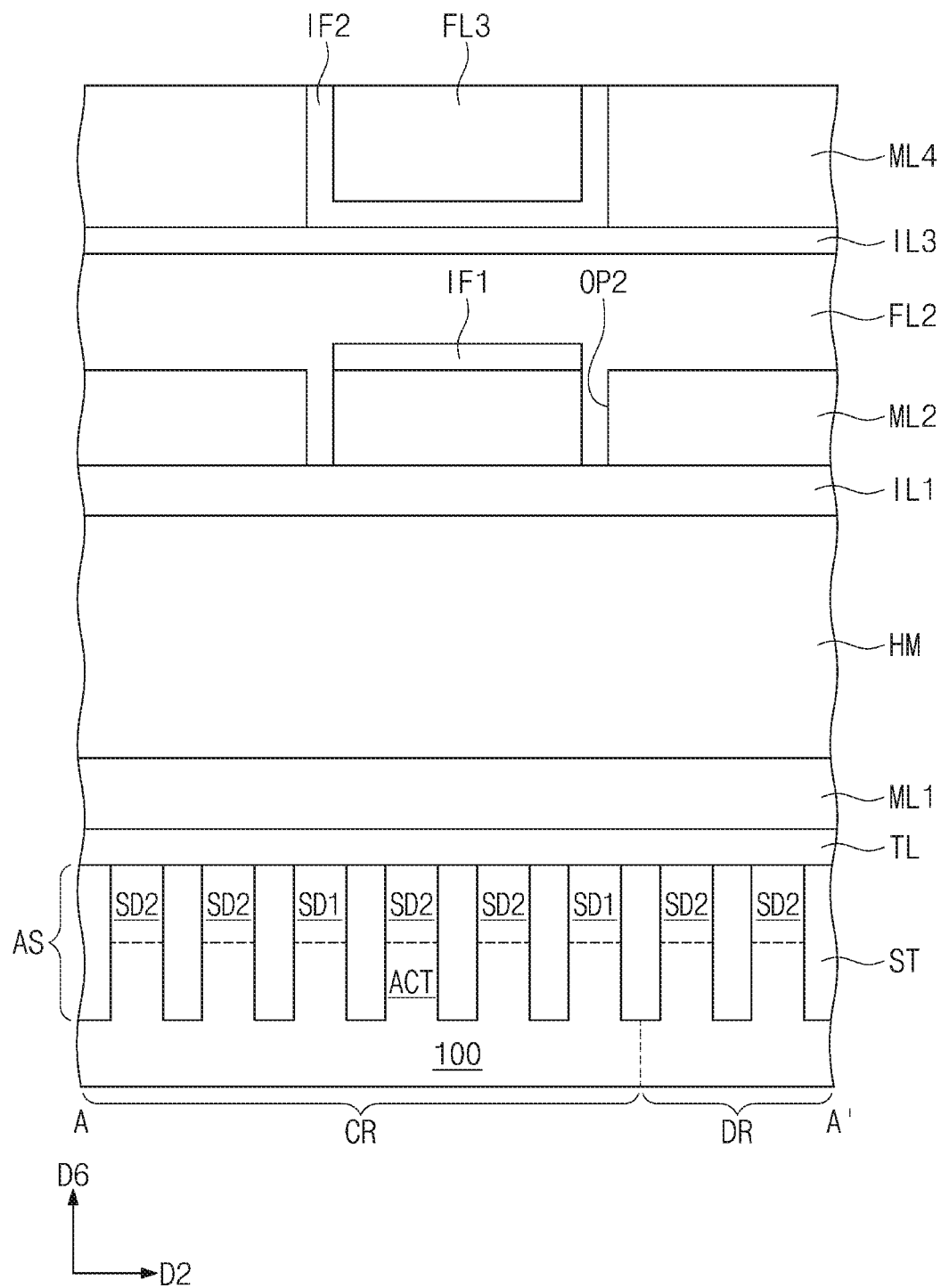
Figure 7C:
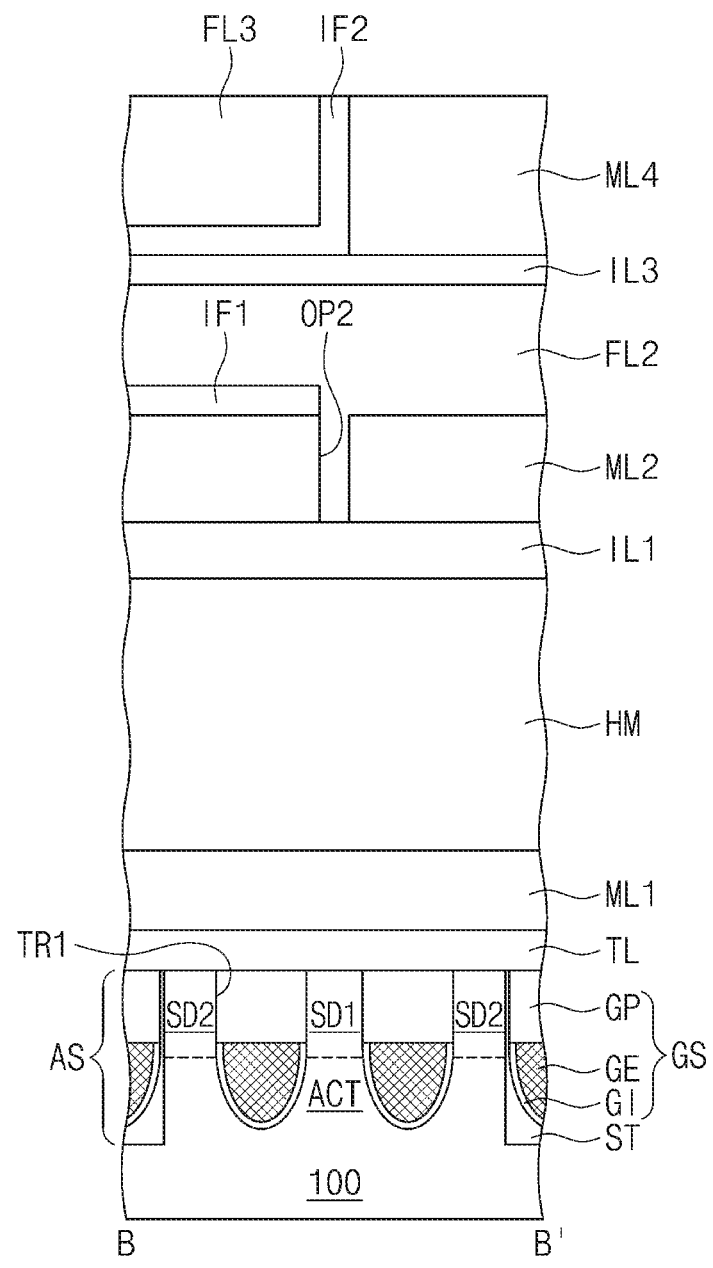

Referring to FIGS. 7A, 7B, and 7C, a third filling layer FL3 may be formed on the second dielectric film IF2. The third filling layer FL3 may fill the third openings OP3. The third filling layer FL3 may include a spin-on-hardmask (SOH) layer.

After the third filling layer FL3 is formed, a second etch-back process may be performed. The second etch-back process may be performed such that the fourth insulating layer IL4 is removed, the second dielectric film IF2 is removed on its portion on the fourth insulating layer IL4, and the third filling layer FL3 is removed on its portion on the fourth insulating layer IL4. Both remaining second dielectric film IF2 and third filling layer FL3 may selectively fill each of the third openings OP3. The both remaining second dielectric film IF2 and third filling layer FL3 may be provided in the fourth mask layer ML4. When viewed in plan, the fourth mask layer ML4, the second dielectric film IF2, and the third filling layer FL3 may be exposed on the entire surface of the substrate 100.

Figure 8A:
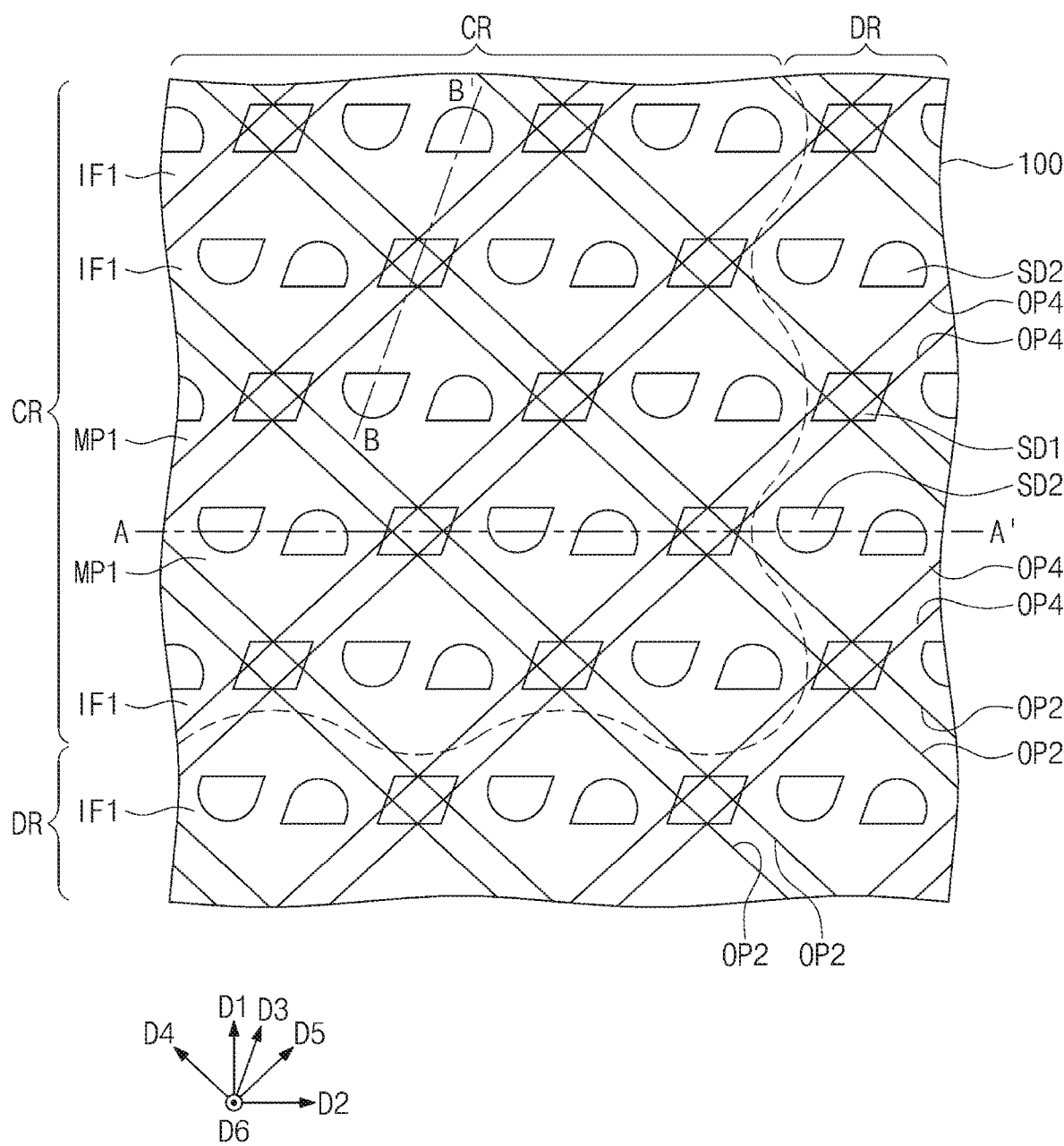
Figure 8B:
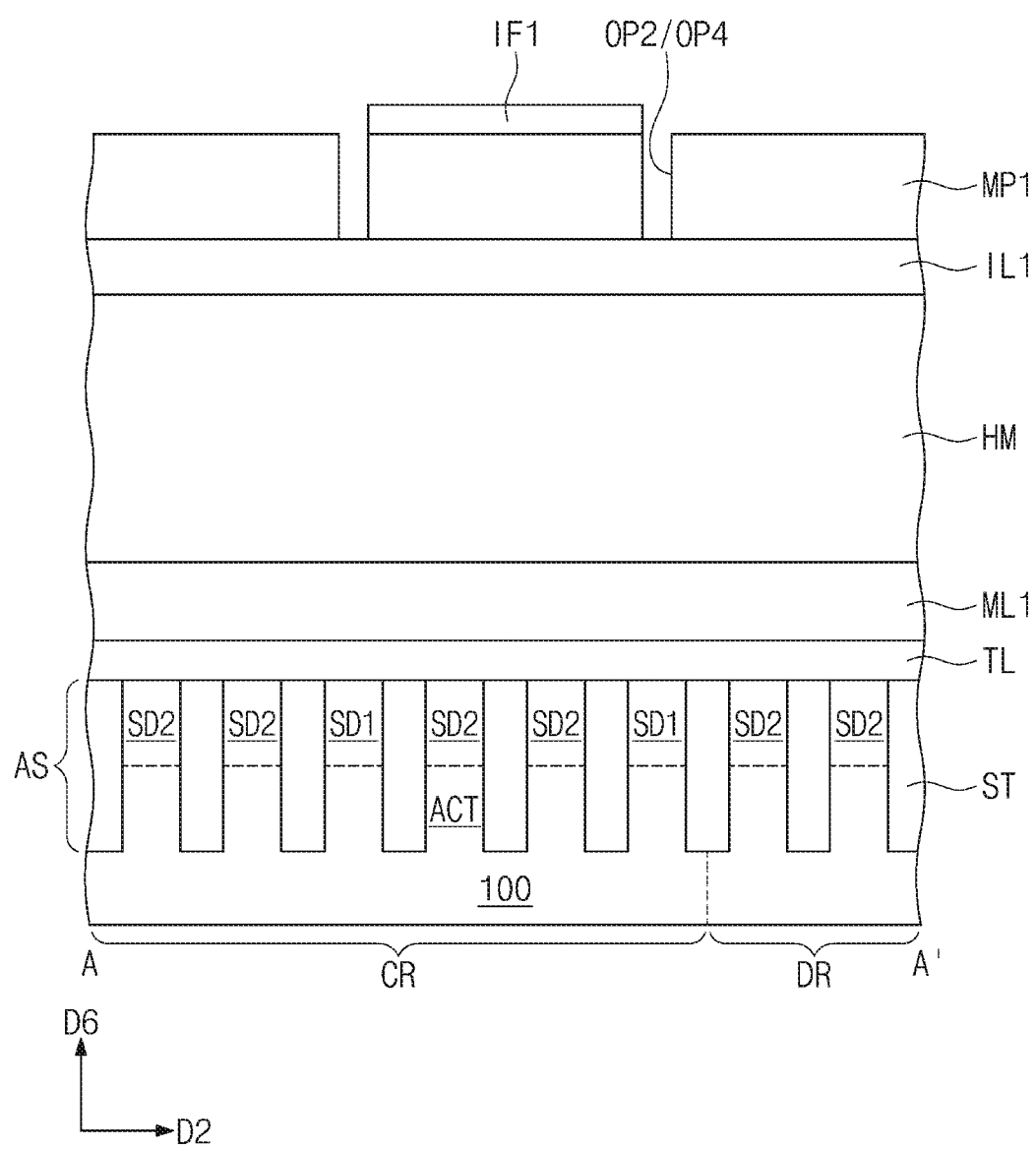
Figure 8C:
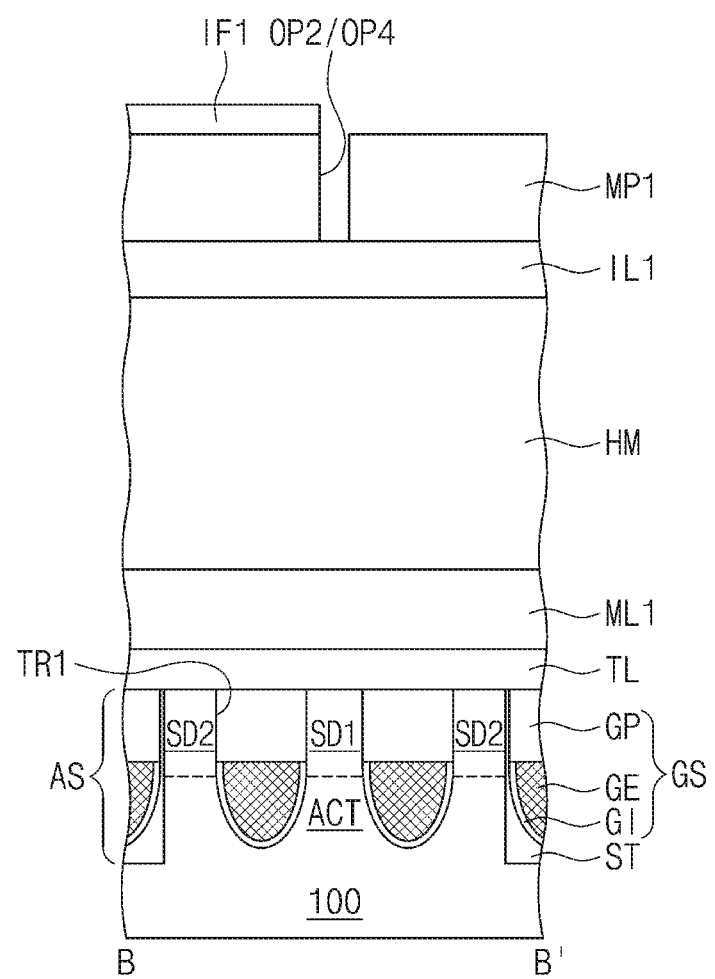

Referring to FIGS. 8A, 8B, and 8C, a second etching process may be performed to pattern the second mask layer ML2. The second etching process may include removing the second dielectric film IF2 between the fourth mask layer ML4 and the third filling layer FL3, and using the fourth mask layer ML4 and the third filling layer FL3 as an etching mask to pattern the third insulating layer IL3, the second filling layer FL2, and the second mask layer ML2. A removal process may be performed to remove the fourth mask layer ML4, the third filling layer FL3, the second dielectric film IF2, the third insulating layer IL3, and/or the second filing layer FL2 that remain after the second etching process.

The second etching process may form fourth openings OP4 in the second mask layer ML2. The fourth openings OP4 may extend in the fifth direction D5. The fourth opening OP4 may partially overlap the second openings OP2.

The second etching process may cause that the second mask layer ML2 is patterned to form first mask patterns MP1. When viewed in plan, each of the first mask patterns MP1 may have a rhombic shape. Each of the first mask patterns MP1 may be defined by the second openings OP2 and the fourth openings OP4.

Figure 9A:
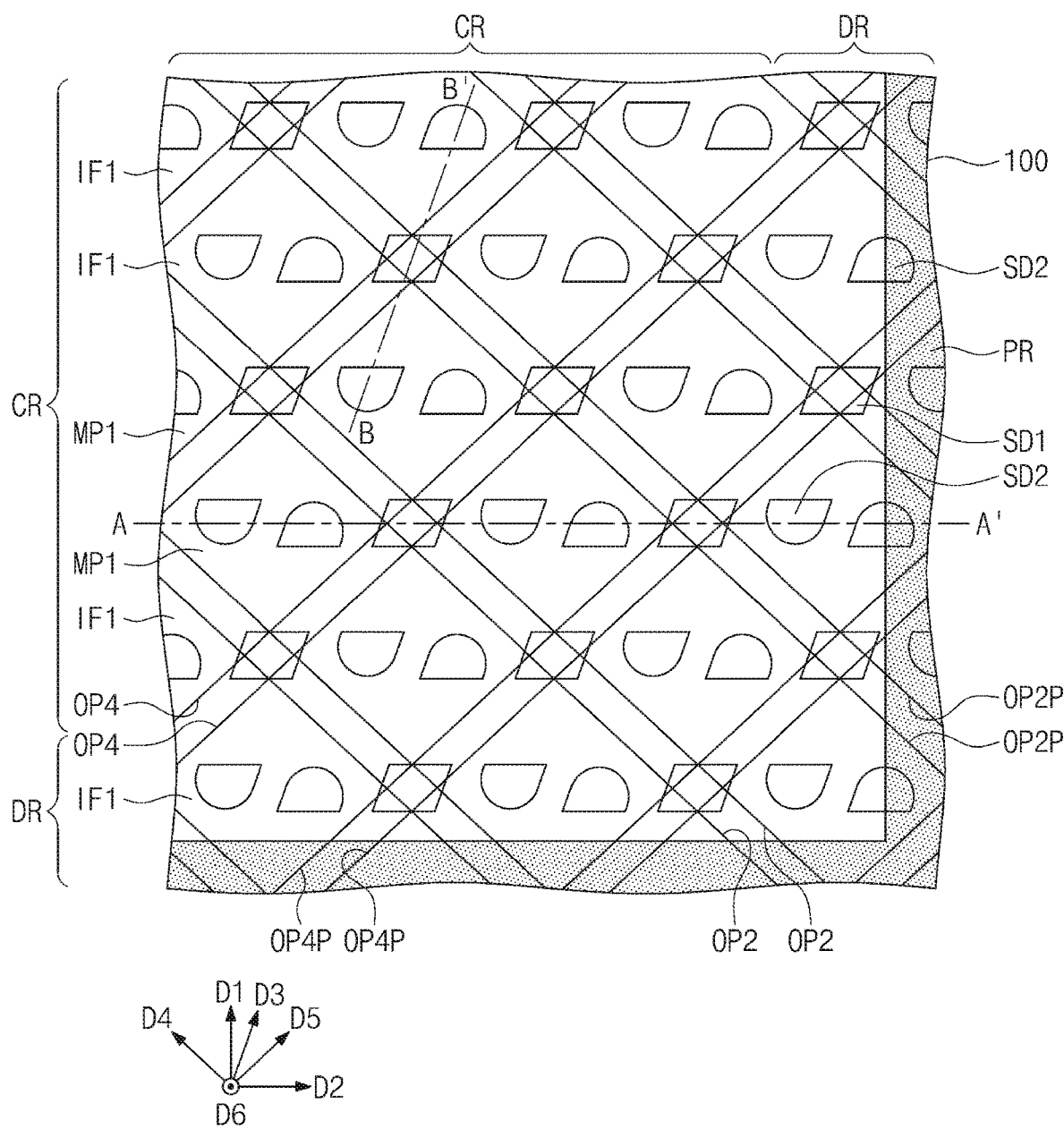
Figure 9B:
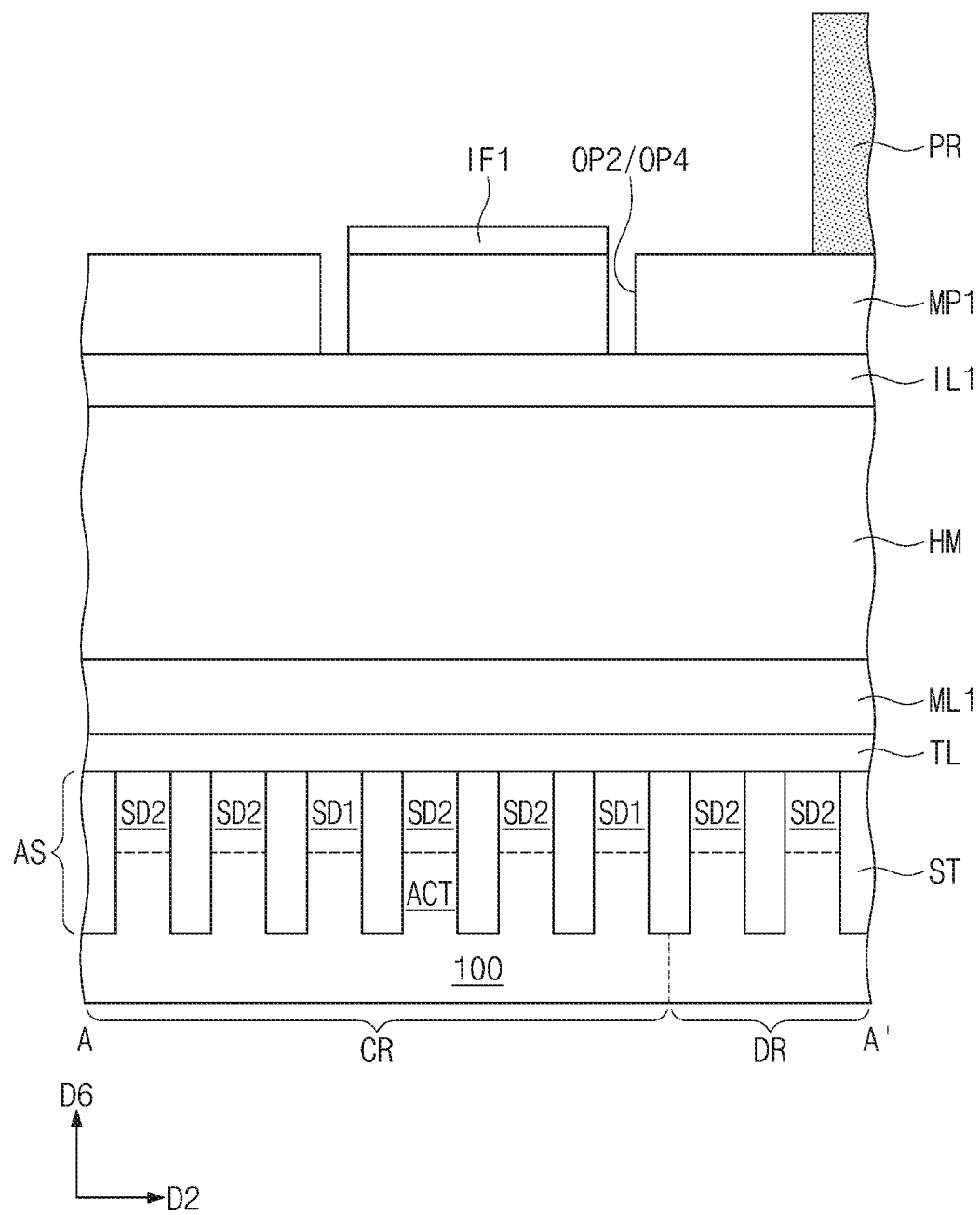
Figure 9C:
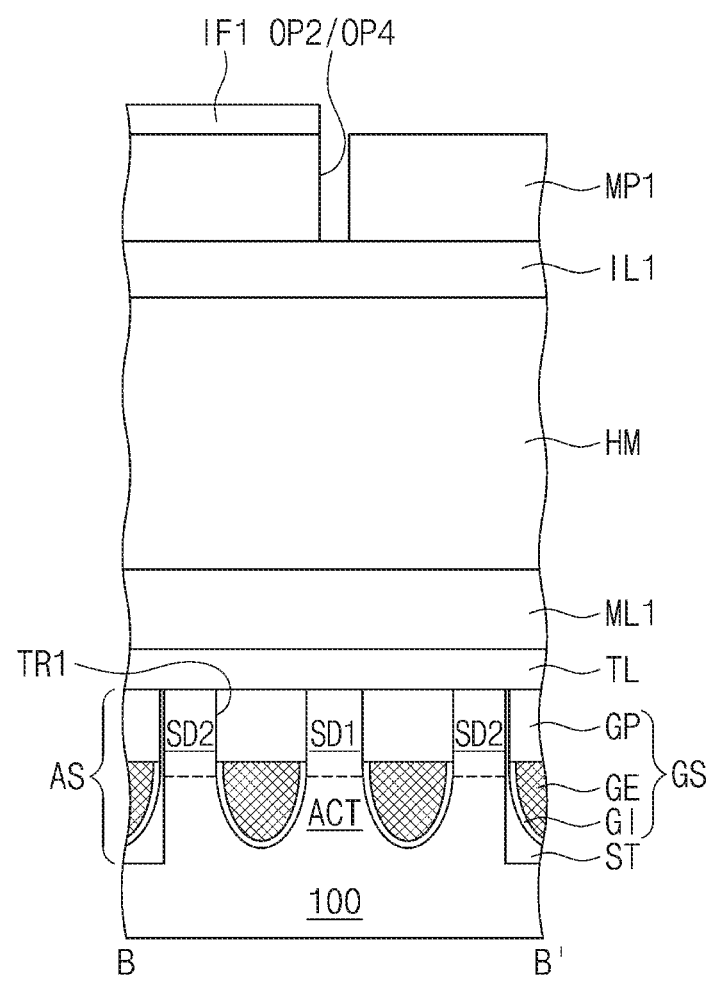

Referring to FIGS. 9A, 9B, and 9C, a photoresist pattern PR may be formed on the dummy region DR of the substrate 100. For example, the formation of the photoresist pattern PR may include forming a third photoresist layer on the entire surface of the substrate 100, and using a third photomask to pattern the third photoresist layer. The photoresist pattern PR may fill portions OP2P of the second openings OP2 on the dummy region DR of the substrate 100. The photoresist pattern PR may also fill portions OP4P of the fourth openings OP4 on the dummy region DR of the substrate 100. The photoresist pattern PR may mutually connect the first mask patterns MP1 on the dummy region DR.

Figure 10A:
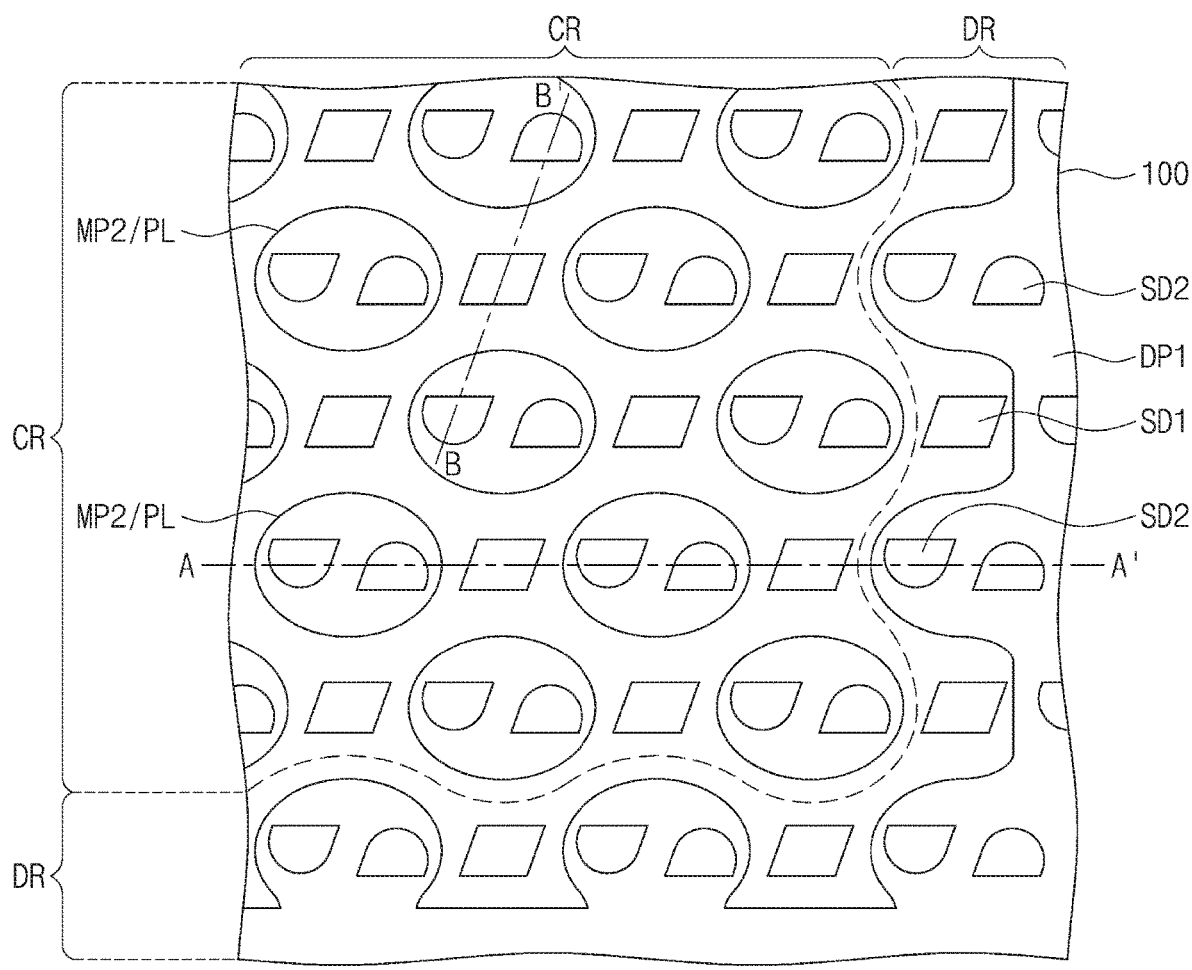
Figure 10A:
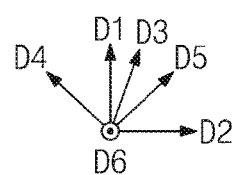
Figure 10B:
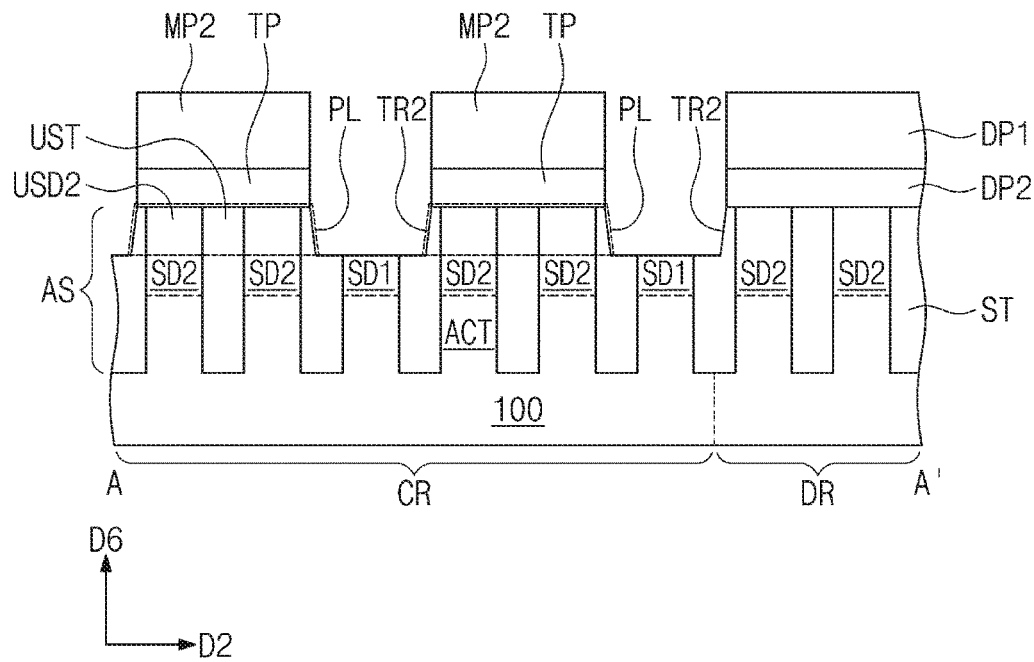
Figure 10C:
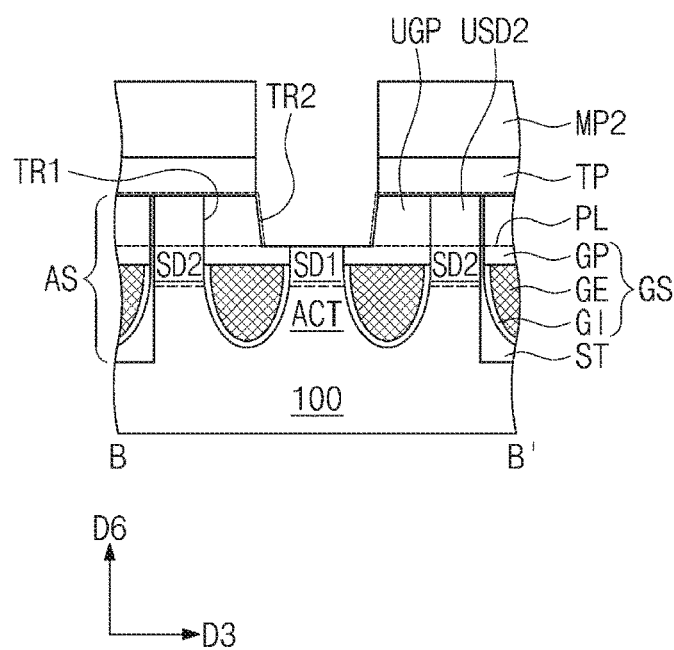

Referring to FIGS. 10A, 10B, and 10C, a third etching process may be performed to form a second trench TR2. The third etching process may include using the first mask patterns MP1 as an etching mask to pattern the first insulating layer IL1, using the patterned first insulating layer IL1 as an etching mask to pattern the hardmask layer HM, using the patterned hardmask layer HM as an etching mask to pattern the first mask layer ML1 and the target layer TL, and using the patterned first mask layer ML1 and patterned target layer TL as an etching mask to pattern the active structure AS. A removal process may be performed to remove the photoresist pattern PR, the first mask patterns MP1, the first dielectric film IF1, the first insulating layer IL1, and the hardmask layer HM that remain after the third etching process. The patterning of the first insulating layer IL1 using the first mask patterns MP1 as an etching mask may include that the second and fourth openings OP2 and OP4 are used to pattern the first insulating layer ILL The patterning of the first mask layer ML1 may form second mask patterns MP2 on the cell region CR of the substrate 100. When viewed in plan, each of the second mask patterns MP2 may have an elliptical shape. Although each of the first mask patterns MP1 has a rhombic shape, pattern shapes of a plurality of layers may be changed while being sequentially etched during the third etching process. Finally, each of the second mask patterns MP2 may be formed to have an elliptical shape. The second mask patterns MP2 may be spaced apart from each other in the fourth direction D4. The second mask patterns MP2 may also be spaced apart from each other in the fifth direction D5. A single second mask pattern MP2 may vertically overlap two second impurity regions SD2 adjacent to each other in the second direction D2.

The patterning of the target layer TL may form target patterns TP on the cell region CR of the substrate 100. The target patterns TP may vertically overlap the second mask patterns MP2. For example, the target patterns TP and the second mask patterns MP2 may have the same planar shape and arrangement.

The patterning of the active structure AS may form pillars PL on the cell region CR of the substrate 100 and also form the second trench TR2 between the pillars PL. For example, the second trench TR2 may define the pillars PL of the active structure AS. The active structure AS may have a portion at a level higher than that of a floor surface of the second trench TR2, and the portion of the active structure AS may be defined as the pillar PL. The second trench TR2 may expose the first impurity regions SD1. Each of the pillars PL may include an upper device isolation layer UST, upper second impurity regions USD2, and/or upper gate capping layers UGP. The upper device isolation layer UST may be a portion of the device isolation layer ST, which portion is placed at a level higher than that of the floor surface of the second trench TR2. The upper second impurity region USD2 may be a portion of the second impurity region SD2, which portion is placed at a level higher than that of the floor surface of the second trench TR2. The upper gate capping layer UGP may be a portion of the gate capping layer GP, which portion is placed at a level higher than that of the floor surface of the second trench TR2.

When viewed in plan, each of the pillars PL may have an elliptical shape. The pillars PL may be spaced apart from each other in the fourth direction D4. The pillars PL may also be spaced apart from each other in the fifth direction D5.

The patterning of the first mask layer ML1 may form a first dummy pattern DP1 on the dummy region DR of the substrate 100. The first dummy pattern DP1 may include a segment extending in the first direction D1 and other segment extending in the second direction D2.

The patterning of the target layer TL may form a second dummy pattern DP2 on the dummy region DR of the substrate 100. The second dummy pattern DP2 may vertically overlap the first dummy pattern DP1. For example, the first and second dummy patterns DP1 and DP2 may have the same planar shape.

Figure 11A:
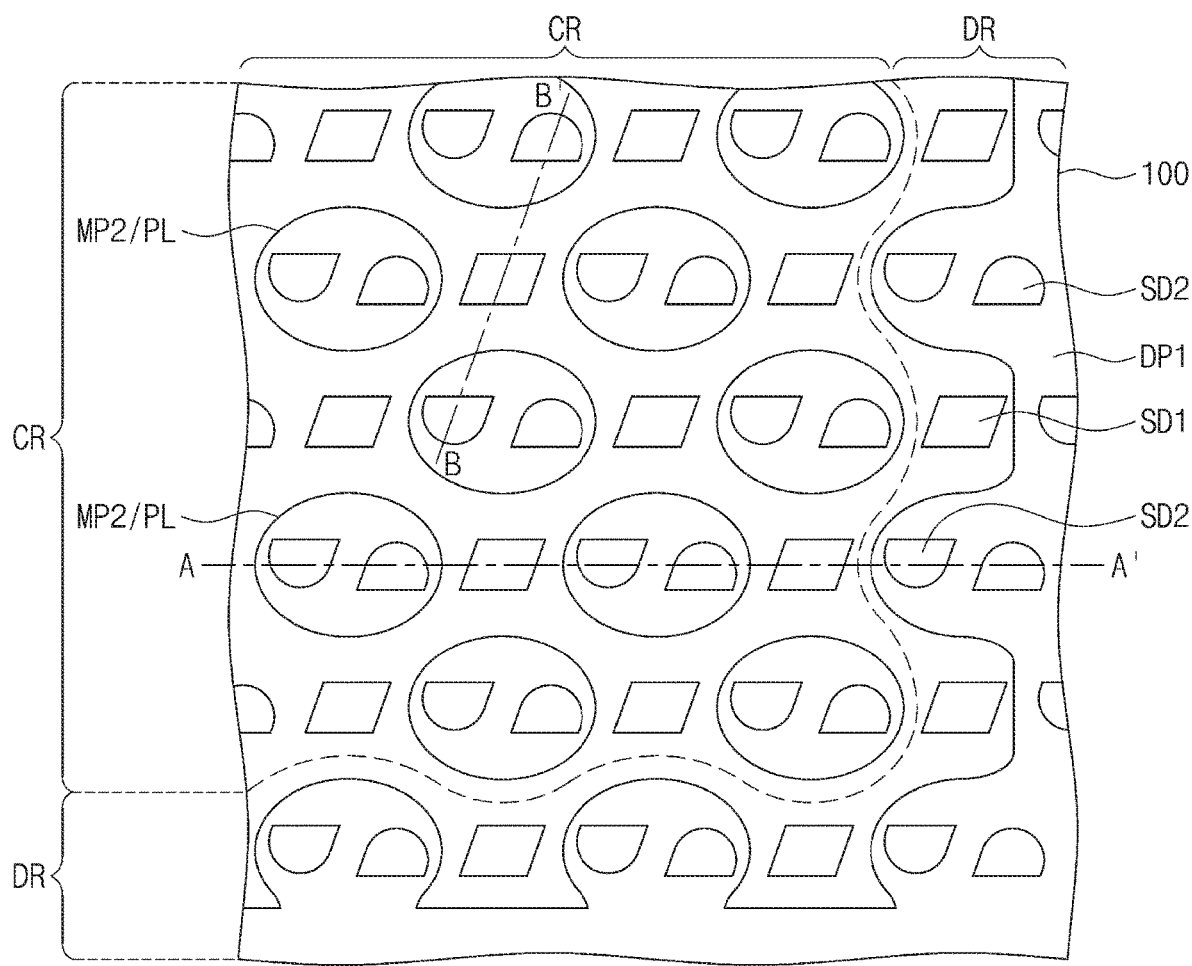
Figure 11B:
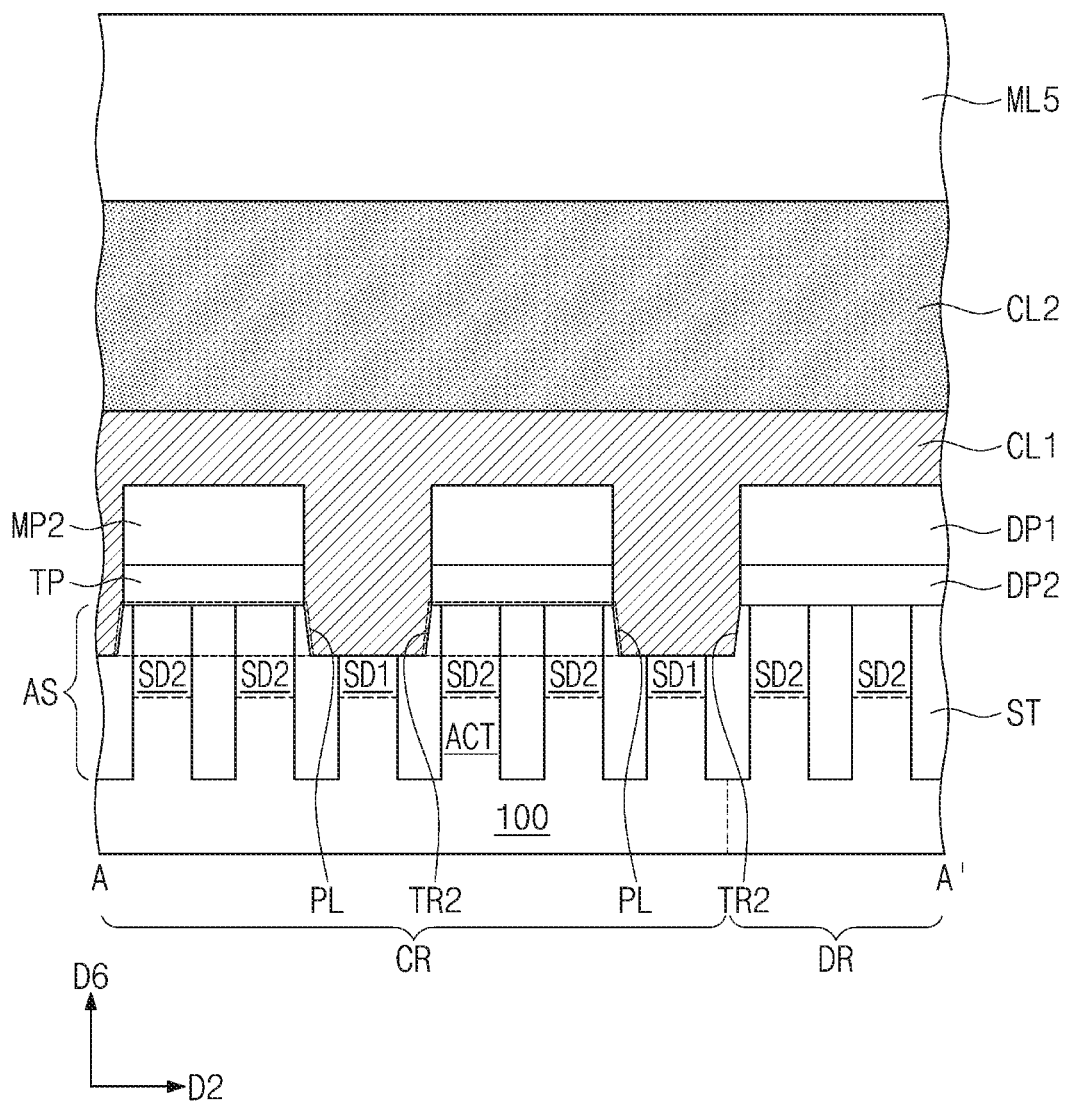
Figure 11C:
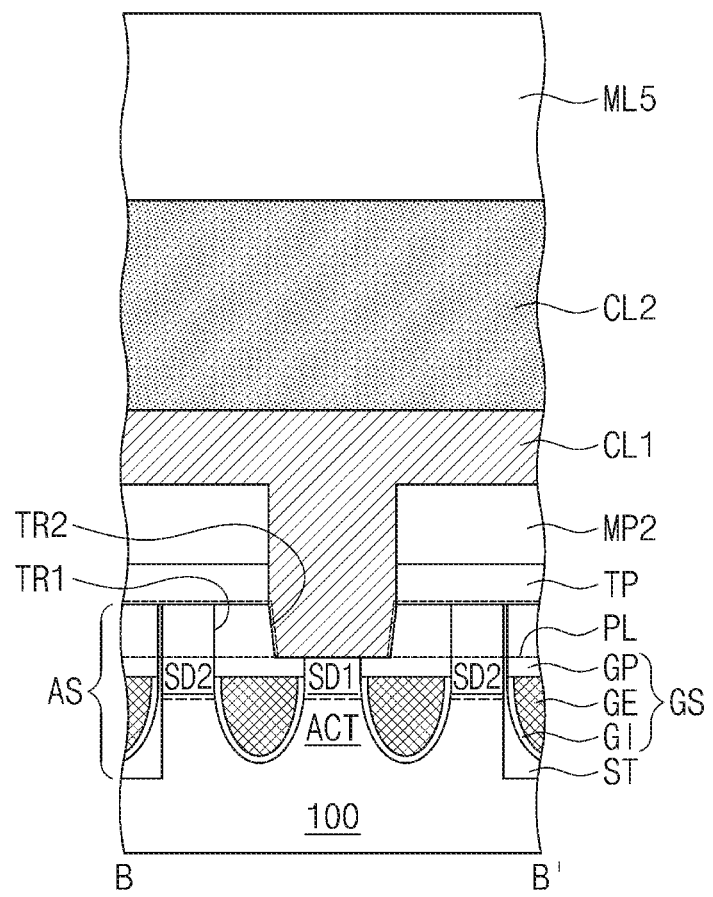
Figure 11C:
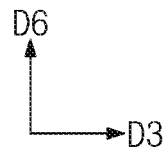

Referring to FIGS. 11A, 11B, and 11C, a first conductive layer CL1, a second conductive layer CL2, and/or a fifth mask layer ML5 may be sequentially formed on the entire surface of the substrate 100. The first conductive layer CL1 may fill the second trench TR2. The first conductive layer CL1 may contact the first impurity regions SD1. The first conductive layer CL1 may include one of a doped semiconductor material (e.g., doped silicon or doped germanium), a metallic material (e.g., titanium, tantalum, tungsten, copper, or aluminum), and a metal-semiconductor compound (e.g., tungsten silicide, cobalt silicide, or titanium silicide). The first conductive layer CL1 may have an electrical conductivity greater than that of the second mask pattern MP2. The second conductive layer CL2 may include a metallic material (e.g., titanium, tantalum, tungsten, copper, or aluminum). The fifth mask layer ML5 may include a silicon nitride layer or a silicon oxynitride layer.

Figure 12A:
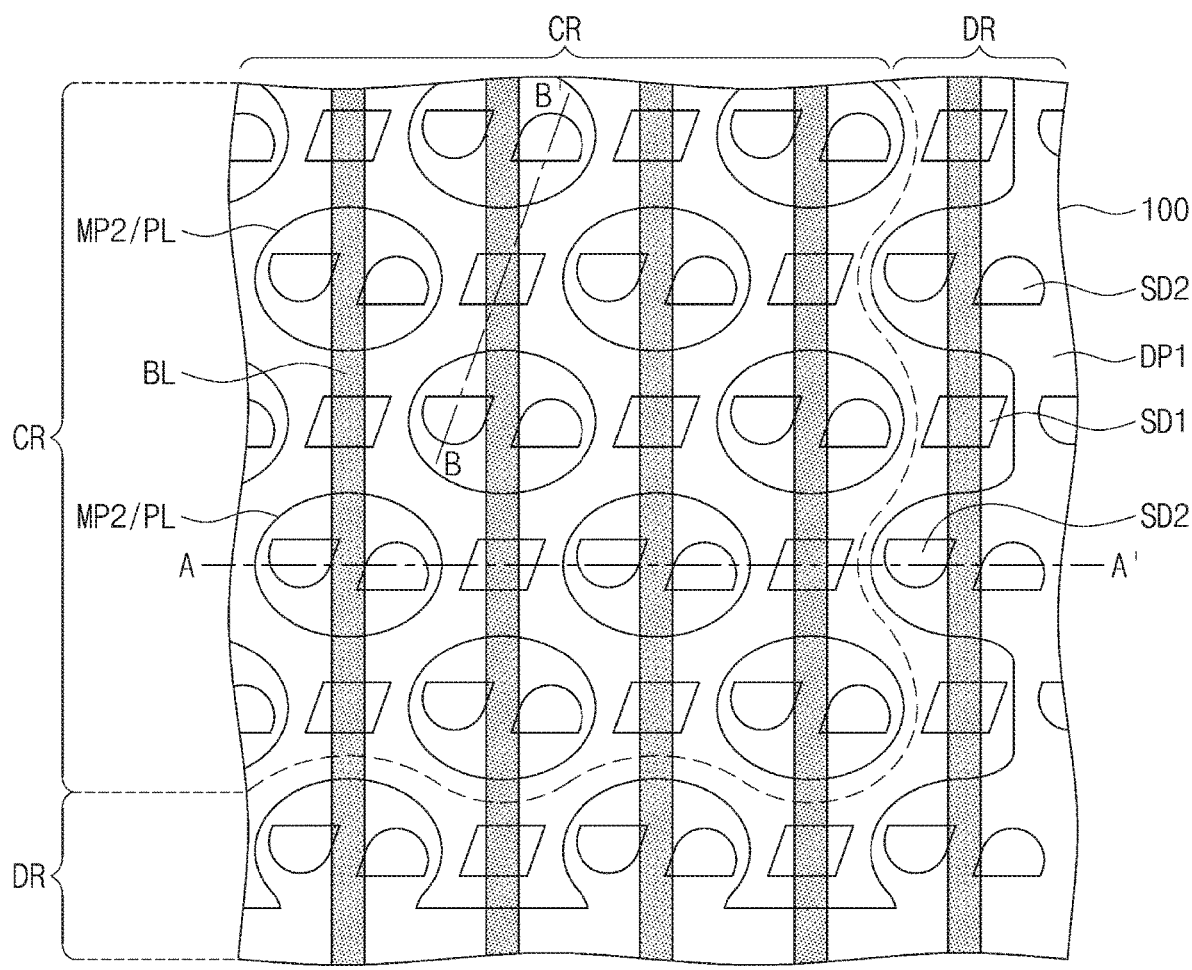
Figure 12B:
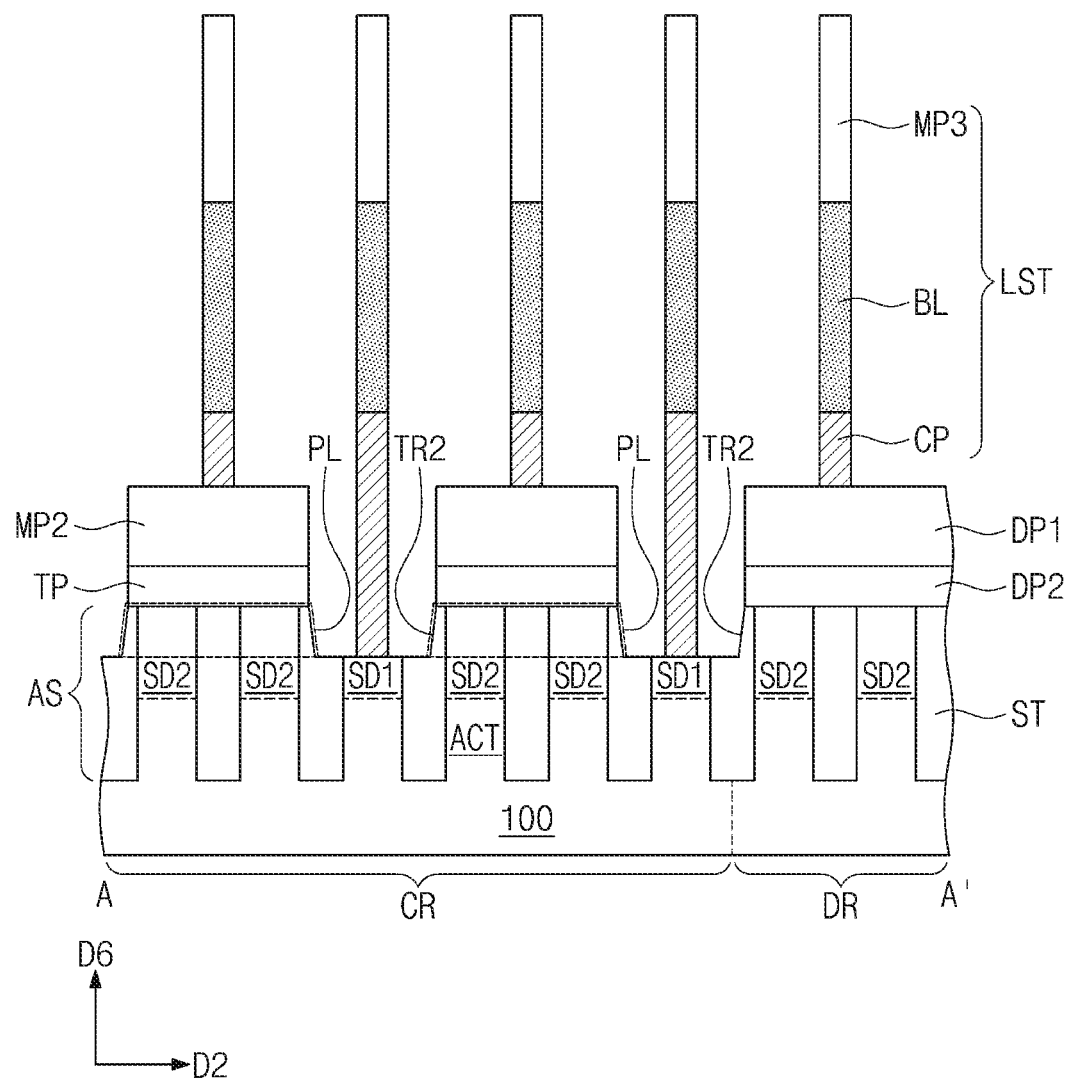
Figure 12C:
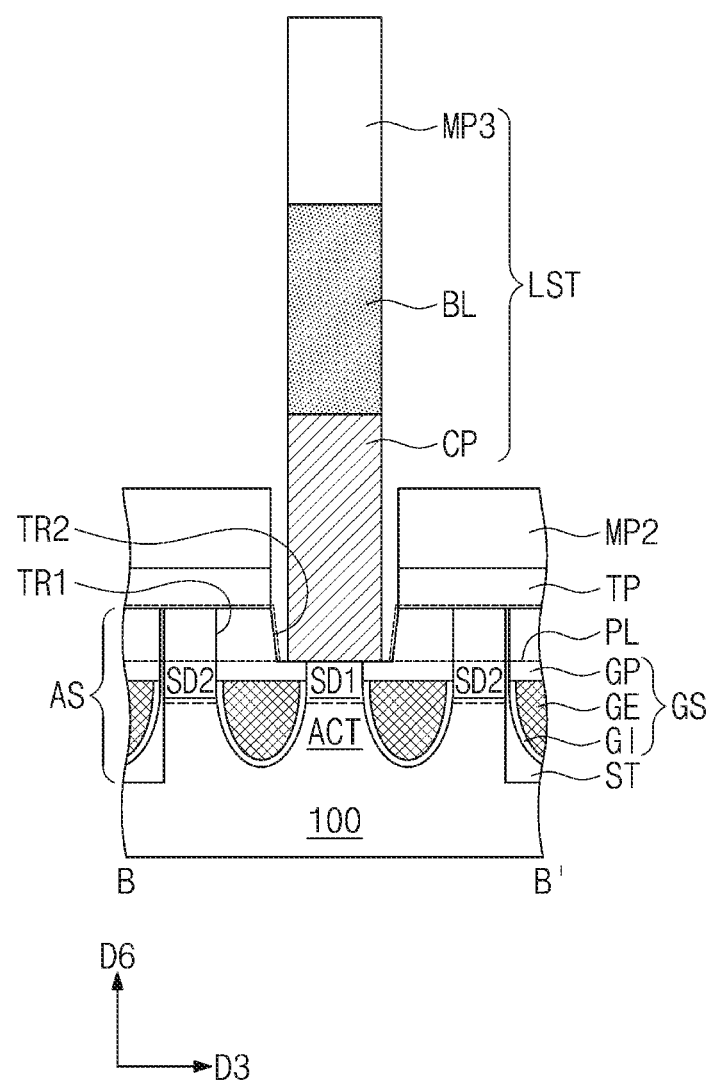

Referring to FIGS. 12A, 12B, and 12C, line structures LST may be formed to extend in the first direction D1. The line structures LST may be spaced apart from each other in the second direction D2.

For example, the fifth mask layer ML5 may be patterned to form third mask patterns MP3. A photolithography process may be used to pattern the third mask patterns MP3.

The third mask patterns MP3 may be used as an etching mask to sequentially etch the second conductive layer CL2 and the first conductive layer CL1 to respectively form bit lines BL and conductive patterns CP. The third mask pattern MP3, the bit line BL, and the conductive pattern CP may vertically overlap each other. The third mask pattern MP3, the bit line BL, and/or the conductive pattern CP may constitute or form the line structure LST. When viewed in plan, the bit lines BL may extend while intersecting the gate electrodes GE.

The conductive pattern CP may be connected to the first impurity region SD1. For example, the bit line BL may be electrically connected through the conductive pattern CP to the first impurity region SD1. The second mask patterns MP2 and the target patterns TP covering the second impurity regions SD2 may separate the conductive pattern CP from the second impurity regions SD2.

Figure 13A:
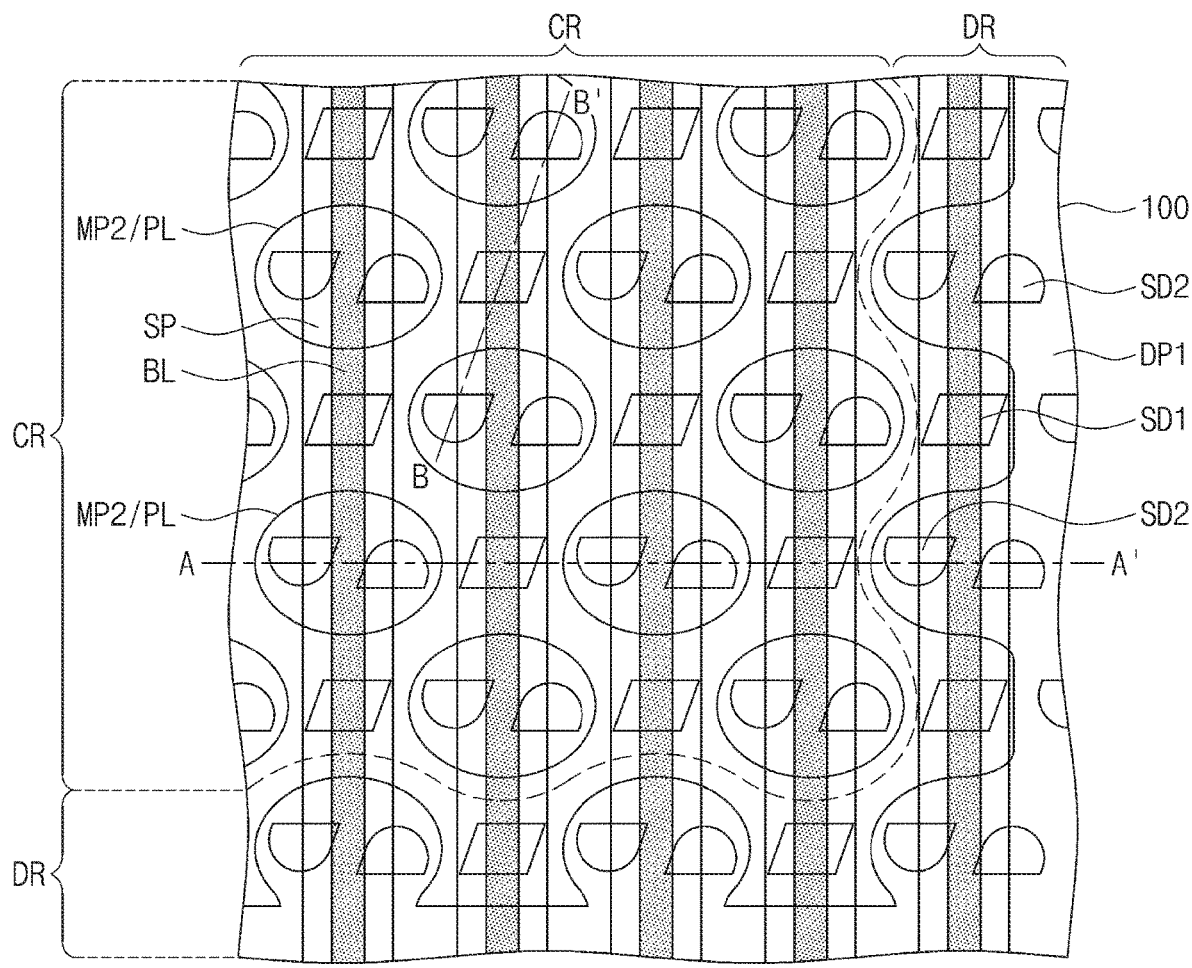
Figure 13A:
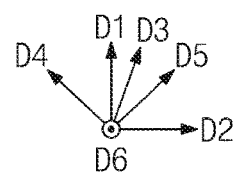
Figure 13B:
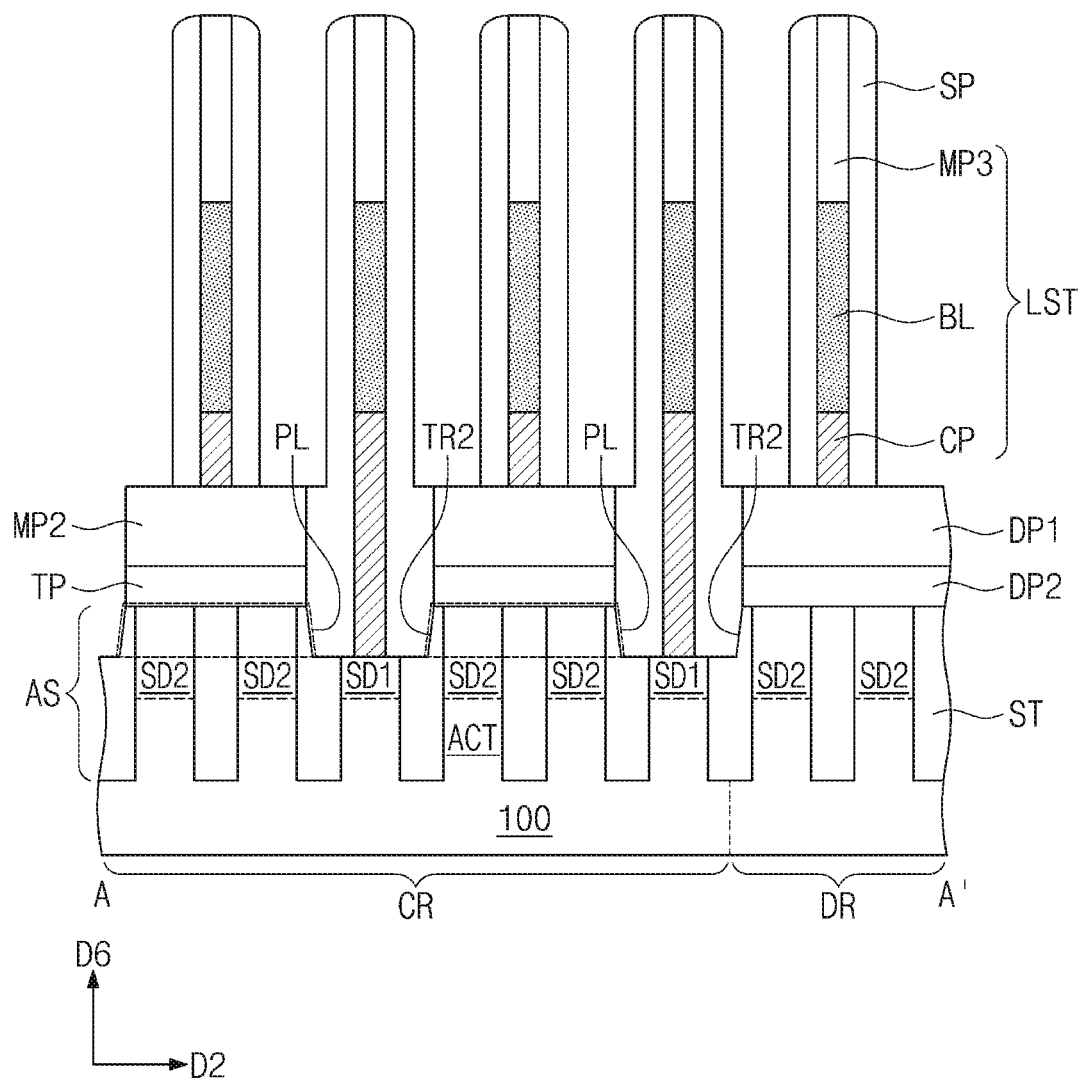
Figure 13C:
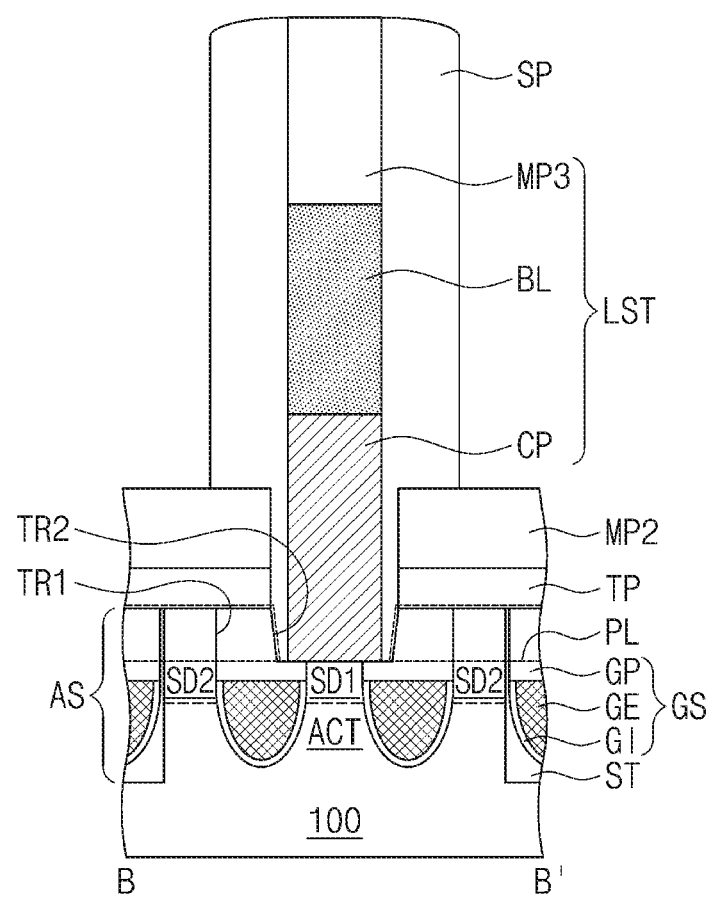

Referring to FIGS. 13A, 13B, and 13C, spacers SP may be formed to cover opposite sidewalls of each of the line structures LST. The second trench TR2 may be filled with portions of the spacers SP. The formation of the spacers SP may include conformally forming a spacer layer on the entire surface of the substrate 100 and anisotropically etching the spacer layer. The spacer layer may include one or more of a silicon oxide layer, a silicon nitride layer, and a silicon oxynitride layer.

Figure 14A:
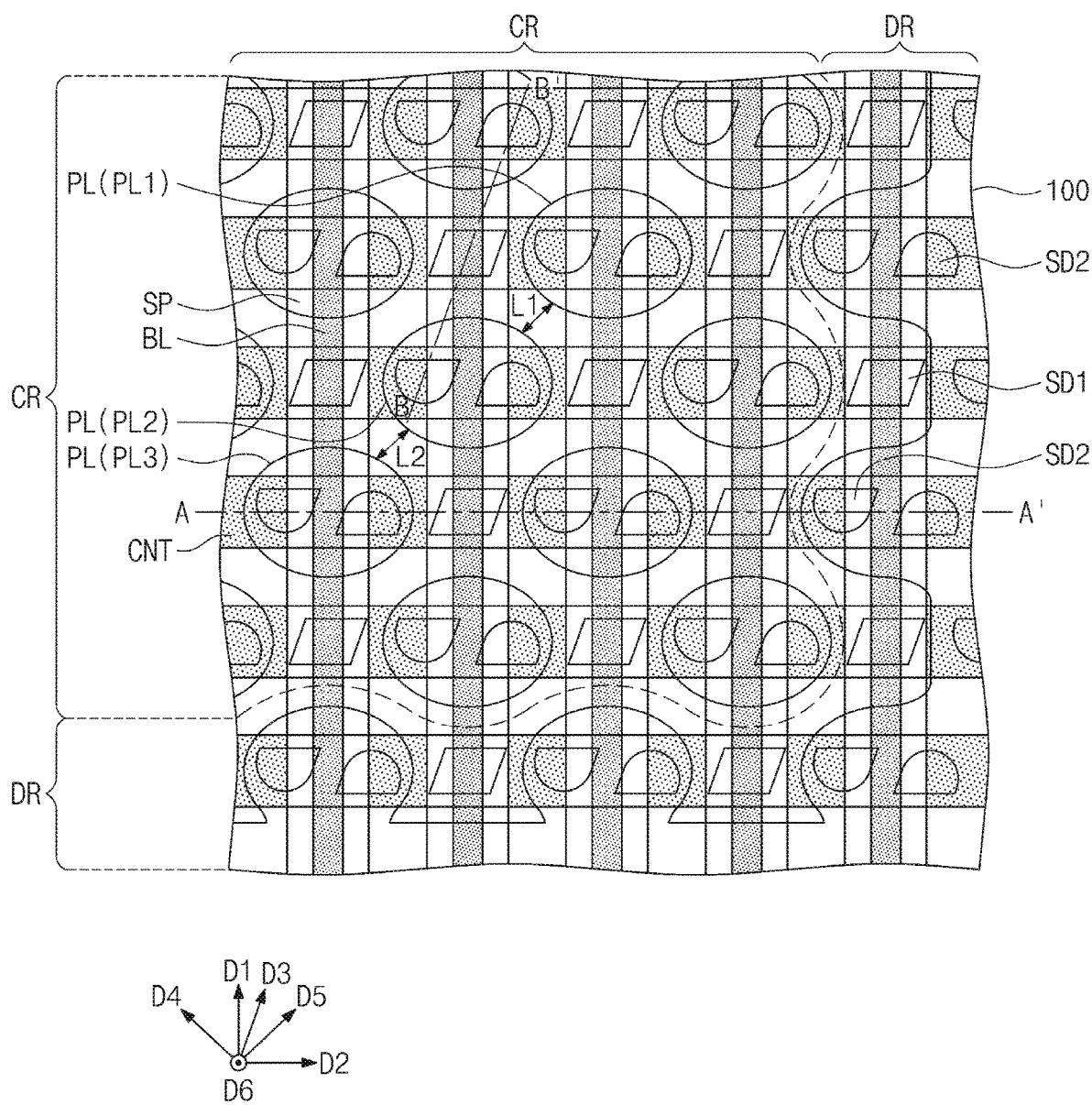
Figure 14B:
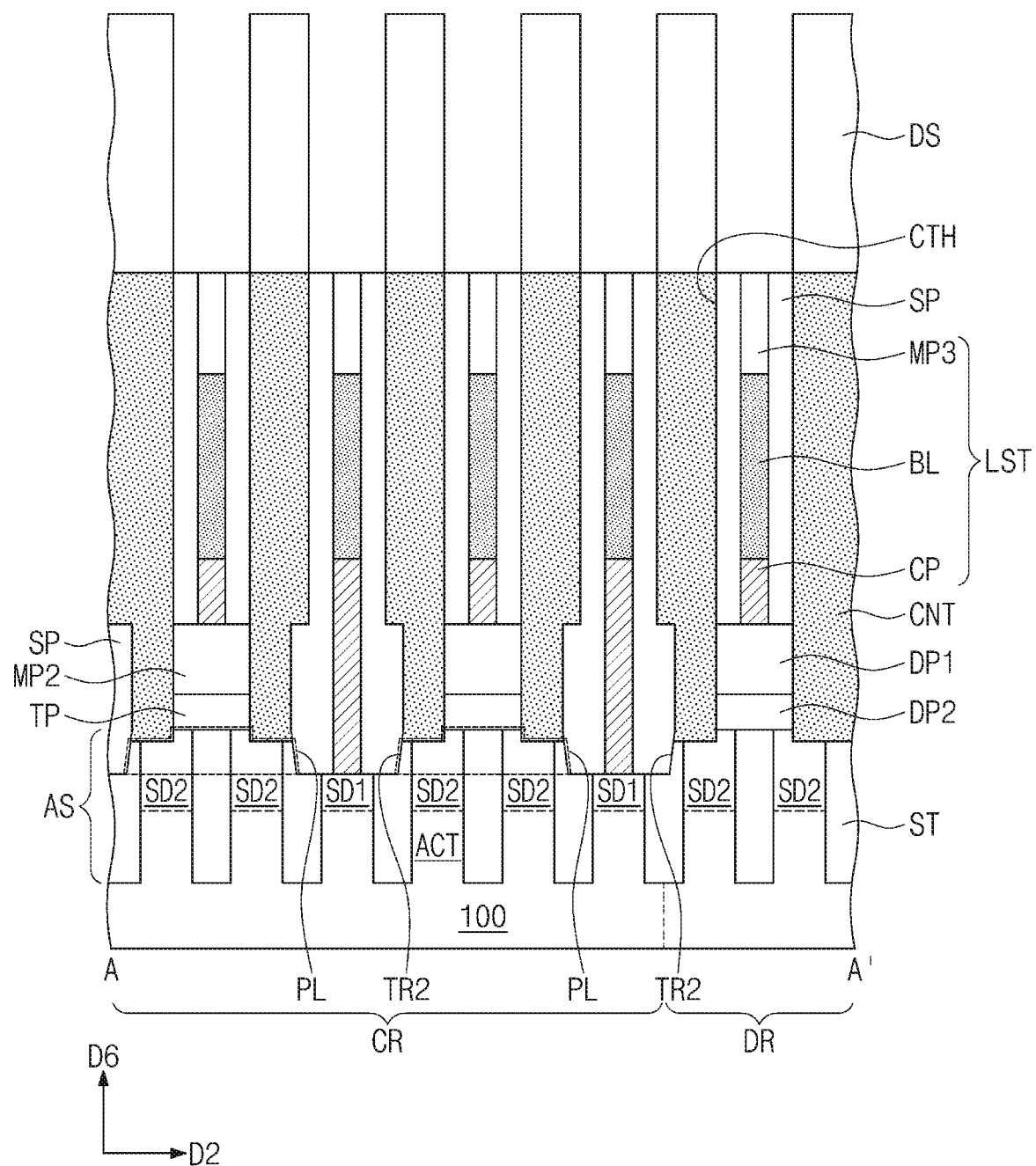
Figure 14C:
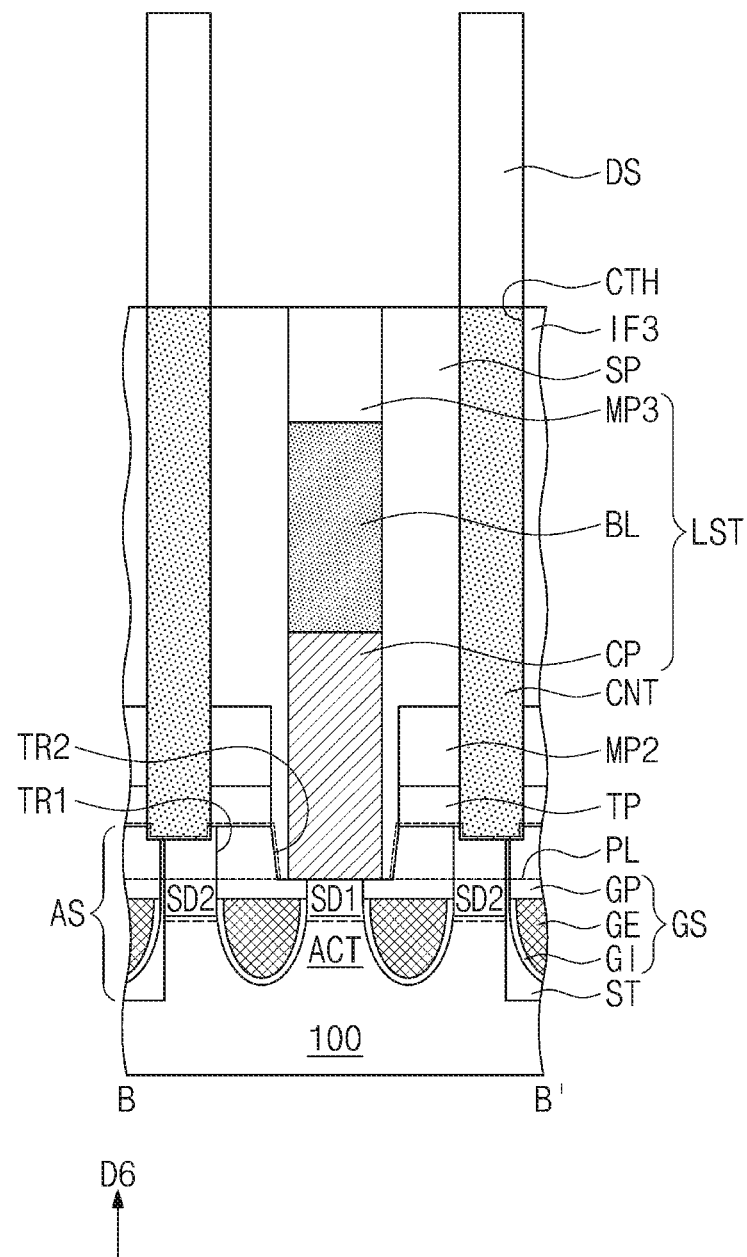

Referring to FIGS. 14A, 14B, and 14C, a third dielectric film IF3 may be formed on the entire surface of the substrate 100. The third dielectric film IF3 may include a silicon oxide layer. A planarization process may be performed to remove an upper portion of the third dielectric film IF3 and upper portions of the third mask patterns MP3.

A patterning process may be performed on the third dielectric film IF3, the second mask patterns MP2, and the target patterns TP, and thus contact holes CTH may be formed. Alternatively, the contact holes CTH may be formed by a patterning process performed on the third dielectric film IF3, the first dummy pattern DP1, and the second dummy pattern DP2. Since the third mask patterns MP3 and the spacers SP are used as an etching mask during the patterning process, the contact holes CTH may be formed in a self-alignment manner.

The contact holes CTH may be filled with a conductive material to form contacts CNT. The conductive material may include one or more of conductive metal nitride (e.g., titanium nitride or tantalum nitride) and metal (e.g., titanium, tantalum, tungsten, copper, or aluminum). The contacts CNT may penetrate the second mask pattern MP2 and the target pattern TP and may be electrically connected to the second impurity regions SD2. The spacers SP may separate the contacts CNT from the bit lines BL.

A data storage element DS may be formed on each of the contacts CNT. The data storage element DS may be a memory element that uses one of a capacitor, a magnetic tunnel junction pattern, and a variable resistance body including a phase change material. For example, the data storage element DS may be a capacitor.

The following describes a semiconductor device according to example embodiments of inventive concepts with reference back to FIGS. 14A, 14B, and 14C.

A substrate 100 may be provided thereon with a device isolation layer ST defining active patterns ACT. Each of the active patterns ACT may extend in a third direction D3. The active patterns ACT may be spaced apart from each other in the third direction D3. The active patterns ACT may be two-dimensionally arranged.

The device isolation layer ST may fill between the active patterns ACT.

Each of the active patterns ACT may include a first impurity region SD1 and a pair of second impurity regions SD2. The first impurity region SD1 may be placed between the pair of second impurity regions SD2. The first and second impurity regions SD1 and SD2 may have the same conductive type (e.g., N-type).

First trenches TR1 may be defined on the active patterns ACT and the device isolation layer ST. Each of the first trenches TR1 may be defined between the first impurity region SD1 and the second impurity region SD2. The first trench TR1 may downwardly extend from a top surface of the active pattern ACT toward a bottom surface of the substrate 100.

Gate electrodes GE may be provided to run across the active patterns ACT and the device isolation layer ST. The gate electrodes GE may be provided in the first trenches TR1. The gate electrodes GE may extend in parallel to each other in a second direction D2. The gate electrode GE may have a top surface lower than that of the active pattern ACT (e.g., a top surface of the first impurity region SD1 or the second impurity region SD2).

A gate dielectric layer GI may be interposed between the gate electrode GE and the active pattern ACT. A gate capping layer GP may be provided on the gate electrode GE. The gate capping layer GP may cover the top surface of the gate electrode GE. The gate capping layer GP may have a top surface coplanar with that of the active pattern ACT. The gate electrode GE, the gate dielectric layer GI, and the gate capping layer GP may constitute or form a gate structure GS.

The active patterns ACT, the gate structures GS, and the device isolation layer ST may constitute or form an active structure AS. A second trench TR2 may be defined on the active structure AS. The second trench TR2 may downwardly extend from a top surface of the active structure AS toward the bottom surface of the substrate 100. The second trench TR2 may define pillars PL in an upper portion of the active structure AS. Each of the pillars PL may have an island shape that vertically protrudes from a floor surface of the second trench TR2. Each of the pillars PL may include an upper portion of the second impurity region SD2. Each of the pillars PL may be provided on a cell region CR of the substrate 100.

When viewed in plan, any two neighboring ones of the pillars PL may be spaced apart at a constant minimum distance. For example, a minimum distance L1 between a first pillar PL1 and a second pillar PL2 adjacent to each other in a fifth direction D5 may be substantially the same as a minimum distance L2 between the second pillar PL2 and a third pillar PL3 adjacent to each other in the fifth direction D5.

Target patterns TP and second mask patterns MP2 may be sequentially provided on the cell region CR of the substrate 100. The target patterns TP may vertically overlap the second mask patterns MP2.

A second dummy pattern DP2 and a first dummy pattern DP1 may be sequentially provided on a dummy region DR of the substrate 100. The first dummy pattern DP1 may vertically overlap the second dummy pattern DP2.

The active structure AS may be provided thereon with line structures LST extending in a first direction D1. The line structures LST may be spaced apart from each other in the second direction D2. When viewed in plan, the line structures LST may intersect the gate electrodes GE. Spacers SP may be provided on opposite sidewalls of each of the line structures LST. The second trench TR2 may be filled with portions of the spacers SP.

Each of the line structures LST may include a conductive pattern CP, a bit line BL, and a third mask pattern MP3 that are sequentially stacked. The bit line BL may be electrically connected through the conductive pattern CP to the first impurity region SD1.

Third dielectric films IF3 may be provided on the active structure AS. Each of the third dielectric films IF3 may be provided between the spacers SP. Contacts CNT may be provided to come into connection with the second impurity region SD2. Each of the contacts CNT may be provided between the third dielectric films IF3. The spacers SP may separate the contacts CNT from the bit lines BL. A data storage element DS may be provided on each of the contacts CNT. For example, the data storage element DS may be a capacitor.

Figure 15A:
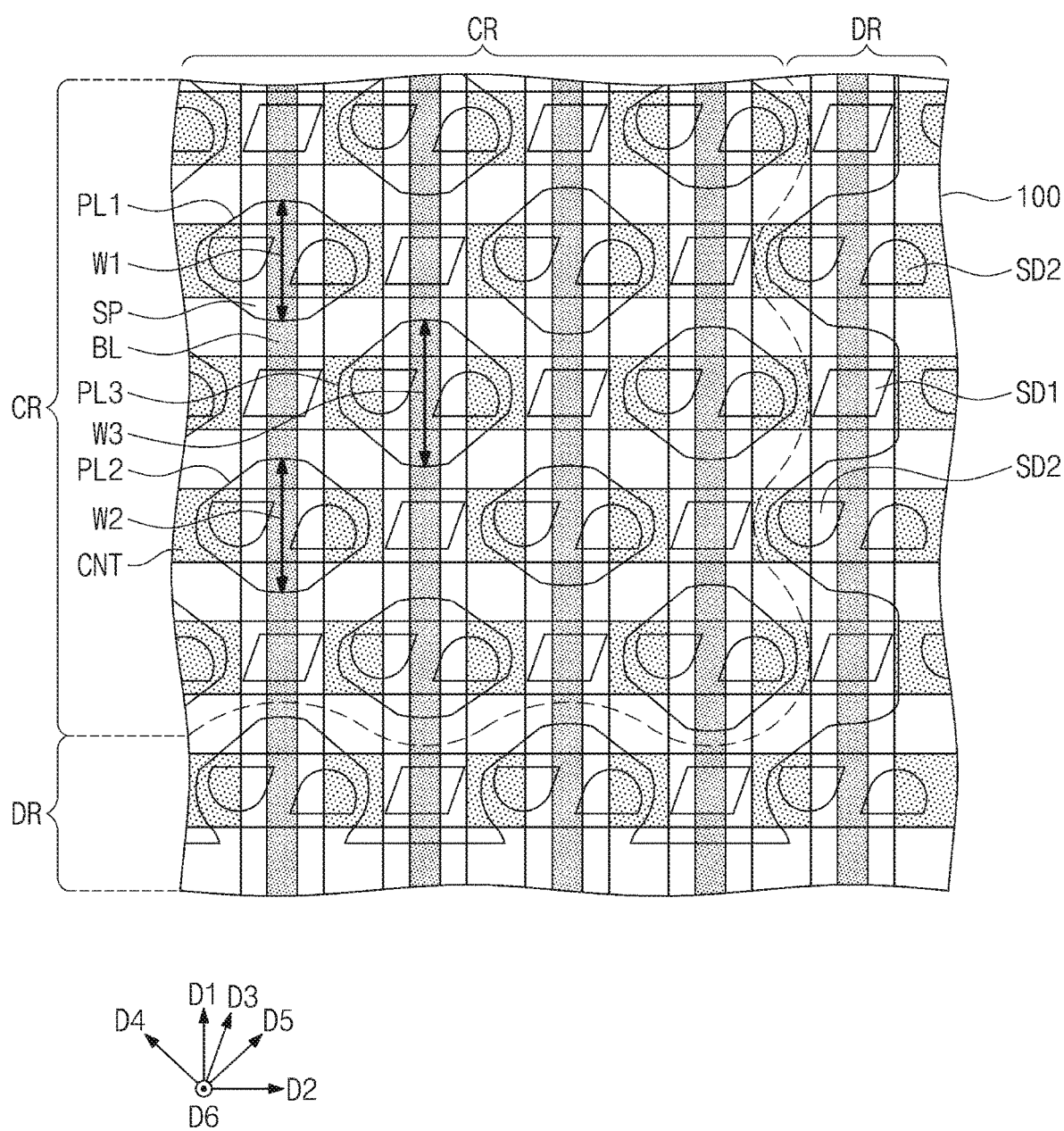
FIGS. 15A and 15B illustrate plan views showing a semiconductor device according to example embodiments of inventive concepts.
Figure 15B:
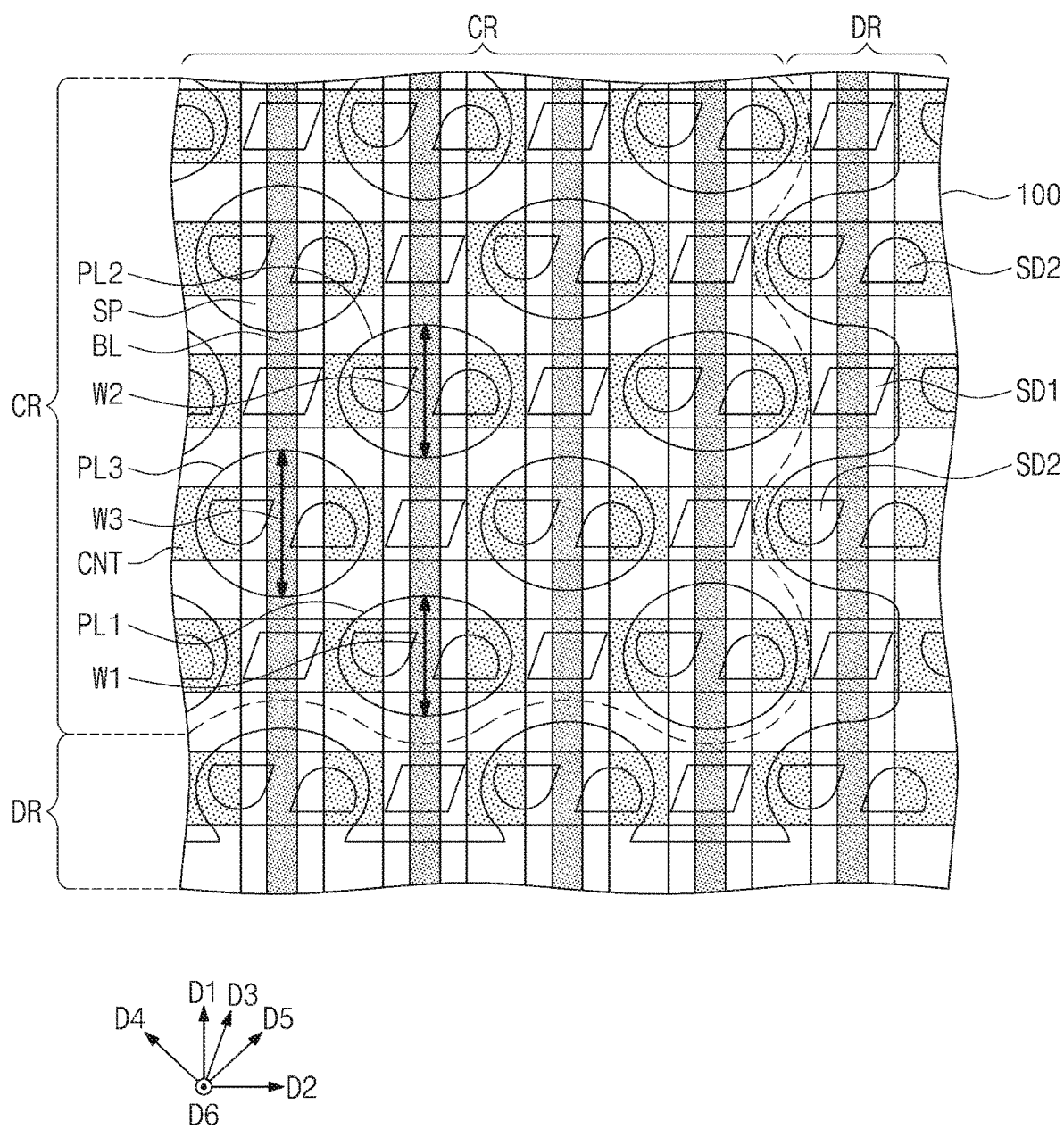

FIGS. 15A and 15B illustrate plan views showing a semiconductor device according to example embodiments of inventive concepts.

For brevity of description, components substantially the same as those discussed with reference to FIGS. 1A to 14C are allocated the same reference numerals thereto, and a repetitive explanation thereof will be omitted.

Referring to FIG. 15A, when viewed in plan, each of pillars PL1, PL2, and PL3 may have a rhombic shape. The pillars PL1, PL2, and PL3 may include a first pillar PL1, a second pillar PL2, and a third pillar PL3. The first, second, and third pillars PL1, PL2, and PL3 may have the same maximum width in the second direction D2. The first pillar PL1 may have a first width W1 indicating a maximum width in the first direction D1. The second pillar PL2 may have a second width W2 indicating a maximum width in the first direction D1. The third pillar PL3 may have a third width W3 indicating a maximum width in the first direction D1. The second width W2 may be greater than the first width W1. The third width W3 may be greater than the second width W2.

Referring to FIG. 15B, when viewed in plan, each of pillars PL1, PL2, and PL3 may have an elliptical shape. The pillars PL1, PL2, and PL3 may include a first pillar PL1, a second pillar PL2, and a third pillar PL3. The first, second, and third pillars PL1, PL2, and PL3 may have the same maximum width in the second direction D2. The first pillar PL1 may have a first width W1 indicating a maximum width in the first direction D1. The second pillar PL2 may have a second width W2 indicating a maximum width in the first direction D1. The third pillar PL3 may have a third width W3 indicating a maximum width in the first direction D1. The second width W2 may be greater than the first width W1. The third width W3 may be greater than the second width W2.

FIGS. 16A to 21A illustrate plan views showing a method of manufacturing a semiconductor device according to example embodiments of inventive concepts. FIGS. 16B to 21B illustrate cross-sectional views taken along line A-A' of FIGS. 16A to 21A, respectively. FIGS. 16C to 21C illustrate cross-sectional views taken along line B-B' of FIGS. 16A to 21A, respectively.

For brevity of description, components substantially the same as those discussed with reference to FIGS. 1A to 14C are allocated the same reference numerals thereto, and a repetitive explanation thereof will be omitted.

Figure 16A:
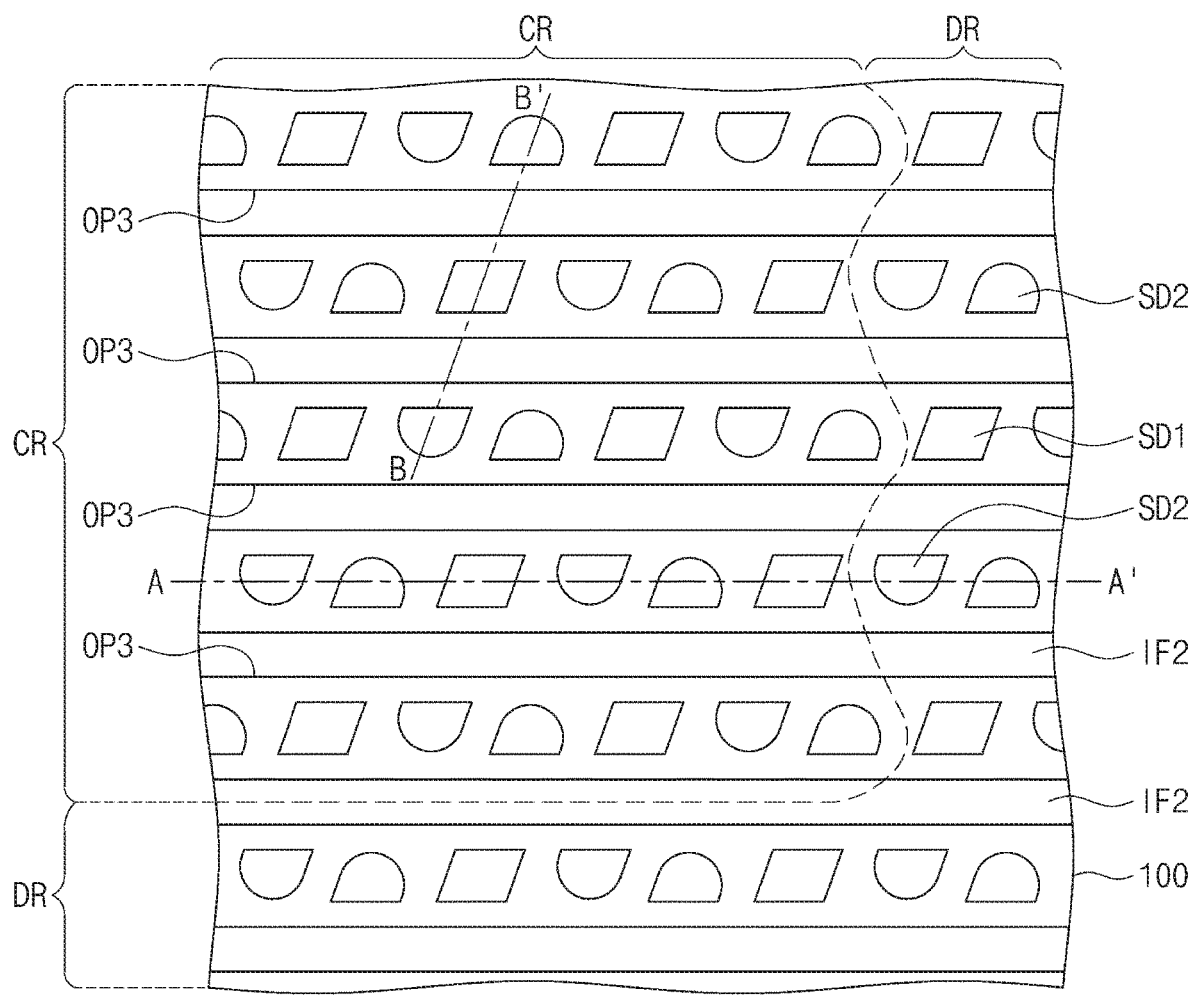
Figure 16A:
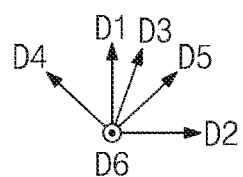
Figure 16B:
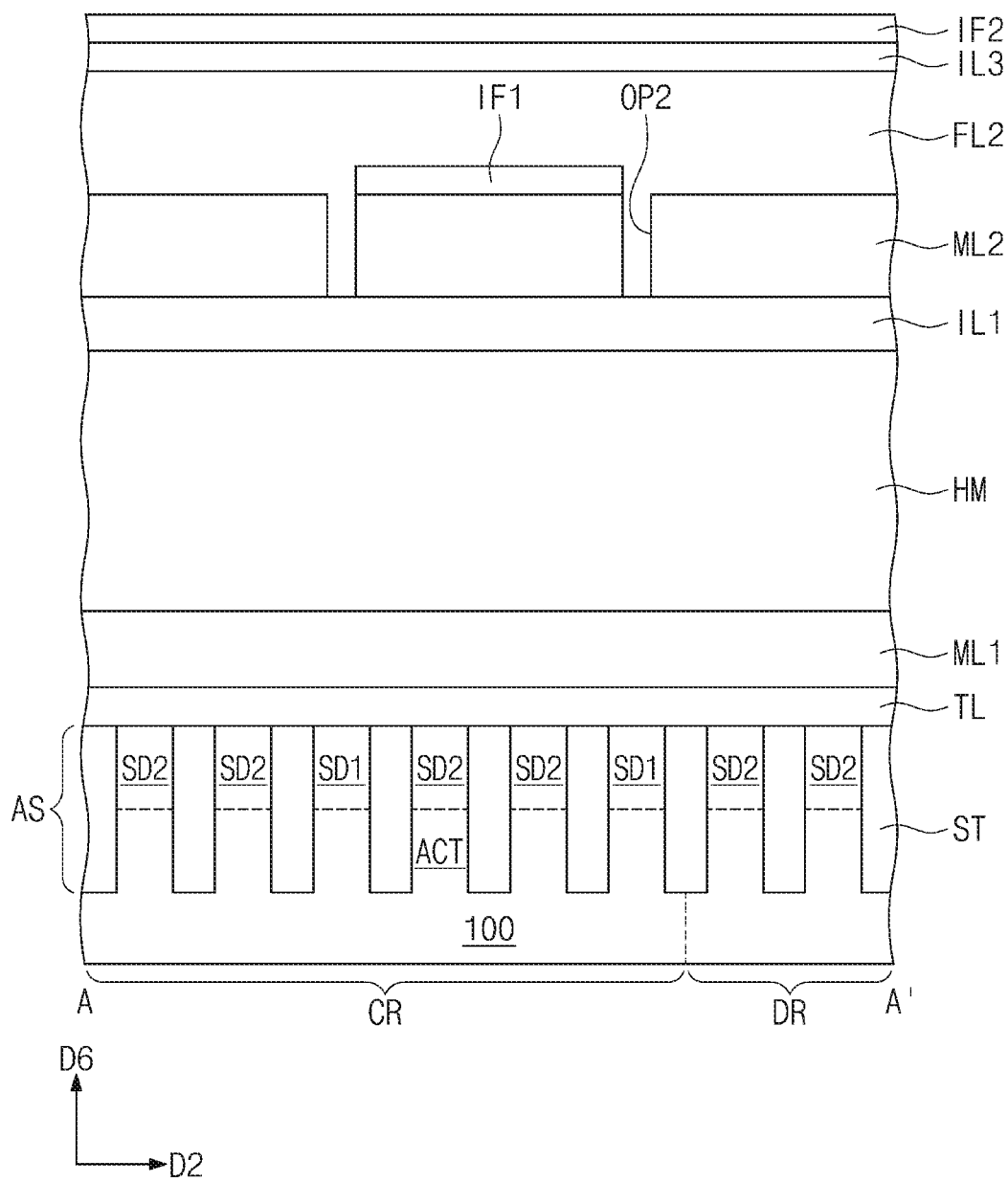
Figure 16C:
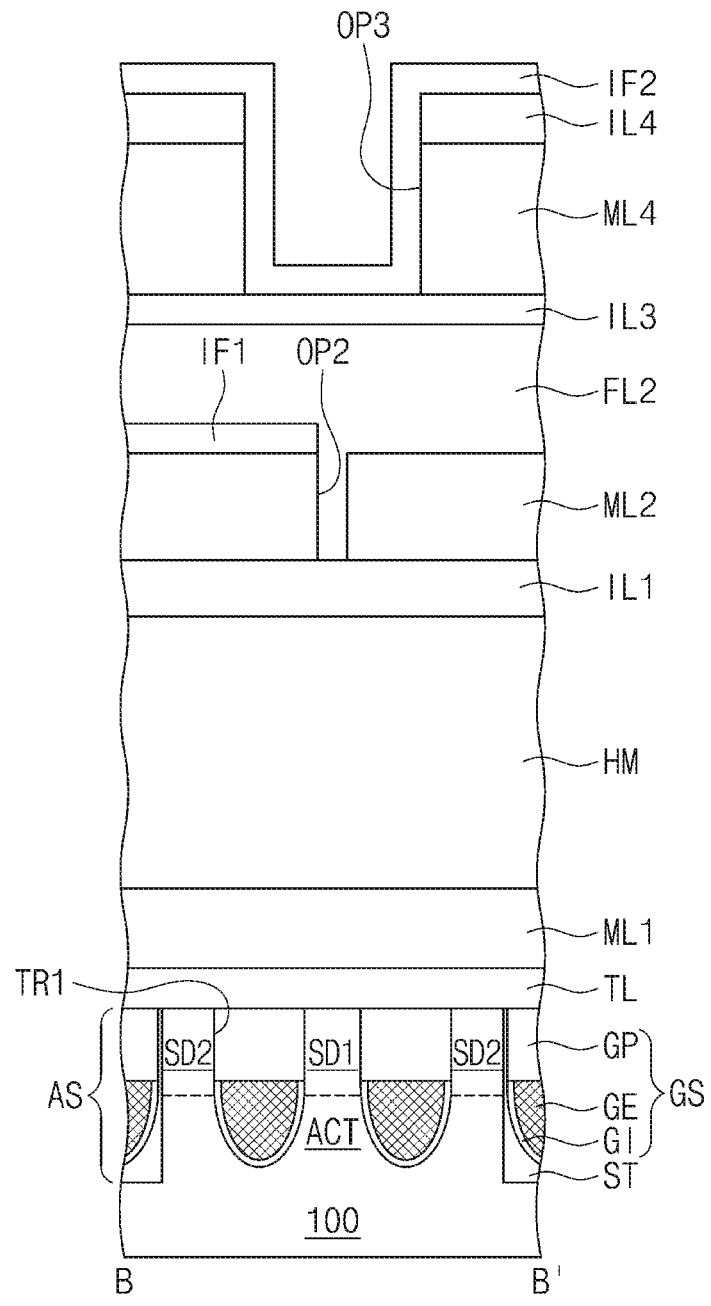
Figure 16C:
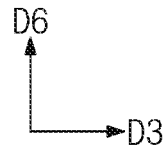

Referring to FIGS. 16A, 16B, and 16C, identically to those discussed with reference to FIGS. 1A to 5C, there may be formed an active structure AS, a target layer TL, a first mask layer ML1, a hardmask layer HM, a first insulating layer IL1, a second mask layer ML2, a first dielectric film IF1, and second openings OP2.

A second filling layer FL2 may be formed on an entire surface of the substrate 100. The second filling layer FL2 may fill the second openings OP2. The second filling layer FL2 may include a spin-on-hardmask (SOH) layer.

A third insulating layer IL3, a fourth mask layer ML4, and a fourth insulating layer IL4 may be sequentially formed on the second filling layer FL2. The third insulating layer IL3 may include a silicon oxide layer. The fourth mask layer ML4 may include a spin-on-hardmask (SOH) layer. The fourth insulating layer IL4 may include one or more of a silicon nitride layer and a silicon oxynitride layer.

The fourth mask layer ML4 and the fourth insulating layer IL4 may be patterned to form third openings OP3. The third openings OP3 may extend in a second direction D2. For example, the third openings OP3 may extend in a direction parallel to gate electrodes GE.

The formation of the third openings OP3 may include forming a second photoresist layer on the fourth insulating layer IL4, using a second photomask to pattern the second photoresist layer, and using the patterned second photoresist layer as an etching mask to pattern the fourth mask layer ML4 and the fourth insulating layer IL4.

A second dielectric film IF2 may be conformally formed on the entire surface of the substrate 100. The second dielectric film IF2 may include a silicon oxide layer. The second dielectric film IF2 may be formed by atomic layer deposition (ALD).

Figure 17A:
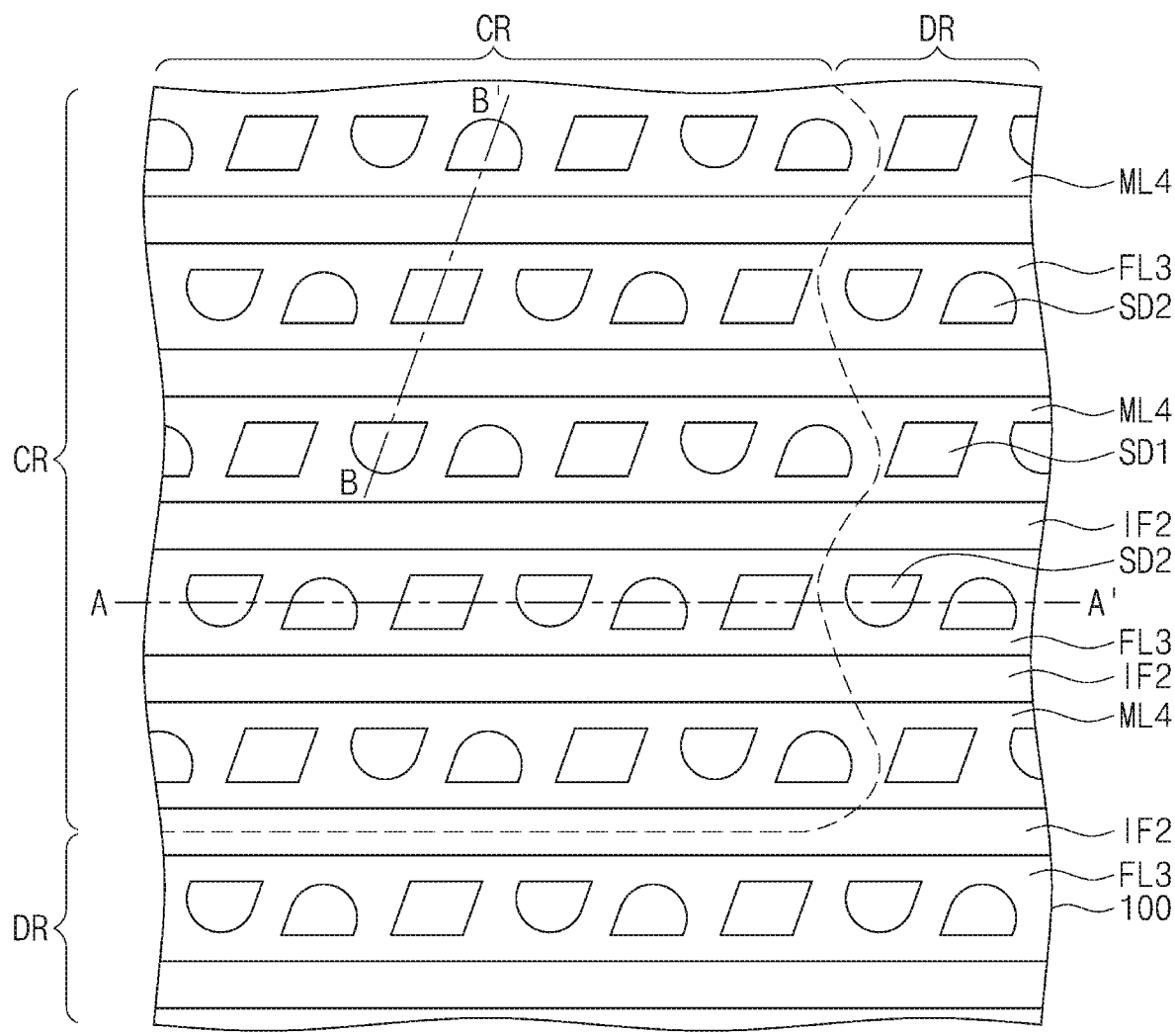
Figure 17B:
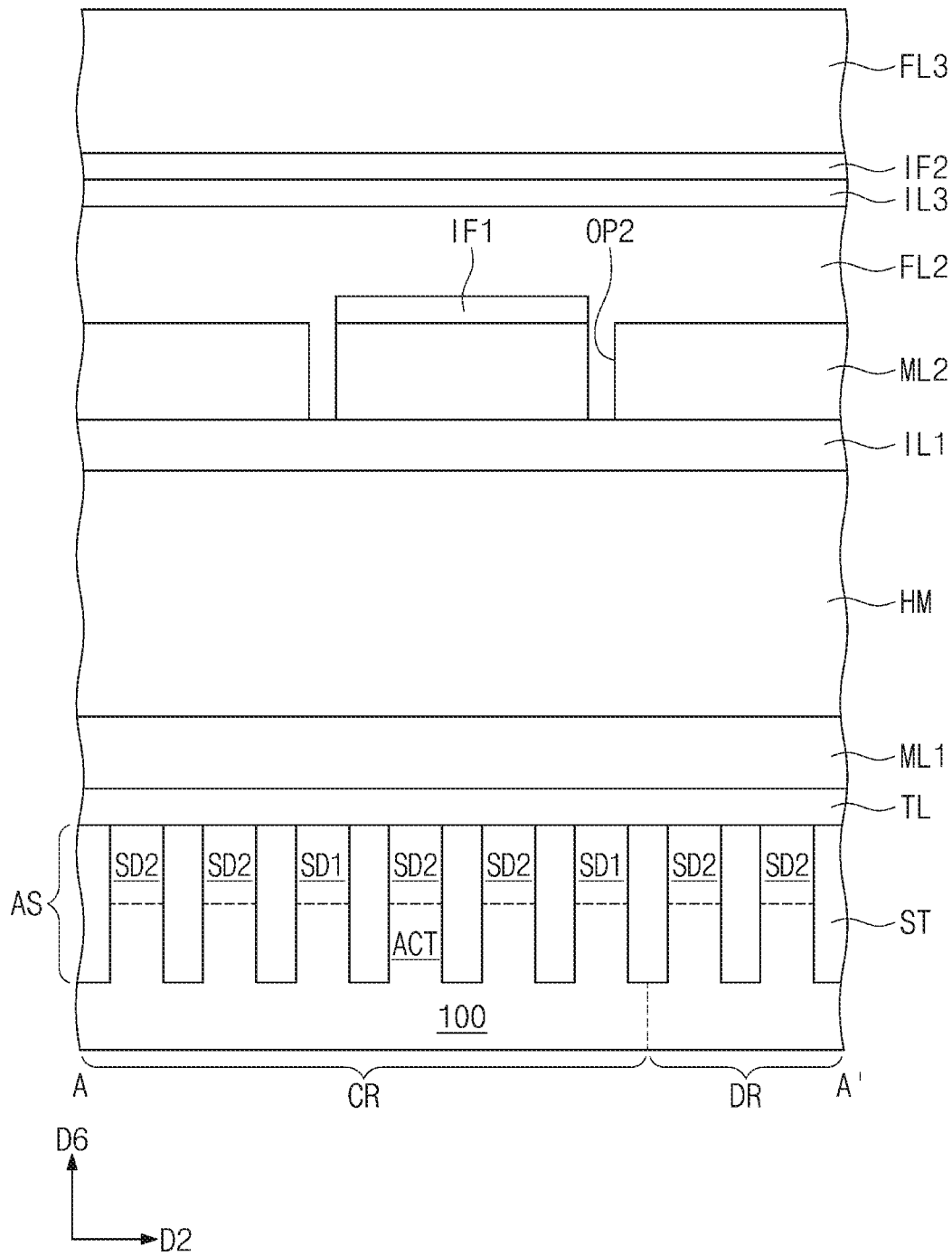
Figure 17C:
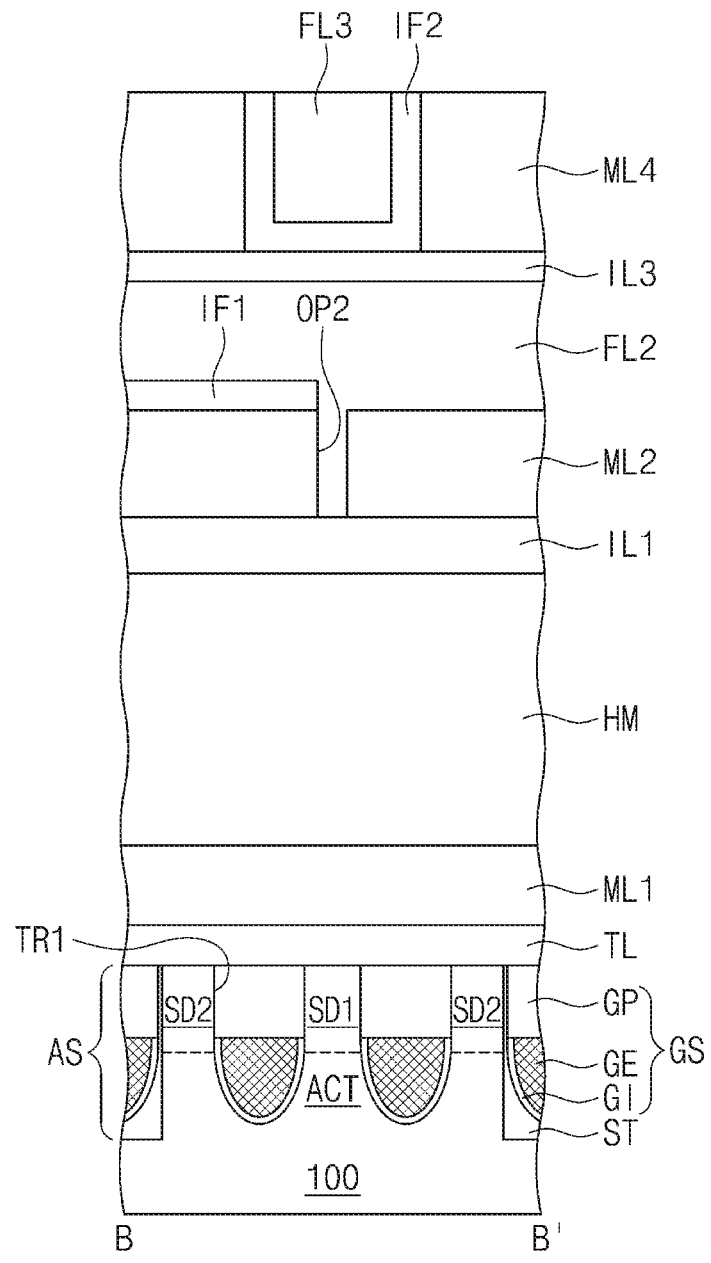

Referring to FIGS. 17A, 17B, and 17C, a third filling layer FL3 may be formed on the second dielectric film IF2. The third filling layer FL3 may fill the third openings OP3. The third filling layer FL3 may include a spin-on-hardmask (SOH) layer.

After the third filling layer FL3 is formed, a second etch-back process may be performed. The second etch-back process may be performed such that the fourth insulating layer IL4 is removed, the second dielectric film IF2 is removed on its portion on the fourth insulating layer IL4, and the third filling layer FL3 is removed on its portion on the fourth insulating layer IL4. Both remaining second dielectric film IF2 and third filling layer FL3 may selectively fill each of the third openings OP3. The both remaining second dielectric film IF2 and third filling layer FL3 may be provided in the fourth mask layer ML4. When viewed in plan, the fourth mask layer ML4, the second dielectric film IF2, and the third filling layer FL3 may be exposed on the entire surface of the substrate 100.

Figure 18A:
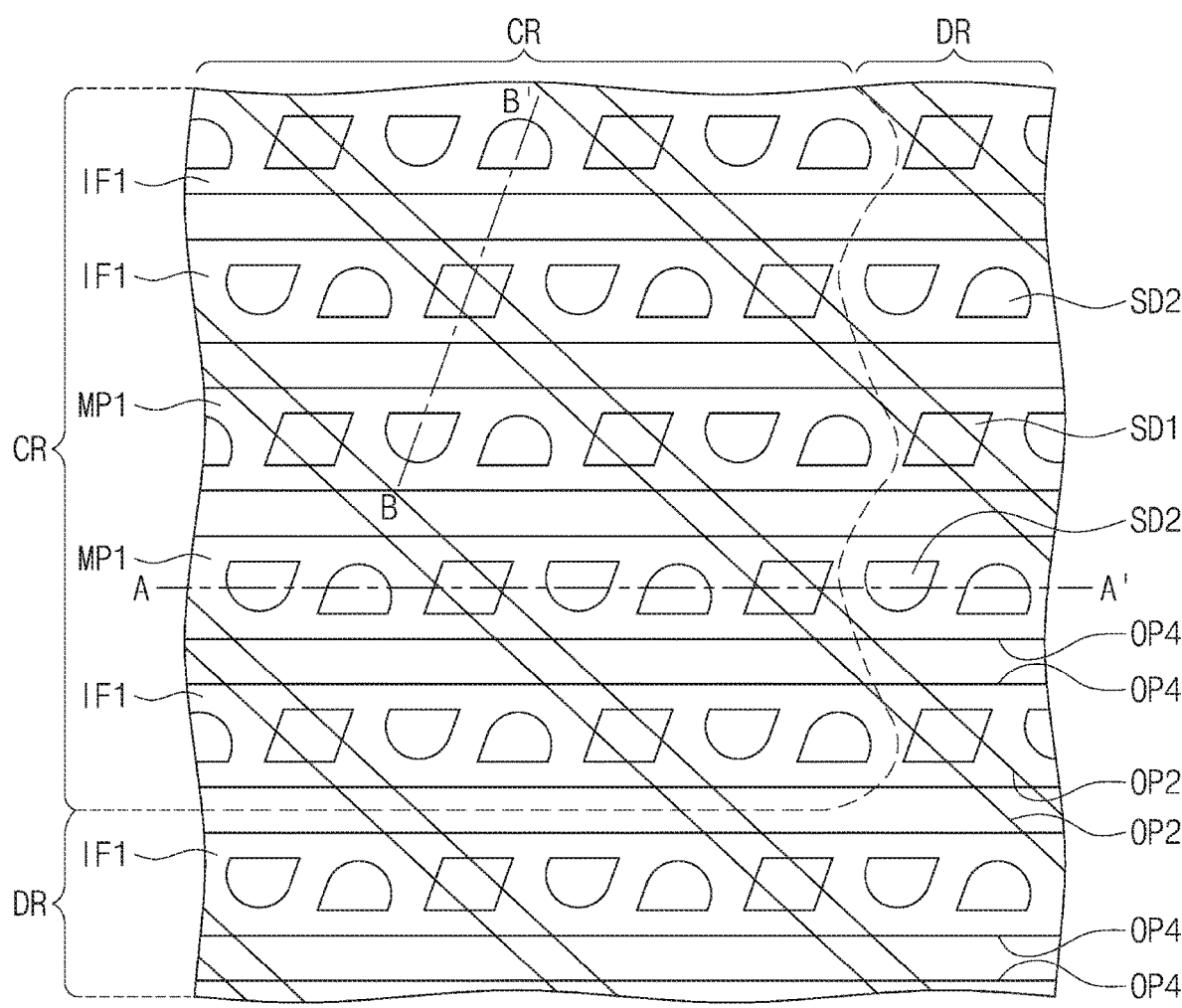
Figure 18B:
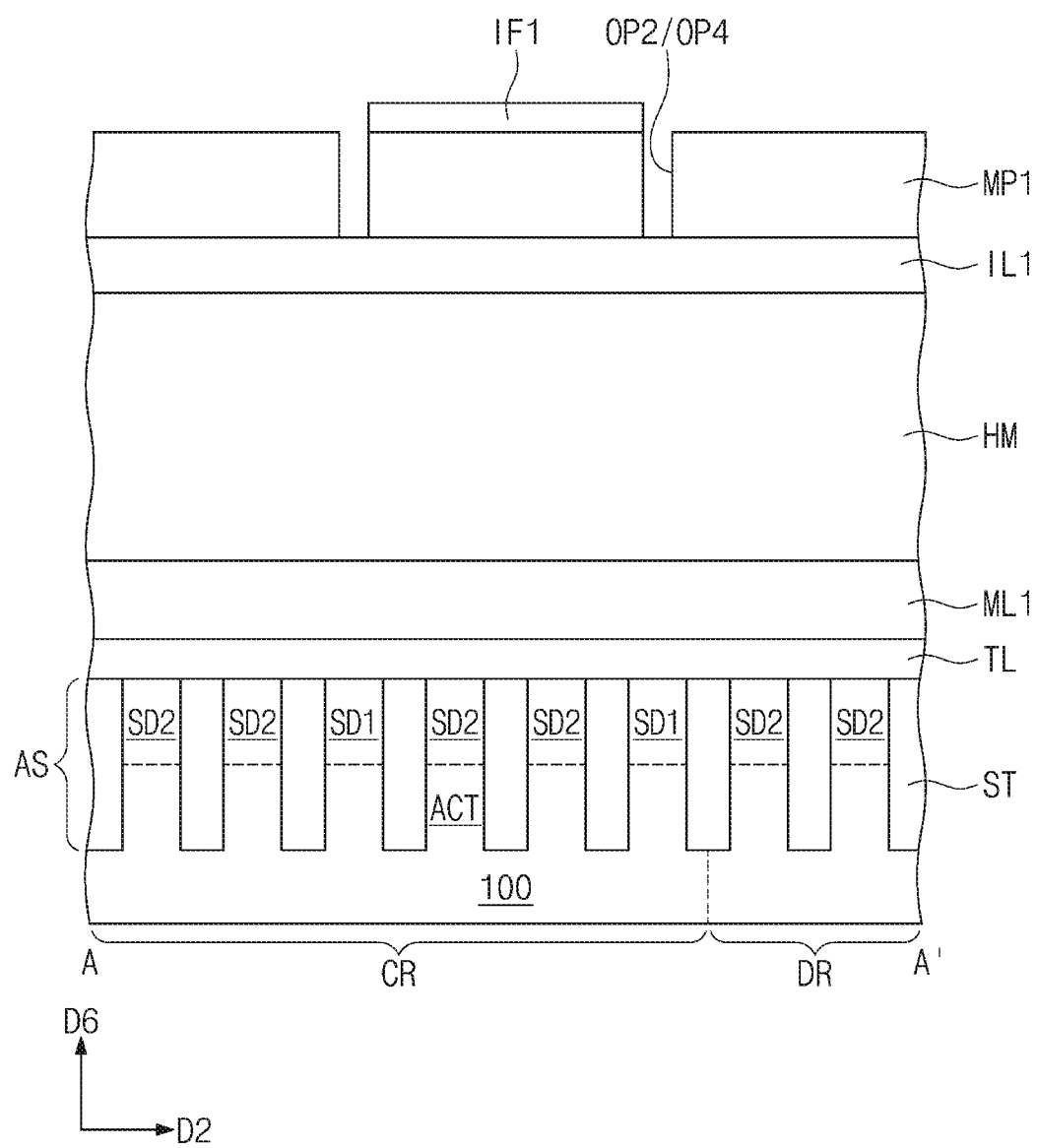
Figure 18C:
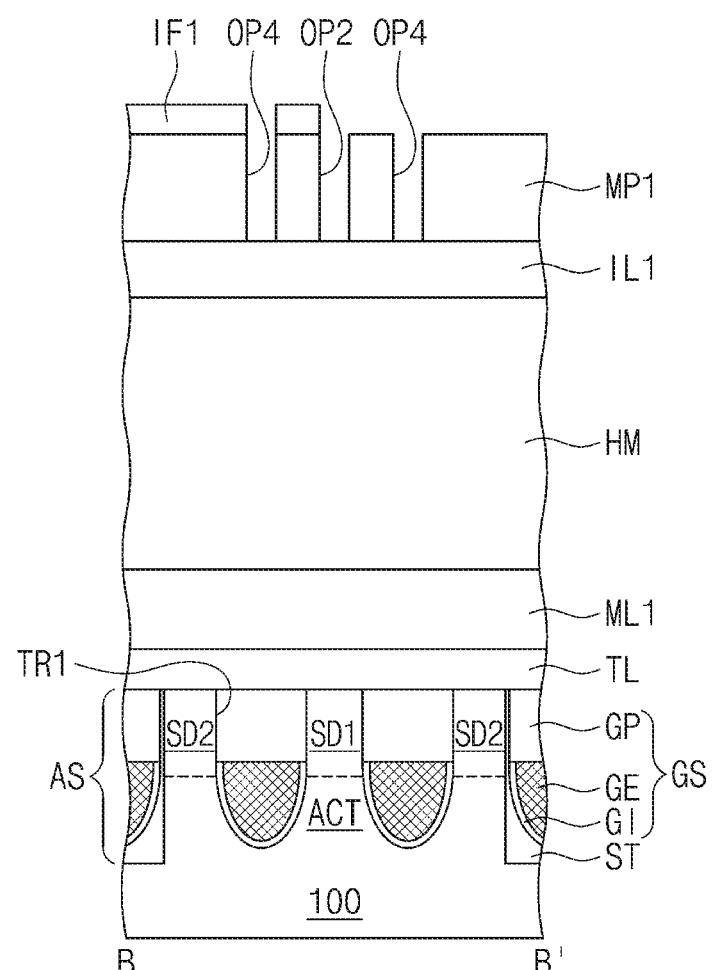

Referring to FIGS. 18A, 18B, and 18C, a second etching process may be performed to pattern the second mask layer ML2. The second etching process may include removing the second dielectric film IF2 between the fourth mask layer ML4 and the third filling layer FL3, and using the fourth mask layer ML4 and the third filling layer FL3 as an etching mask to pattern the third insulating layer IL3, the second filling layer FL2, and the second mask layer ML2. A removal process may be performed to remove the fourth mask layer ML4, the third filling layer FL3, the second dielectric film IF2, the third insulating layer IL3, and the second filing layer FL2 that remain after the second etching process.

The second etching process may form fourth openings OP4 in the second mask layer ML2. The fourth openings OP4 may extend in the second direction D2. The fourth opening OP4 may partially overlap the second openings OP2.

The second etching process may cause that the second mask layer ML2 is patterned to form first mask patterns MP1. When viewed in plan, each of the first mask patterns MP1 may have a parallelogram shape. Each of the first mask patterns MP1 may be defined by the second openings OP2 and the fourth openings OP4.

Figure 19A:
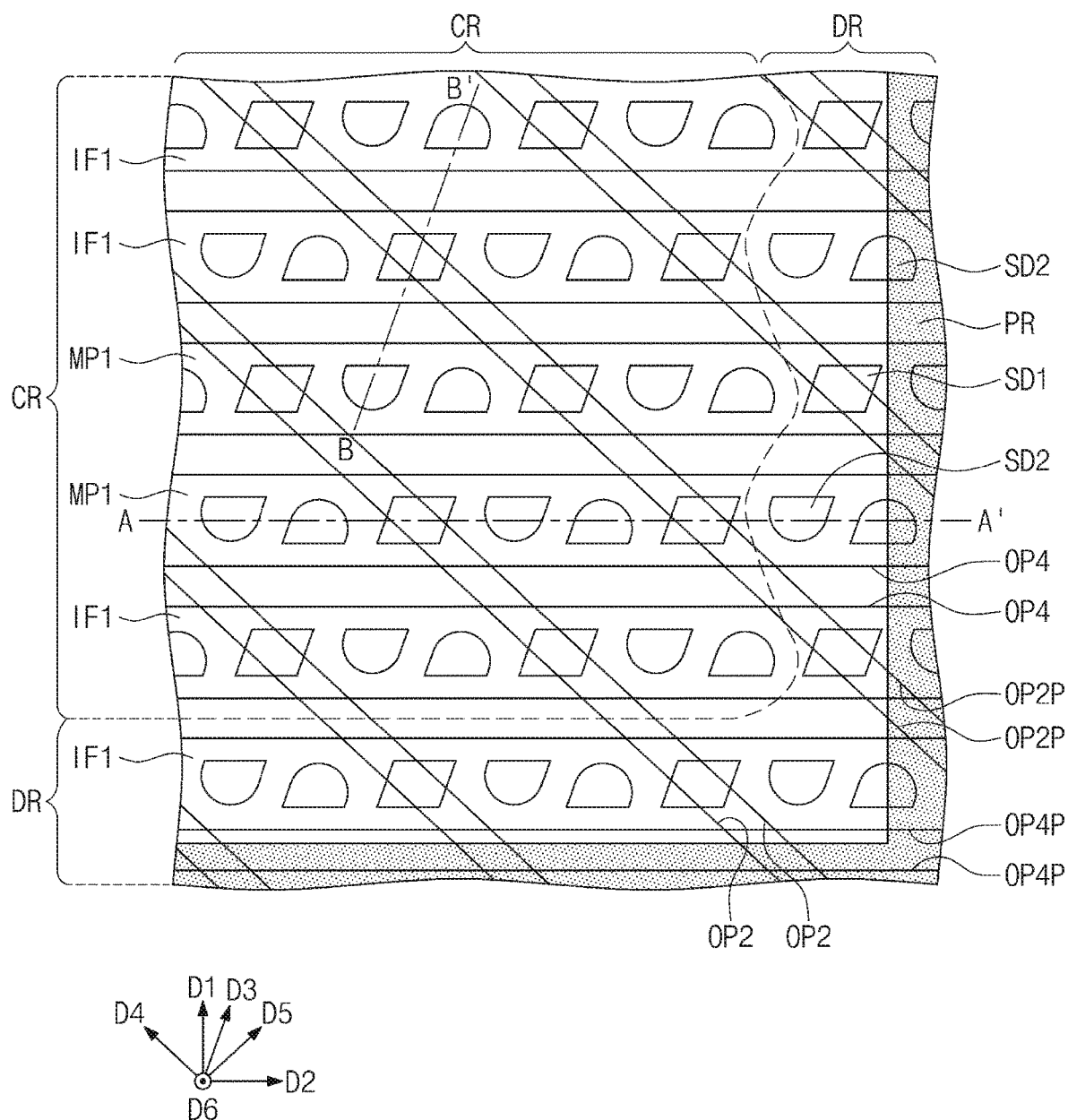
Figure 19B:
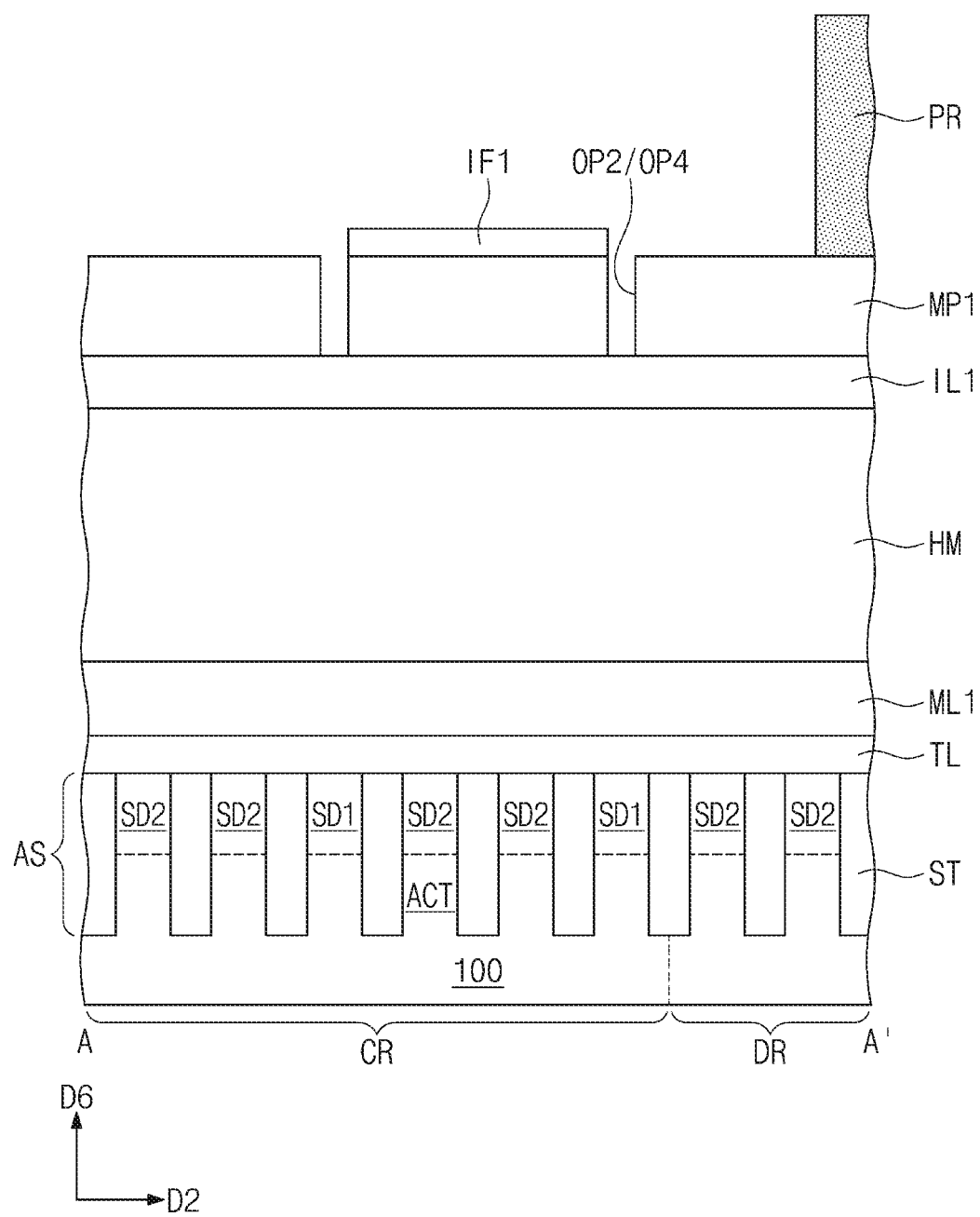
Figure 19C:
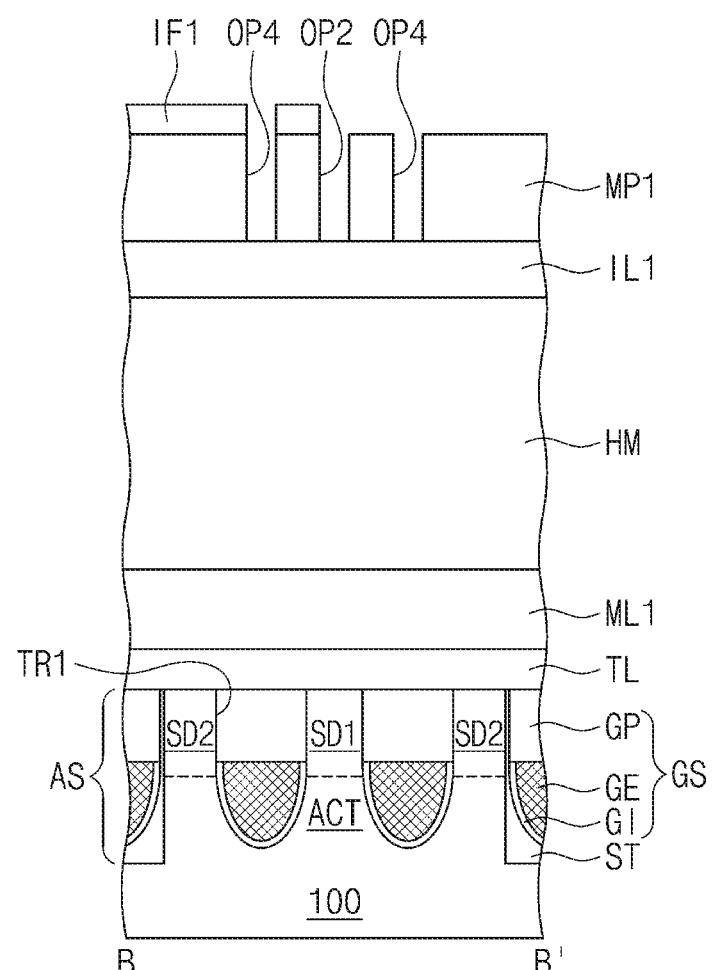

Referring to FIGS. 19A, 19B, and 19C, a photoresist pattern PR may be formed on a dummy region DR of the substrate 100. For example, the formation of the photoresist pattern PR may include forming a third photoresist layer on the entire surface of the substrate 100, and using a third photomask to pattern the third photoresist layer. The photoresist pattern PR may fill portions OP2P of the second openings OP2 on the dummy region DR of the substrate 100. The photoresist pattern PR may also fill portions OP4P of the fourth openings OP4 on the dummy region DR of the substrate 100. The photoresist pattern PR may mutually connect the first mask patterns MP1 on the dummy region DR.

Figure 20A:
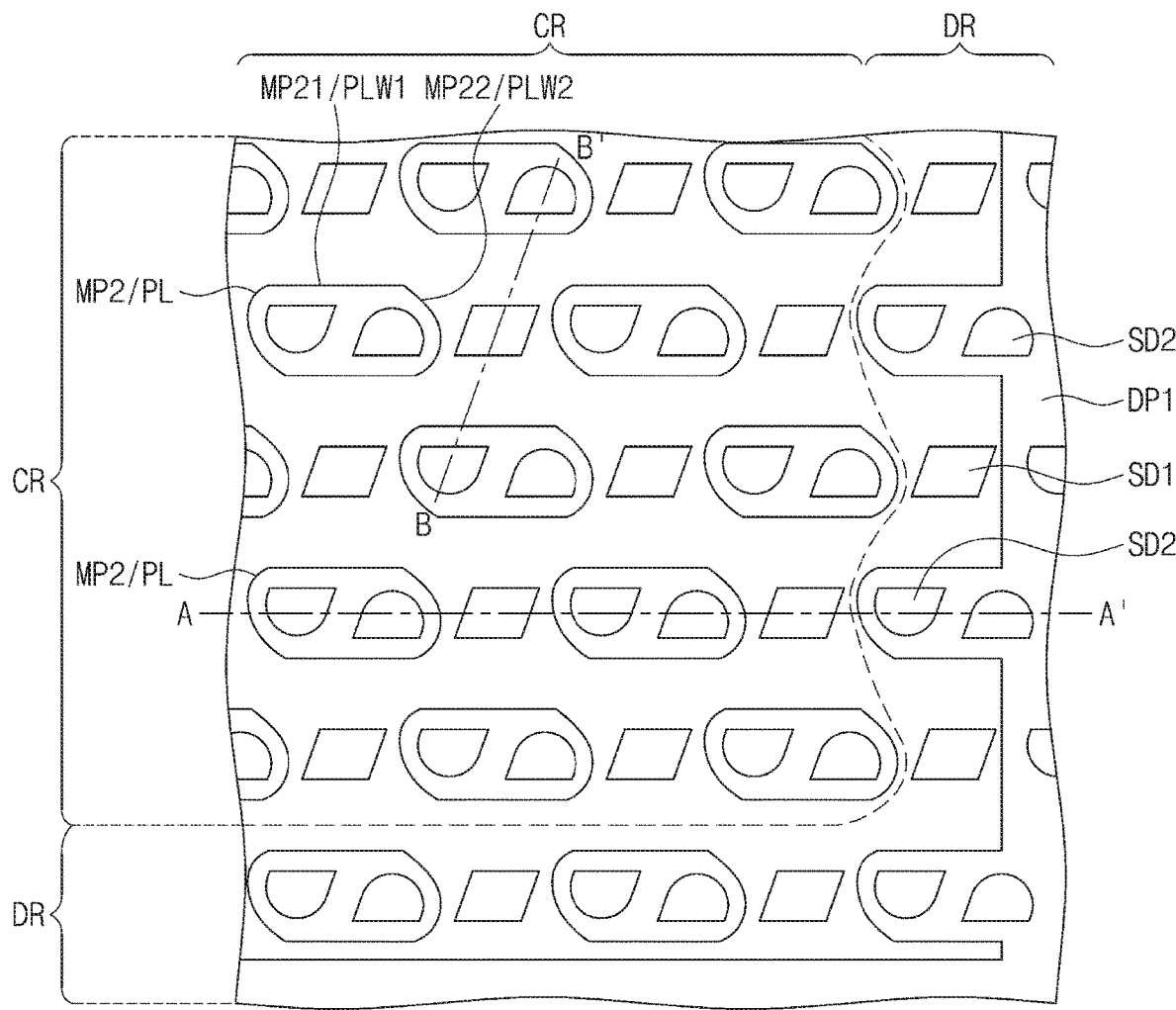
Figure 20B:
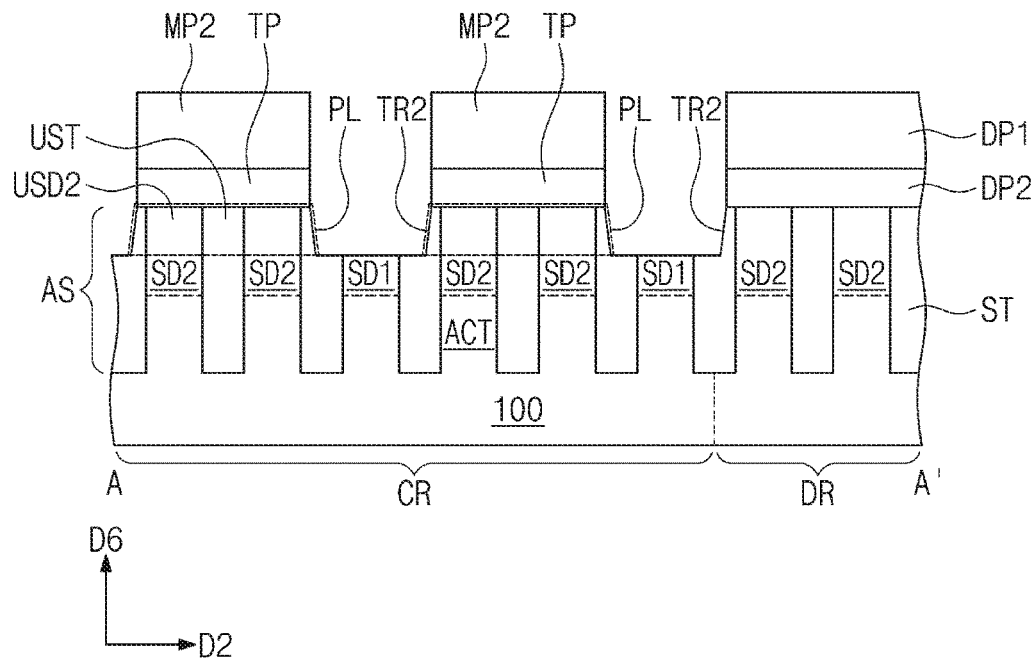
Figure 20C:
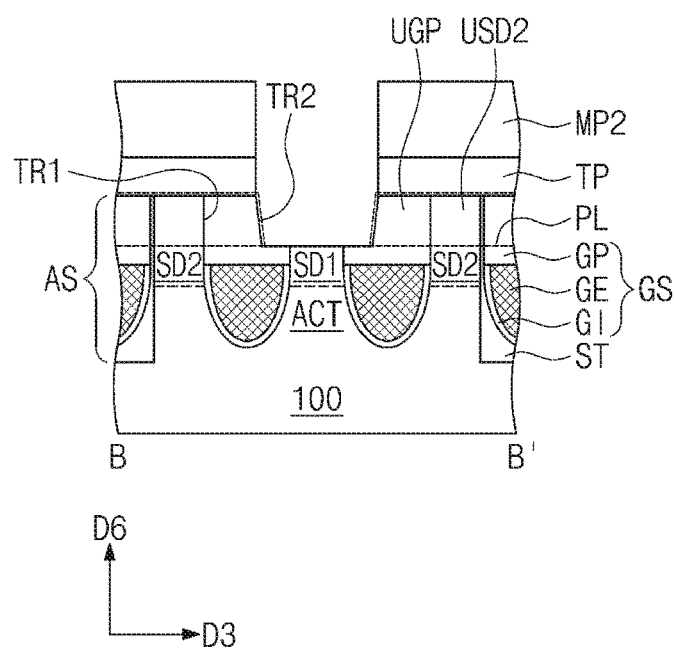

Referring to FIGS. 20A, 20B, and 20C, a third etching process may be performed to form a second trench TR2. The third etching process may include using the first mask patterns MP1 as an etching mask to pattern the first insulating layer IL1, using the patterned first insulating layer IL1 as an etching mask to pattern the hardmask layer HM, using the patterned hardmask layer HM as an etching mask to pattern the first mask layer ML1 and the target layer TL, and using the patterned first mask layer ML1 and patterned target layer TL as an etching mask to pattern the active structure AS. A removal process may be performed to remove the photoresist pattern PR, the first mask patterns MP1, the first dielectric film IF1, the first insulating layer IL1, and the hardmask layer HM that remain after the third etching process. The pattering of the first insulating layer IL1 using the first mask patterns MP1 as an etching mask may include that the second and fourth openings OP2 and OP4 are used to pattern the first insulating layer IL1.

The patterning of the first mask layer ML1 may form second mask patterns MP2 on a cell region CR of the substrate 100. Each of the second mask patterns MP2 may include first sidewalls MP21 extending in the second direction D2 and second sidewalls MP22 connecting the first sidewalls MP21 to each other. When viewed in plan, the second sidewalls MP22 may be curved. Although each of the first mask patterns MP1 has a parallelogram shape, pattern shapes of a plurality of layers may be changed while being sequentially etched during the third etching process. Finally, each of the second mask patterns MP2 may include the curved second sidewalls MP22. The second mask patterns MP2 may be spaced apart from each other in a fourth direction D4. The second mask patterns MP2 may be spaced apart from each other in the second direction D2. A single second mask pattern MP2 may vertically overlap two second impurity regions SD2 adjacent to each other in the second direction D2.

The patterning of the target layer TL may form target patterns TP on the cell region CR of the substrate 100. The target patterns TP may vertically overlap the second mask patterns MP2. For example, the target patterns TP and the second mask patterns MP2 may have the same planar shape and arrangement.

The patterning of the active structure AS may form pillars PL on the cell region CR of the substrate 100 and also form the second trench TR2 between the pillars PL. For example, the second trench TR2 may define the pillars PL of the active structure AS. The active structure AS may have a portion at a level higher than that of a floor surface of the second trench TR2, and the portion of the active structure AS may be defined as the pillar PL. The second trench TR2 may expose first impurity regions SD1. Each of the pillars PL may include an upper device isolation layer UST, upper second impurity regions USD2, and upper gate capping layers UGP. The upper device isolation layer UST may be a portion of the device isolation layer ST, which portion is placed at a level higher than that of the floor surface of the second trench TR2. The upper second impurity region USD2 may be a portion of the second impurity region SD2, which portion is placed at a level higher than that of the floor surface of the second trench TR2. The upper gate capping layer UGP may be a portion of the gate capping layer GP, which portion is placed at a level higher than that of the floor surface of the second trench TR2.

When viewed in plan, each of the pillars PL may include first sidewalls PLW1 extending in the second direction D2 and second sidewalls PLW2 connecting the first sidewalls PLW1 to each other. The second sidewalls PLW2 may be curved. The pillars PL may be spaced apart from each other in the fourth direction D4. The pillars PL may also be spaced apart from each other in the second direction D2.

The patterning of the first mask layer ML1 may form a first dummy pattern DP1 on the dummy region DR of the substrate 100. The first dummy pattern DP1 may include a segment extending in a first direction D1 and other segment extending in the second direction D2.

The patterning of the target layer TL may form a second dummy pattern DP2 on the dummy region DR of the substrate 100. The second dummy pattern DP2 may vertically overlap the first dummy pattern DP1. For example, the first and second dummy patterns DP1 and DP2 may have the same planar shape.

Figure 21A:
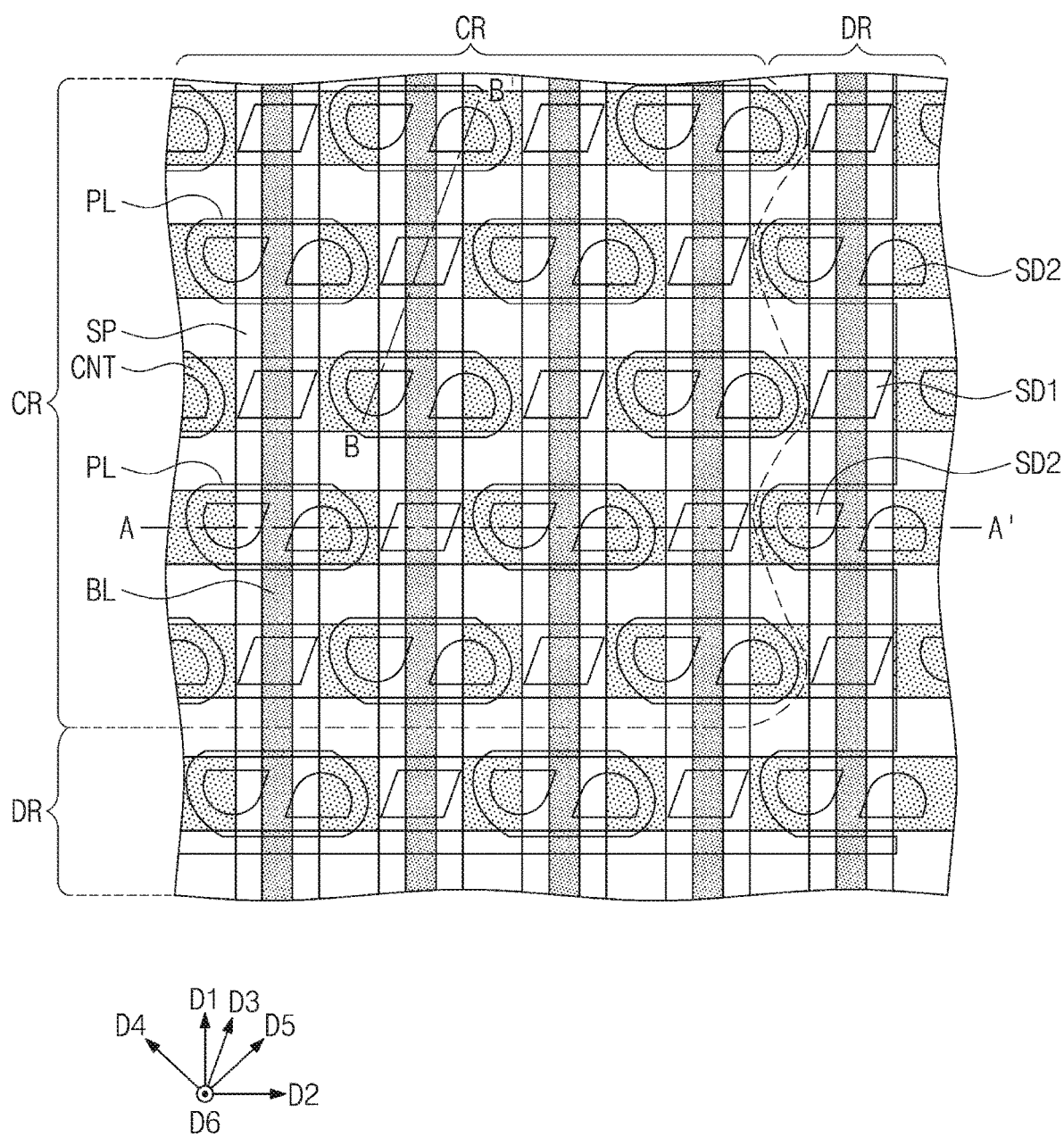
Figure 21B:
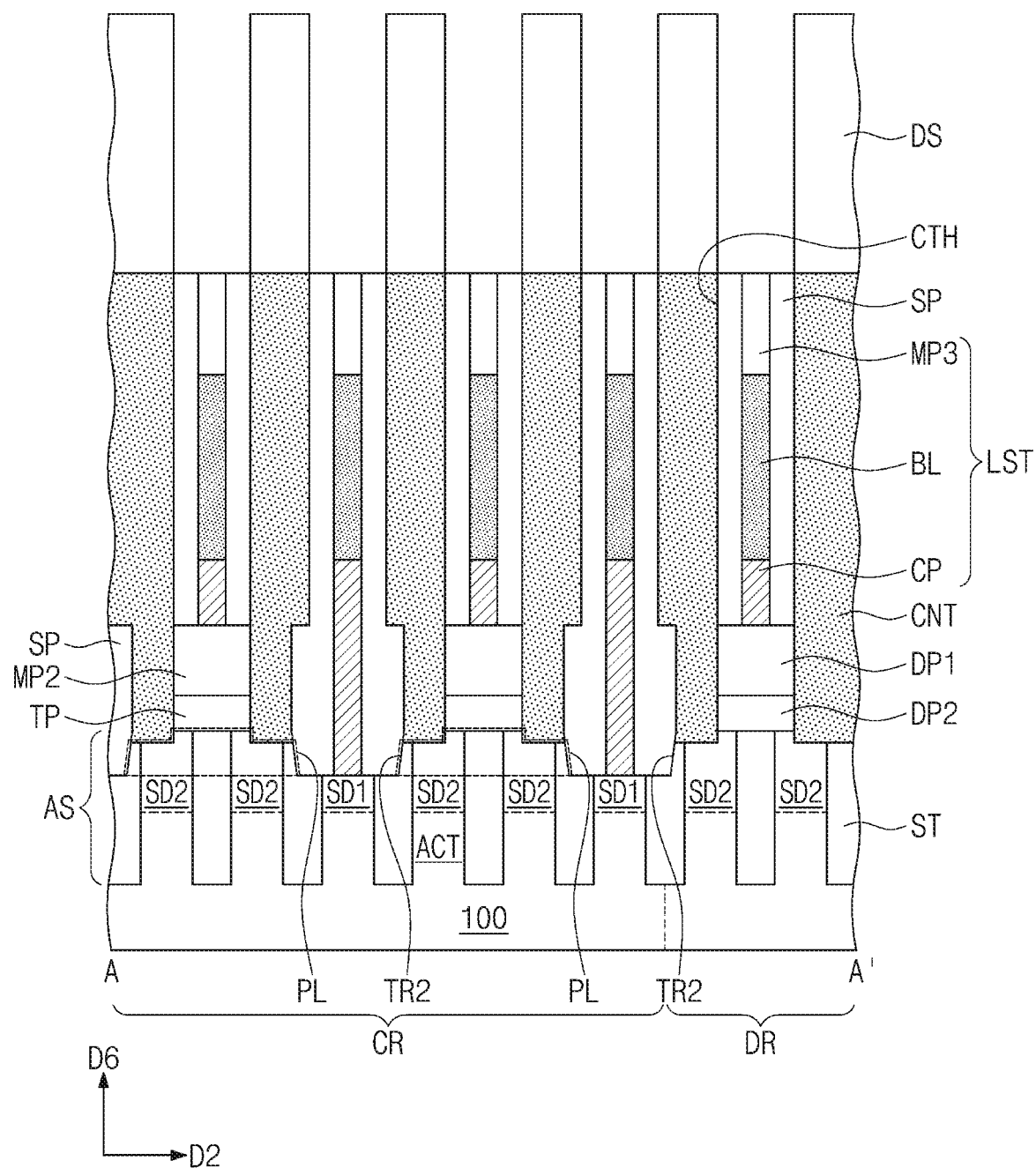
Figure 21C:
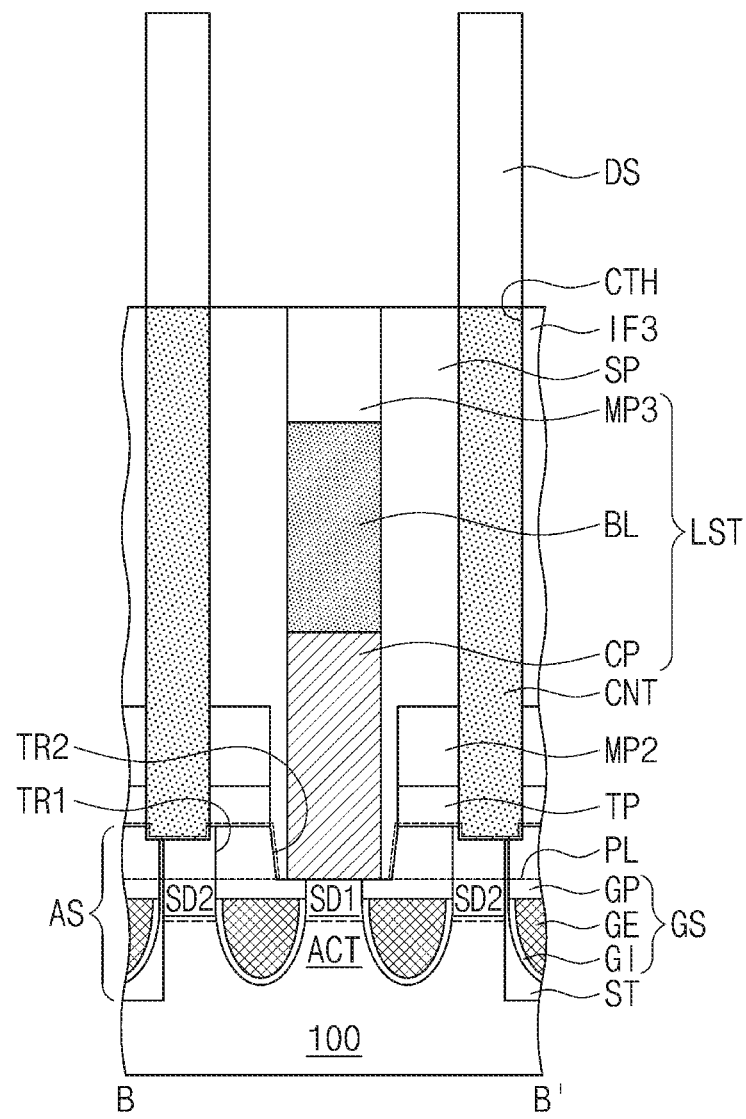

Referring to FIGS. 21A, 21B, and 21C, processes similar to those discussed in FIGS. 11A to 12C may be performed to form line structures LST extending in the first direction D1. The line structures LST may be spaced apart from each other in the second direction D2. Each of the line structures LST may include a third mask pattern MP3, a bit line BL, and a conductive pattern CP. The conductive pattern CP may have an electrical conductivity greater than that of the second mask pattern MP2. When viewed in plan, the bit lines BL may extend while intersecting the gate electrodes GE. The conductive pattern CP may be connected to the first impurity region SD1. For example, the bit line BL may be electrically connected through the conductive pattern CP to the first impurity region SD1. The second mask patterns MP2 and the target patterns TP covering the second impurity regions SD2 may separate the conductive pattern CP from the second impurity regions SD2.

Processes similar to those discussed in FIGS. 13A, 13B, and 13C may be performed to form spacers SP covering opposite sidewalls of each of the line structures LST. The second trench TR2 may be filled with portions of the spacers SP.

Processes similar to those discussed in FIGS. 14A, 14B, and 14C may be performed to form a third dielectric film IF3, contact holes CTH, contacts CNT, and a data storage element DS. The contacts CNT may penetrate the second mask pattern MP2 and the target pattern TP and may be electrically connected to the second impurity regions SD2. The spacers SP may separate the contacts CNT from the bit lines BL. The data storage element DS may be formed on each of the contacts CNT.

According to inventive concepts, a line patterning may be used to form pillars such that a constant minimum distance may be provided between any two neighboring pillars.

Although the present invention has been described in connection with the embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concepts.

What is claimed is:

1. A method of manufacturing a semiconductor device, the method comprising:
   forming an active structure including a plurality of active patterns, a device isolation layer defining the active patterns, and a gate structure across the active patterns and extending in a first direction;
   forming a first mask pattern on the active structure; and
   forming a trench by using the first mask pattern as an etching mask to pattern the active structure,
   wherein forming the first mask pattern comprises:
   forming in a first mask layer a plurality of first openings extending in a second direction intersecting the first direction; and
   forming in the first mask layer a plurality of second openings extending in a third direction intersecting the first and second directions.

2. The method of claim 1, wherein each of the plurality of active patterns comprises:
   a first impurity region; and
   a plurality of second impurity regions spaced apart from each other across the first impurity region,
   wherein forming the trench comprises forming a plurality of pillars in an upper portion of the active structure, the pillars being defined by the trench,
   each of the pillars comprising upper portions of the second impurity regions.

3. The method of claim 2, wherein each of the plurality of pillars has an elliptical shape in a plan view.

4. The method of claim 2, wherein each of the plurality of pillars has a rhombic shape in a plan view.

5. The method of claim 1, further comprising forming a second mask layer between the active structure and the first mask pattern,
   wherein forming the trench comprises using the first mask pattern as an etching mask to pattern the second mask layer.

6. The method of claim 1, wherein forming the plurality of first openings comprises:
   forming a second mask layer on the first mask layer;
   patterning the second mask layer to form a third opening extending in the second direction;
   conformally forming a first dielectric film on the second mask layer;
   forming a first filling layer filling the third opening;
   removing the first dielectric film between the first filling layer and the second mask layer; and
   using the first filling layer and the second mask layer as an etching mask to pattern the first mask layer.

7. The method of claim 6, wherein forming the plurality of second openings comprises:
   forming a second filling layer filling the plurality of first openings;
   forming a third mask layer on the second filling layer;
   patterning the third mask layer to form a fourth opening extending in the third direction;
   conformally forming a second dielectric film on the third mask layer;
   forming a third filling layer filling the fourth opening;
   removing the second dielectric film between the third filling layer and the third mask layer; and
   using the third filling layer and the third mask layer as an etching mask to pattern the second mask layer, the second filling layer, and the first mask layer.

* * * * *